United States Patent [19]
Kataoka et al.

[11] Patent Number: 5,963,812
[45] Date of Patent: Oct. 5, 1999

[54] MANUFACTURING METHOD OF A SEMICONDUCTOR APPARATUS HAVING AN ELECTRON DONATIVE SURFACE IN A SIDE WALL PORTION

[75] Inventors: Yuzo Kataoka, Isehara; Tetsuo Asaba, Odawara; Kenji Makino, Yokohama; Hiroshi Yuzurihara, Isehara; Kei Fujita, Sagamihara; Seiji Kamei, Hiratsuka; Yutaka Akino, Isehara; Yutaka Yuge, Mishima; Mineo Shimotsusa, Atsugi; Hideshi Kuwabara, Zama, all of Japan

[73] Assignee: Canon Kabushiki Kaisha, Tokyo, Japan

[21] Appl. No.: 08/814,016

[22] Filed: Mar. 10, 1997

Related U.S. Application Data

[60] Continuation of application No. 08/424,061, Apr. 19, 1995, abandoned, which is a division of application No. 08/327,799, Oct. 24, 1994, Pat. No. 5,580,808, which is a division of application No. 08/098,871, Jul. 29, 1993, abandoned.

[30] Foreign Application Priority Data

| Jul. 30, 1992 | [JP] | Japan | 4-203889 |
| Jul. 31, 1992 | [JP] | Japan | 4-205544 |
| Aug. 20, 1992 | [JP] | Japan | 4-242591 |
| Aug. 20, 1992 | [JP] | Japan | 4-242592 |

[51] Int. Cl.[6] .................................. H01L 21/336
[52] U.S. Cl. .................................................. 438/304
[58] Field of Search ................................. 438/299–307

[56] References Cited

U.S. PATENT DOCUMENTS

| 4,722,909 | 2/1988 | Parillo et al. | 437/34 |
| 4,745,086 | 5/1988 | Parrillo et al. | 437/57 |
| 4,975,385 | 12/1990 | Beinglass et al. | 437/44 |
| 5,043,294 | 8/1991 | Willer et al. | 437/44 |
| 5,179,042 | 1/1993 | Mikoshiba et al. | 437/187 |
| 5,196,372 | 3/1993 | Mikoshiba et al. | 437/187 |
| 5,200,639 | 4/1993 | Sohizuka et al. | 257/508 |
| 5,227,320 | 7/1993 | Johnson et al. | 437/44 |
| 5,233,224 | 8/1993 | Ikeda et al. | 257/773 |
| 5,302,855 | 4/1994 | Matsumoto et al. | 257/774 |
| 5,328,873 | 7/1994 | Mikoshiba et al. | 437/187 |
| 5,364,664 | 11/1994 | Tsubouchi et al. | 427/535 |

*Primary Examiner*—Jey Tsai
*Attorney, Agent, or Firm*—Fitzpatrick, Cella, Harper & Scinto

[57] ABSTRACT

An insulating film is formed on the surface of the base of a semiconductor, and a portion of the insulating film is removed to cause the surface to appear outside. The exposed surface is terminated with hydrogen, and then energy beams are applied to selectively remove the terminating hydrogen. Metal is selectively deposited on the portion terminated with left hydrogen atoms.

5 Claims, 34 Drawing Sheets

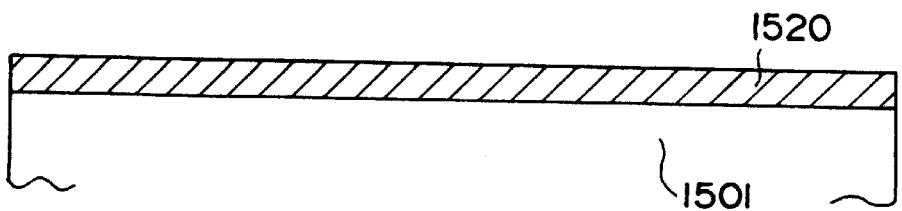
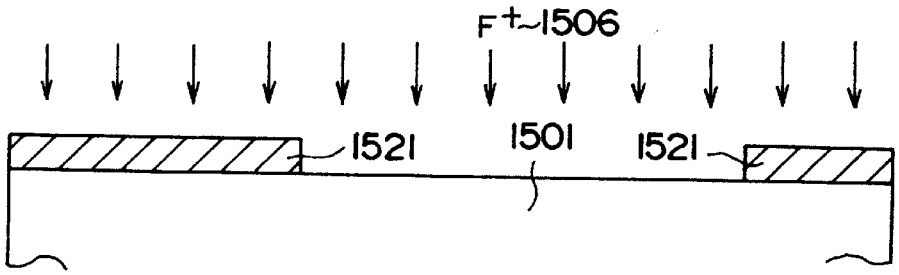
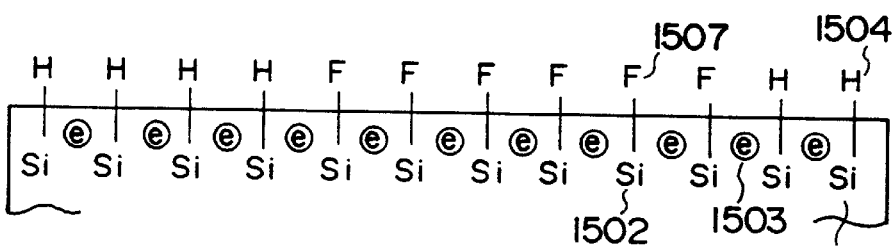
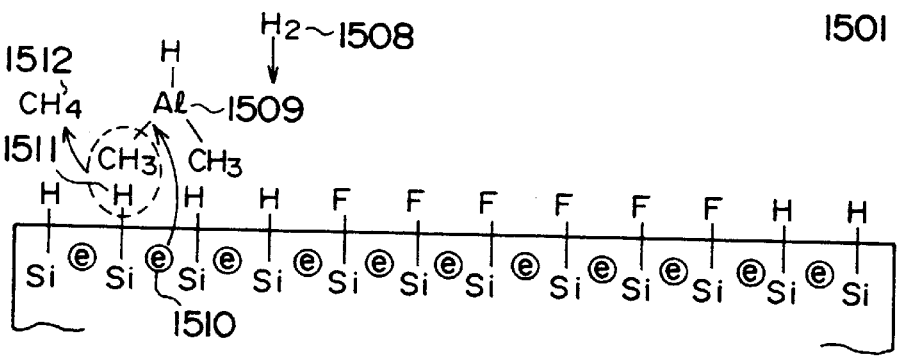
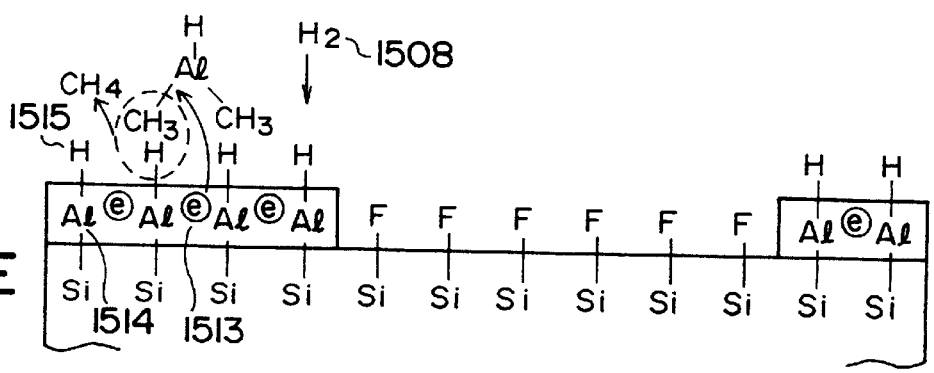

CUT OUT OF INGOT

CHIP ARRANGEMENT
FOR SINGLE SUBSTRATE

SECTIONAL VIEW OF CUTTING OUT INGOT 5,963,812

MANUFACTURING METHOD OF A SEMICONDUCTOR APPARATUS HAVING AN ELECTRON DONATIVE SURFACE IN A SIDE WALL PORTION

This application is a continuation of application Ser. No. 08/424,061, filed Apr. 19, 1995, now abandoned, which is a division of application Ser. No. 08/327,799, filed Oct. 24, 1994, U.S. Pat. No. 5,580,808, which is a division of application Ser. No. 08/098,871, filed Jul. 29, 1993, now abandoned.

BACKGROUND OF THE INVENTION

1. Field of the Invention

The present invention relates to a metal pattern and a method of forming the same, and more particularly to a metal contact pattern and a method of forming the metal contact pattern for use in a semiconductor apparatus, such as a mask programmable read only memory, a photoelectrical conversion apparatus or a signal processing apparatus, a semiconductor apparatus which includes an electrostatic capacity device, a semiconductor integrated circuit including an LDD transistor and a shot-key-diode or an image reading or recording semiconductor device.

2. Related Background Art

The conventional technology has experienced the following problems at the time of forming a pattern on an electrode or the like of the foregoing devices.

(1) Selective Formation of Contact of Mask ROM

A mask ROM is a semiconductor memory for exclusively use to writing data with a mask for photolithography for use in a process for manufacturing a semiconductor. The mask ROM is widely used to serve as a fixed memory of a computer, a data memory of a kanji generator or a voice synthesizer or program software of a TV game. FIG. 1 is a circuit diagram of the mask ROM having MOS transistors which are disposed to form a matrix and on which data is written. Since a variety of methods of writing data on the mask ROM are available, corresponding manufacturing methods are employed. Data is written by a method in which the threshold voltage of the gate is varied or a method in which data is written depending upon whether or not the contact is present on the drain region of the transistor. The threshold voltage of the gate is varied by a method in which the thickness of an oxide film of the gate is changed, a method in which channel dope ions are selectively injected after the gate oxide film has been formed, a method in which channel dope ions are further selectively injected through a polysilicon electrode with high energy after the polysilicon gate electrode has been formed or a method in which channel dope ions are selectively injected through an aluminum circuit or a passivation film with large energy of 1 MeV or larger after the aluminum circuit or the passivation film has been formed. The foregoing methods will now be described. The method in which the thickness of the gate oxide film is changed and a method in which the channel dope ions are selectively injected by a photolithographic mask after the gate oxide film has been formed are not described, because they present a problem in that excessively long manufacturing process must be performed after data has been written.

FIGS. 2A to 2C illustrate the process for manufacturing the mask ROM by the conventional method, in which the injection of the channel dope ions is performed selectively through the polysilicon electrode with high energy after the polysilicon gate electrode has been performed to write data.

FIG. 2A illustrates the cross section of MOS transistors formed by a known technology. Field oxide films 2 are formed on a P-type Si substrate 1, and the MOS transistor devices are separated from each other. Gate electrodes 4 made of polysilicon are formed on gate oxide films 3, and channel regions 5 are formed under the gate oxide films 3. Further, source regions 6 and drain regions 7 are formed so that an inter-layer insulating film 8 in the form of a non-dope silicate glass (NSG)/BPSG structure is formed by CVD. It should be noted that proper channel doping is performed in the channel regions 5 by ion injection. That is, the state where the MOS transistor is turned off is maintained even if voltage corresponding to negative logic "0" is applied to the gate. If voltage corresponding to positive logic "1" is applied to it, the MOS transistor is turned on. FIG. 2B illustrates a manufacturing process corresponding to writing of data. After a photo-resist 20 has been applied, a mask on which data is written is used to pattern the photo-resist 20. Then, B-ions 21 are injected under conditions that energy is about 200 KeV to about 400 KeV and the amount of dose is about $1 \times 5 \times 10^{13}$ cm$^{-2}$ if the minimum size is determined by a 1.2 $\mu$m rule. However, the foregoing conditions are varied depending upon the degree of integration of the mask ROM. The thickness of the photo-resist is determined depending upon the energy. After channel dope ions for writing data have been injected, the photo-resist 20 is removed to reflow the inter-layer insulating film. The reason why the reflow is performed is that the inter-layer insulating film must be flattened and the channel-doped ions B must be electrically activated. A MOS transistor positioned in the right portion of FIG. 2B has the channel region 5 in which ions B are doped so that the threshold voltage is sufficiently higher than the voltage corresponding to the positive logic "1". Therefore, even if the voltage corresponding to the positive logic "1" is applied to the gate, the state where the right MOS transistor is turned off is maintained. FIG. 2C illustrates the final cross sectional structure. Contact holes 9 are formed in the source region 6, the gate oxide film 3 on the drain region 7 and the inter-layer insulating film 8, and aluminum lines 18 are formed so that a passivation film 19 made of SiN is formed.

FIGS. 3A and 3B illustrate a process for manufacturing a mask ROM by the conventional method. The foregoing method is a method in which aluminum lines or a passivation film is formed, and then the channel dope ion injection is selectively performed through the aluminum lines or the passivation film with large energy of 1 MeV or larger so that data is written. FIG. 3A illustrates the cross section of a state where MOS transistors are formed by the known method. A field oxide film 2 is formed on the P-type Si substrate 1 and the MOS transistor devices are separated from one another. Channel regions 5 are formed under gate oxide films 3. Further, source regions 6 and drain regions 7 are formed so that an inter-layer insulating films 8 in the form of the (NSG)/BPSG structure are formed by CVD. Contact holes 9 are formed through the source regions 6, the gate oxide films 3 on the drain regions 7 and the inter-layer insulating films 8 so that aluminum lines 18 are formed. Further, a passivation film 20 made of SiN is formed. In this example, the aluminum lines 18 are not present on the gate electrodes 4. Proper channel doping is performed in the channel regions 5 by ion injection. That is, even if voltage corresponding to negative logic "0" is applied to the gate, the state where the MOS transistor is turned off is maintained. However, if voltage corresponding to positive logic "1" is applied to the gate, the MOS transistor is turned on.

FIG. 3B illustrates a manufacturing process corresponding to writing of data. After a photo-resist 20 has been applied, a mask on which data is written is used to pattern the photo-resist 20. Then, B-ions 21 are injected under conditions which vary depending upon whether or not the aluminum line 18 is present on the gate electrode 4 of the mask ROM or whether or not the channel dope ion injection for writing data is performed through the passivation film 19. Energy of 1 MeV or larger is needed, and the amount of the dose is about 1 to $10 \times 10^{13}$ cm$^{-2}$. After channel dope ions for writing data have been injected, the photo-resist 20 is removed. Then, heat treatment is performed in order to electrically activate channel-doped ions B. Since the aluminum lines 15 have been formed, the heat treatment is performed at 450° C. or lower. The right MOS transistor shown in FIG. 3B has the channel region 5 in which ions B are doped so that the threshold voltage is sufficiently higher than the voltage corresponding to the positive logic "1". Therefore, even if the voltage corresponding to the positive logic "1" is applied to the gate, the state where the right MOS transistor is turned off is maintained. The foregoing second conventional example has no ensuing process.

FIGS. 4A to 4B illustrate a third conventional example of the process for manufacturing the mask ROMs, wherein data is written depending upon whether or not a contact is present on a drain region. FIG. 4A illustrates the cross section of a state where MOS transistors are formed by the known technology. A field oxide film 2 is formed on a P-type Si substrate, and the MOS transistor devices are separated from one another. Gate electrodes 4 made of polysilicon are formed on gate oxide films 3. Further, channel regions 5 are formed under the gate oxide films 3. In addition, source regions 6 and drain regions 7 are formed so that an inter-layer insulating film 8 in the form of an NSG/BPSG structure is formed by CVD. Proper channel doping is performed in the channel regions 5 by ion injection. That is, even if voltage corresponding to negative logic "0" is applied to the gate, the state where the MOS transistor is turned off is maintained. If voltage corresponding to positive logic "1" is applied to the gate, the MOS transistor is turned on.

FIGS. 4B and 4C illustrate a manufacturing process which corresponds to writing of data. After a photo-resist 20 has been applied, a mask, on which data has been written, is used to pattern the photo-resist 20. Then, contact holes 9 are formed in the source regions 6, the gate oxide film 3 on the drain regions 7 and the inter-layer insulating film 8 before aluminum lines 18 are formed. The right MOS transistor shown in FIG. 4C has no contact hole in the gate insulating film 3 on the drain region 6 and the inter-layer insulating film 8. Therefore, the right MOS transistor is not applied with power supply voltage VDD. Therefore, even if voltage corresponding to positive logic "1" is applied to the gate, the state where the MOS transistor is turned off is maintained. FIG. 4D illustrates a final cross section. Thus, a passivation film 19 made of SiN is formed.

Since data is written on the mask ROM in the manufacturing process, it has considerable custom characteristics. Therefore, the mask ROM must be delivered in a short period (TAT: time around time) from a moment of receipt of data from a customer to a moment of delivery as well as meeting requirements, such as high degree of integration, low electric power consumption and low cost and the like, generally required for a memory. If the data writing process is performed in the first half of the manufacturing process, an error of written data or that occurring in the mask manufacturing process causes the delivery data to be further delayed.

Although the first conventional example exhibits a relatively short TAT because data is written after the gate electrode has been formed, the TAT is longer than that realized by the second or the third conventional example. Even worse is, the fact that data writing can be performed by injecting ions with large energy of 200 to 400 KeV prevents use of a general ion injecting apparatus. Therefore, an exclusive large-energy ion injecting apparatus must be used and, accordingly, the cost to manufacture the mask ROM cannot be reduced.

Since the second conventional example is arranged to write data after the passivation film has been formed, it exhibits a considerably short TAT which takes one or two days in addition to days taken to manufacture the mask. However, the heat treatment can be performed only under a low temperature of 450° C. or lower after the aluminum lines have been performed. Therefore, defects generated due to the injection of channel dope ions for writing data cannot be recovered completely. Further, only about 50% of channel-doped ions B can be electrically activated. If ions are injected with large energy in MeV levels, there arises a problem in that defects cannot completely be restored even if the heat treatment is performed at high temperature. Therefore, a problem of reliability arises. Further, if the aluminum line is present on the gate electrode, the channel dope ion injection causes aluminum atoms to be introduced into the gate channel region due to the knock-on phenomenon. What is worse, the cost to manufacture the mask ROM cannot be reduced as compared with the first conventional example because the price of the MeV-level high energy ion injecting apparatus is high and its manufacturing performance is unsatisfactory.

The third conventional example does not need a special manufacturing apparatus raising the cost to manufacture the mask ROM and exhibits a short TAT as compared with the first conventional example. However, the necessity that the contact region is formed for each memory cell raises a technical problem in that the chip area cannot be reduced.

With any one of the foregoing methods, many days are required to manufacture the mask on which data will be written. It leads to the result that the mask must be manufactured again if there is a data error. Therefore, even if the TAT is short after the mask has been manufactured, the overall TAT cannot be shortened satisfactorily.

(2) Semiconductor Integrated Circuit Having Capacitor

Conventional Example AI

Some semiconductor integrated circuits include a multiplicity of electrostatic capacity devices. With the recent rise in the density of the integrated circuits and high speed operation, there has been a desire for reducing the size of the capacitor device and enlarging the capacity.

FIG. 5 is a schematic cross sectional view which illustrates a general MOS capacitor for use in the conventional integrated circuit. FIG. 7 illustrates its equivalent circuit.

The MOS capacitor is arranged in such a manner that an n$^+$ layer 1103 formed on an n$^-$ layer 1102 embedded in a p-type substrate 1101 is made to be a lower electrode layer. Further, a pullout electrode 1106 from an upper electrode 1105 and the n$^+$ layer 1103 are formed while interposing a dielectric layer 1104. A terminal A and a terminal B of the equivalent circuit respectively correspond to the upper electrode 1105 and the lower pullout electrode 1106.

As shown in FIG. 6 in which the equivalent circuit is illustrated, a conductor, such as an n$^+$ diffusion layer is used to form the lower electrode 1103, the MOS capacitor has parasitic devices, such as a diode D and a capacitor Ccs. Further, it includes a resistance component R$_1$ made of the n$^+$ diffusion layer and disposed between the capacitor C$_1$ and the terminal B. As the upper electrode 1105, Al or polysilicon is used generally. If polysilicon is used, a resistance component $R_2$ is added between the terminal A and the capacitor $C_1$.

Therefore, if a MOS capacitor is used, it includes parasitic devices such as the resistor, the capacitor and the diode in addition to the capacitor $C_1$. As a result, the influences of the parasitic devices limits the frequency characteristics of the MOS capacitor.

If either of the terminals of the capacitor device is used under a high impedance, capacity division occurs between $C_1$ and Ccs due to the presence of the parasitic device Ccs.

Further, the capacity can be undesirably changed due to the CV characteristics of the MOS structure depending upon the polarity of the applied voltage.

FIG. 7 is a schematic cross sectional view which illustrates a pn junction capacitor which is generally used in an integrated circuit. FIG. 9 illustrates its equivalent circuit. The foregoing capacitor is arranged such that an $n^-$ layer 1102, a p-layer 1107 and $n^+$ layers 1103 and 1108 are formed on a p-type substrate 1101 while causing electrodes 1109 and 1110 to face each other while interposing a dielectric layer 1104.

The structure shown in FIG. 7 and terminals of the equivalent circuit shown in FIG. 8 are made to correspond to one another with symbols shown in FIGS. 7 and 8. Although the capacity between terminals X and Y is $C_2+C_3$, any pn junction may be used as the capacitor.

Since the pn junction capacitor includes the parasitic resistor and the parasitic capacitor, the frequency characteristics are limited due to their influences. Furthermore, its capacity considerably depends upon the voltage. Further, it cannot be used in a case where the pn junction is invert bias.

FIG. 9 is a schematic cross sectional view which illustrates a capacitor device formed into metal-insulating film-metal structure developed to overcome the foregoing problems experienced with the MOS capacitor or the pn junction capacitor.

The foregoing capacitor device comprises a lower metal layer (a lower electrode) 1202 and an inter-layer insulating film 1203 each of which is formed on a semiconductor substrate 1201, an upper metal layer (an upper electrode) 1204 and a thin insulating film (dielectric layer) 1205 serving as a capacitor portion.

As the metal layers for forming the upper and lower layers, any one of the following material has been used: Al, Al alloy or tungsten manufactured by, for example, a magnetron sputtering method or tungsten manufactured by, for example, a chemical vapor-phase deposition method (a CVD method). As the thin insulating layer 1205 serving as the capacitor, $SiO_2$, $Si_3N_4$ or $Ta_2O_5$ prepared by the CVD method or $Al_2O_3$ prepared by an anode oxidation method or their mixture has been employed.

The foregoing capacitor device exhibits an advantage that the parasitic capacitance and the parasitic resistance are not generated.

As an electrostatic capacitor device for use in a dynamic RAM or the like, a circuit has been known in which a capacitor is connected to the drain of a MOSFET as shown in FIG. 10. FIG. 11 illustrates a device structure, called a "stack-type structure" capable of realizing a circuit of the foregoing type. The foregoing structure is arranged such that a polysilicon layer 1030 is formed to be in contact with a drain 1025 of a pMOSFET which comprises a polysilicon gate 1023 on a gate oxide film 1022 formed on a p-type substrate 1021, a source 1024, a drain 1025, a source electrode 1026, a field oxide film 1027, an oxide film 1028 and an inter-layer insulating film 1029. Further, a polysilicon layer 1032 is formed while interposing a dielectric film 1031 so that the capacitor is formed. A trench-type capacitor shown in FIG. 12 and a fin-type capacitor shown in FIG. 13 are arranged to respectively have polysilicon layers 1030A and 1032A and 1030B and 1032B formed into modified shapes in order to enlarge the capacitance of the stack type capacitor and to reduce the size of the same.

The circuit of a storage device (hereinafter called a "memory cell") of the semiconductor circuit has been structured, for example, as shown in FIG. 14. The schematic cross section of a memory cell of the foregoing types is shown in FIG. 15. As shown in FIG. 15, a capacitor C serving as a capacitor device included in the memory cell comprises a lower electrode 1030, an upper electrode 1032 and a dielectric film 1031 formed between the foregoing two electrodes 1030 and 1032.

If the foregoing memory cell must be formed at a high degree of integration, the plane area of the capacitor C serving as the capacitor portion for each bit must be reduced. In order to operate the memory cell normally, resistance against a soft error occurring due to α-rays radiated from a ceramic package of, for example, a DRAM must be maintained by storing a charge amount of about 200 fC. Assuming that the power supply voltage determined to be 5V depending upon the foregoing charge amount and that the capacity between the source and the earth of the capacitor C is expressed by Cs, the following relationship is held:

$$Cs \geq 40 \text{ fF}$$

If the dielectric film 1031 is made of an ordinary Si oxide film, it is known that electric field E, which can be applied to the dielectric film 1031, is about E<5 MV/cm in terms of maintaining reliability of the Si oxide film. Therefore, it has been considered that the thickness of the Si oxide film, which can be used satisfactorily as the dielectric film, is 50 Å if a method applying voltage which is the half of the power supply voltage is applied. Since dielectric constant εr of the Si oxide film is 3.7, the capacitor C must have a plane area of 6 $\mu m^2$ in order to realize Cs≧40 fF. A memory cell having the capacity, the plane area of which is large, cannot meet the foregoing recent requirement of raising the degree of integration. Accordingly, the surface area of a capacitor formed into a stacked structure has been increased by forming its shape into a downward projection or an upward projection while preventing the enlargement of the projective plane area of the capacitor C, so that a required capacity has been maintained.

As can be understood from the description about conventional example AI, the memory cell must enlarge the capacity of the capacitor thereof and reduce the area of the device as well as satisfy the desire for the improvement in the electrostatic capacitor device.

However, the foregoing stack-type memory cell cannot simultaneously realize the enlargement of the capacitor and the reduction of the device area. The trench-type memory cell encounters a problem of leakage occurring in the capacitor thereof. The fin-type memory cell has a problem that the manufacturing process is too complicated due to the complex shape of the polysilicon. Therefore, there arises a problem in that a memory cell, in which a satisfactory degree of integration is realized and the cost of which can be reduced, cannot easily be provided.

That is, the conventional technology cannot easily form a large capacity capacitor requiring only a small area giving a satisfactory manufacturing yield due to its structure and the manufacturing method which requires improvement.

Conventional Example BI

Hitherto, the side wall (a spacer) of an LDD transistor has been formed by a method comprising steps of forming an oxide film on the entire surface of silicon wafer by a CVD method and performing an anisotropic dry etching (etch back).

Since the foregoing conventional example BI has been arranged so that the formed oxide film is subjected to the anisotropic dry etching in order to form the side wall (the spacer), there arises the following problems:

(1) An etching back process must be performed.
(2) It is difficult in the etch back process to control the shape of the side wall (the spacer).
(3) The final point cannot easily be detected in the etch back process.
(4) The device can be damaged due to ion impact occurring in the etch back process.
(5) The distribution of the CVD oxide film within the wafer cannot easily be controlled.

Conventional Example CI

The performance of electronic devices and integrated circuits has been improved and the degree of integration of the same has been raised by fining their structures. As for the machining size, a marketed 4-Mbit DRAM comprising a MOSFET having a gate length of 0.8 $\mu$m has been reported and an experimental product having a gate length 0.07 $\mu$m has been reported. It has been considered that if the machining size is 0.1 $\mu$m or smaller coherence of electronic waves and considerable tunnel phenomenon occurs, causing an electronic device based on a novel physical phenomenon to be realized.

In order to further refine the conventional electronic device and the integrated circuit or to realize an electronic device based on a novel physical phenomenon, a stable precise machining technology in levels of 0.2 $\mu$m or small must be established.

The conventional precise machining technology uses an organic resist film and performs etching by making use of the organic resist film as the etching mask. The foregoing method will now be described schematically with reference to FIGS. 16A to 16D and problems rising at the time of fining the structure will be described.

An assumption is made that a thin film 1402 is formed on a substrate 1401 as shown in FIG. 16A. The substrate 1401 is a Si substrate or Si wafer on which a SiO$_2$ film has been formed. The thin film 1402 is made of metal, such as Al (aluminum) or an insulating film, such as BPSG or PSG. The thickness of the thin film 1402 ranges about 0.1 $\mu$m to about 2 $\mu$m. An organic resist 1403 is applied to the upper surface of the substrates 1401 and the thin film 1402. The material of the organic resist 1403 is made of well known AZ1350, PFPR, TSMR or PMMA. The thickens of the organic resist 1403 ranges about 0.1 $\mu$m to about 2 $\mu$m.

Then, the substrate comprising the organic resist 1403, the thin film 1402 and the substrate 1401 as shown in FIG. 16A is irradiated with energy beams 1405, such as ultraviolet rays or electron beams, as shown in FIG. 16B. In this irradiation operation, the resist which has been selectively exposed, that is, the resist pattern 1404, is irradiated with the ultraviolet rays or the electron beams in its portion having a width of L$_1$. The organic resist in the region L$_1$ irradiated with light or the electronic beams is sensitized before it is immersed in a developer. As a result, the organic resist in only the portion irradiated with light is removed as shown in FIG. 16C. As a result, a developed resist, that is, the resist pattern 1406 is formed if the resist is a positive-type resist. If the resist is a negative-type resist, the organic resist in the portion irradiated with the light or the electron beams is left after the development has been completed.

Then, an etching process shown in FIG. 16D is performed in such a manner that an organic resist 1408 serves as a mask to etch the thin film in the opened portion of the organic resist 1408 so that the thin film is patterned as designated by 1407.

In the foregoing conventional example C, even if the width of the portion which is, as shown in FIGS. 16A to 16D, irradiated with the ultraviolet rays or the electron beams 1405, is L$_1$ as shown in FIG. 16B, it slightly changes to L$_2$ as shown in FIG. 16C at the time of the development and to L$_3$ as shown in FIG. 16D at the time of the etching process. Therefore, it has been very difficult to make the machining width L$_3$ shown in FIG. 16D to be 0.2 $\mu$m or less.

That is, the thin film is etched and the organic resist 1408 is etched as well in the etching process, L$_3$ is different from L$_2$ undesirably.

If the thin film 1402 is made of metal, such as Al (aluminum), another problem of disconnections of lines takes place due to irregular reflection of light. It leads to a fact that the width of the line cannot easily be controlled. As a result, the size of the lines cannot be reduced at the time of designing the device and, accordingly, a problem arises at the time of performing the precise machining.

(3) Semiconductor Device Including Short Diode (Conventional Example AII)

Hitherto, a shot key TTL having a clamping structure which uses a diode having no storage effect and which is disposed between the collector and the base has been used.

FIGS. 17A and 17B respectively are a typical cross sectional view and an equivalent circuit diagram of a shot key TTL. Referring to FIGS. 17A and 17B, reference numeral 2201 represents a silicon substrate, 2202 represents a collector of a bipolar transistor, 2203 represents a base of the bipolar transistor, 2204 represents an emitter of the bipolar transistor, 2205 represents an aluminum layer constituting the shot key diode, 2206 represents an aluminum line for connecting the emitter 2204, and 2207 represents an aluminum line for connecting the collector 2202.

If the device having the foregoing structure is intended to be integrated densely, the emitter diffusion layer 2204 must be joined up in a shallow portion. Further, the contact hole in the emitter line 2206 and the collector line 2207 must be formed precisely.

However, if the depth of the diffusion in the emitter 2204 is shallower than 0.2 $\mu$m, spikes of the aluminum line arises a risk of a short circuit occurring between the base and the emitter.

If the depth of the contact hole in the emitter line 2206 or the collector line 2207 is 1 $\mu$m or shallower, the contact resistance increases in the n-type diffusion layer particularly.

In order to overcome the foregoing problems, it is preferable that a barrier metal layer made of TiN or TiW is placed in the lower layer of the metal line of the emitter line 2206 and the collector line 2207.

However, the portion 2205 of foregoing conventional Example A in which the Schottky diode is structured encounters a problem that the Schottky characteristics cannot be attained between the aluminum and the silicon if the barrier metal is present in the surface in which the metal and the silicon are joined up.

That is, it is preferable that the emitter contact 2206 and the collector contact 2207 have the barrier metal stacked to serve as a contact metal layer with the semiconductor layer. On the other hand, it is preferable that the base and the Schottky diode contact 2205 are formed into structures in which aluminum is stacked in the lowermost portion of the metal layer.

However, use of the foregoing conventional manufacturing method raises the following application.

That is, the contact hole of the emitter and the collector is first formed, and then the barrier metal is deposited by sputtering or the like. Then, aluminum is deposited, the emitter and the collector lines are patterned to have predetermined forms, and then an insulating film is deposited. Then, the contact hole is again formed in the base and the shot key diode portion, aluminum is deposited, and then the base electrode is patterned to have a predetermined shape.

As described above, the conventional method encounters a problem that the number of the manufacturing processes cannot be decreased similarly to the two-layer metal lines.

Conventional Example BII

Hitherto, a contact sensor for use in a facsimile machine or the like using single crystal silicon has been so formed that a plurality of chips are disposed on a line and the chips are joined up to have a predetermined length for the contact sensor. If an A4 paper sheet is read, 11 chips must be joined up in order to read the A4 paper sheet in a case where each chip has a length of 2 cm.

An apparatus, such as a printer, for recording an image sometimes has a printer head formed into a monolisic structure and mounted on a silicon single crystal base thereof. The foregoing case is exemplified by a foaming-type ink jet head disclosed in Japanese Patent Application Laid-Open No. 57-72867.

Also in this case, a plurality of chips must be arranged or mechanical head drive must be performed because the dimension of the chip has been about 2 cm.

Further, conventional example B encounters the following problems:

(1) Since a plurality of chips are joined up, the deviation of the chip configuration generates a step in the image. Therefore, the image resolution is restricted depending upon the accuracy in the chip configuration.
(2) The image recording head, which must be mechanically driven, involves the performing of unnecessary reciprocating motion encounters a problem of unsatisfactory printing speed in addition to the problem of the step occurring in the joined portion.

An optimum method of overcoming the foregoing two problems is to form the head by a long and single chip which is capable of collectively reading or collectively printing, for example, an A4 paper sheet.

If the reading or printing head portion is constituted by a single chip adapted to A4 size, the single chip must have a length longer than 21 cm.

It means a that the size must be larger than 9 inches if an ordinary circular silicon substrate is used. If an effective region in which a chip can be formed in a circular substrate is intended to be 60% or more, the circular substrate must have a diameter of 15 inches or more.

Therefore, the size of the apparatus must have an excessively large size and the manufacturing cost is enlarged. Therefore, although superior performance can be attained in comparison to the conventional structure, it is difficult to put the foregoing technology into practical use.

(4) Formation of Metal Pattern While Aligning to Alignment Mark

With the recent rise in the degree of integration of the semiconductor apparatus, the contact size is refined to approach the resolution limit of quarter micron level from the half micron level. On the other hand, the trend of thinning the thickness of the inter-layer insulating film is restricted because the line capacity must be maintained at a small quantity. Therefore, fining of the longitudinal direction of the contact has not been made satisfactorily. As a result, the aspect ratio is raised with the trend of fining of the contact size.

The conventional method of forming the metal film mainly composed of Al and based on the sputtering method encounters a problem of disconnection of the contact portion due to the fall of the step coverage.

Hitherto, the method of forming the metal film by sputtering has been replaced by a known method in which the contact hole is filled with metal by CVD and a metal film for forming a circuit is formed by sputtering or CVD to flatten the surface of the metal film. In this case, an alignment mark for aligning the mask for forming the circuit pattern is, as shown in FIGS. 18A and 18B, arranged such that a step is formed prior to forming the metal for constituting the circuit and a step formed on the surface of the metal circuit is utilized as the alignment mark. The difference in the intensity of reflected light between the projection portion and the pit portion is utilized to confirm the position of the wafer.

Referring to FIGS. 18A and 18B, reference numeral 3001 represents a semiconductor base, 3002 represents a field insulating film, 3004 represents an inter-layer insulating film, 3005 represents a metal film to serve as a circuit, 3003 represents an insulating film thinner than the field insulating film 3002, and 3006 represents a step serving as the alignment mark.

The alignment at the time of patterning the metal circuit must be performed by minimizing the position deviation between the contact hole and the metal circuit pattern. Therefore, the step of the contact hole is utilized to form the alignment mark and the metal pattern for forming the circuit is aligned to the alignment mark so that the position deviation is minimized.

However, the step of the contact hole substantially disappears in the process in which the contact hole is filled with the metal by the CVD method. Therefore, the alignment mark for the metal circuit pattern must be formed prior to forming the contact hole. Therefore, the area of the alignment margin including the contact hole step serving as the alignment mark is larger by 20 to 30% in the process having the step of filling the contact hole. The first aspect of the present invention is able to overcome the foregoing technical problem.

On the other hand, the conventional CVD technology has the following problems to be solved. A first problem is that the metal cannot be filled at a high aspect ratio by the sputtering method and, accordingly, the desire of refining the lines and forming a multi-layer structure cannot be met. A second problem is that the selective enlargement based on the thermal CVD method cannot realize reliable selectiveness and, accordingly, the Al film is enlarged in an undesirable portion on the oxide film. A third problem is that a necessity for a portion, in which the film is not intended to be enlarged, to be completely covered with the oxide film usually increases the processes for oxidation, separation of the oxide film and patterning the resist. Therefore, the manufacturing process cannot be arranged freely.

SUMMARY OF THE INVENTION

An object of the present invention is to overcome the problems experienced with the foregoing conventional technology by forming a metal pattern by a selective Al-CVD process.

According to the present invention, a method of manufacturing a mask ROM can be provided capable of easily manufacturing a reliable mask ROM at low cost.

According to one aspect of the present invention, there is provided a method of manufacturing a mask ROM comprising steps of: forming a contact hole; performing surface treatment for supplying hydrogen atoms to the surface of a semiconductor appearing in the contact hole; selectively applying energy beams to form an irradiated contact hole irradiated with the energy beams and a non-irradiate contact hole; selectively forming a conductive or semiconductor thin film in the non-irradiated contact hole; forming a circuit on the conductive or semiconductor thin film; connecting the non-irradiated contact hole and the circuit to each other; and insulating the irradiated contact hole and the circuit from each other so that a desired circuit is formed.

The mask ROM according to the present invention has the arrangement that a contact process is previously performed, and surface treatment for supplying hydrogen atoms to the surface of the semiconductor in the bottom of the contact hole is performed, and then the energy beams are selectively applied to selectively deposit metal in the contact, which is not irradiated with the energy beams, so as to selectively fill the hole of the contact hole so that data is written.

According to another aspect of the present invention, there is provided a method of, at excellent yield, manufacturing a semiconductor apparatus integrated more densely than the conventional semiconductor apparatus, exhibiting excellent reliability and having a capacitor.

According to another aspect of the present invention, there is provided a method of manufacturing a semiconductor apparatus having a capacitor comprising: a surface treatment process for supplying hydrogen atoms to the surface of a base of the semiconductor; a process for selectively irradiating the surface of the base of the semiconductor with energy beams; a process for selectively forming a metal region on a region of the surface of the base which is not irradiated with the energy beams to serve as one of electrodes of the capacitor; a process for forming a dielectric film on the surface of the metal region to serve as a dielectric layer of the capacitor; and a process for forming a metal film on the oxide film to serve as another electrode of the capacitor.

It is characterized in that the metal region is formed into a shape elongated longitudinally.

It is characterized in that the metal region is deposited on the source and/or the drain of a MOSFET and/or a gate electrode region.

It is characterized in that the surface treatment process for supplying hydrogen atoms uses hydrofluoric acid.

It is characterized in that the energy beams are electron beams or ion beams.

It is characterized in that deposition of the metal region is performed by a chemical vapor deposition using, as the raw material, organic metal, such as alkyl aluminum hydride or dimethyl aluminum hydride.

It is characterized in that the metal region contains at least atoms selected from a group consisting of Si, Ti and Cu.

The present invention is found while paying attention to a fact that the lower machining dimension is, in the conventional technology, limited by the organic resist having a finite length in the lithography process. Therefore, hydrogen atoms placed to form a layer, the thickness of which is the single atom, are used as the atomic resist which corresponds to the conventional resist. Further, energy beams, such as electron beams, the diameter of which is smaller than ultraviolet rays which are usually used in a conventional exposing apparatus, are used. As a result, a pattern composed of lines, the width of each of which is finer than those of the conventional pattern can be formed.

Therefore, a metal thin film, the width of which is 0.1 $\mu$m or narrower, is deposited to be made the lower electrode of the capacitor, the metal thin film is oxidized or an insulating film is deposited so that a dielectric film is formed, and an upper electrode is formed so that a capacitor finer than the conventional capacitor can be formed.

Another object of the present invention is to provide a method of manufacturing a semiconductor apparatus in which a side wall is formed without the etch back process and with which a simple and reliable machining can be performed.

According to another aspect of the present invention, there is provided a method of manufacturing a semiconductor apparatus by forming a side wall, the method comprising: a process for making the side wall portion to be an electron donative surface; a process for forming the side wall made of metal by a CVD method; a process for forming a source and drain regions into which dense ions are injected; and a process for removing the side wall.

It is characterized in that the semiconductor apparatus is a transistor.

It is characterized in that the CVD method uses alkyl aluminum hydride and hydrogen.

It is characterized in that the alkyl aluminum hydride is dimethyl aluminum hydride.

The present invention employs the selective enlargement of aluminum so that the side wall (a spacer) is formed in a self-alignment manner without etching back. Further, the source and the drain are formed by injecting dense ions, and then the side wall is removed. As a result, a high temperature process (950°C. to 1000° C.) can be performed in the ensuing processes.

Another object of the present invention is to provide a method capable of accurately depositing a metal thin film or a semiconductor thin film, the width of which is narrower than 0.2 $\mu$m for example.

According to another aspect of the present invention, there is provided a method of manufacturing a semiconductor apparatus comprising: a process for selectively introducing impurities into the surface of a base; a surface treatment process for forming a region supplied with hydrogen atoms and terminated with hydrogen and a region, which is not terminated with hydrogen, on the surface of the base by supplying hydrogen atoms to the surface of the base into which the impurities are not introduced; and a process for selectively forming a thin film on the region terminated with hydrogen.

The surface treatment process may use hydrofluoric acid.

The thin film may be made of Al.

The base may be a semiconductor base.

Formation of the thin film may be performed by a chemical vapor deposition method.

The chemical vapor deposition method may use organic metal as the raw material.

The organic metal may be alkyl aluminum hydride.

The alkyl aluminum hydride may be dimethyl aluminum hydride.

The impurity may be group VII atom or a compound containing group VII atom.

The impurity may be group VI atom or a compound containing group VI atom.

The impurity may be group II atom or a compound containing group II atom.

The impurity may be group I atom or a compound containing group I atom.

The group VII atom or the compound containing group VII atom may be a fluorine atom or a compound containing a fluorine atom.

The group VI atom or the compound containing group VI atom may be an oxygen atom or a compound containing an oxygen atom.

The group I atom or the compound containing group I atom may be a hydrogen atom or a compound containing a hydrogen atom.

The region which is not terminated with hydrogen may be terminated with impurity atoms.

Introduction of the impurities may be performed by an ion injection method.

The ion injection may be performed through a buffer film.

Heat treatment for restoring crystal may be performed after the ion injection has been performed.

The impurity may be a silicon atom or a compound containing silicon atom.

In the present invention, attention is paid to a fact that the etching process of the conventional patterning process in which an organic resist is used as a mask and the margin of the line width due to the halation limit the lower limit of the machining dimension. Thus, a process with which a circuit patterning process involving severe machining accuracy can be eliminated.

Another object of the present invention to provide a semiconductor apparatus and a manufacturing method therefor with which increase in the number of processes required to form a metal circuit layer of a fine Schottky TTL, which must have barrier metal for the emitter and collector contact portion, can be restricted and which enables excellent Schottky characteristics and bipolar transistor characteristics to be obtained.

According to another aspect of the present invention, there is provided a semiconductor apparatus comprising: an integrated circuit device including a Schottky diode and active devices except the shot key diode on the same base thereof in a mixed manner, wherein a contact metal layer in the Schottky diode portion between a contact hole and a semiconductor layer is made of metal having Schottky characteristics, and a contact metal layer in the portion except the Schottky diode portion between a contact hole and a semiconductor layer is made of barrier metal.

It is characterized in that the metal having the Schottky characteristics is aluminum.

It is characterized in that the contact hole except the Schottky diode portion is a contact hole of an emitter and that of a collector of a bipolar transistor, and the contact hole in the shot key diode portion is a contact hole of a base of the bipolar transistor.

In order to overcome the foregoing problems, according to another aspect of the present invention, there is provided a method of manufacturing a semiconductor apparatus including a Schottky diode and active devices except the Schottky diode on the same base thereof in a mixed manner, wherein a contact metal layer in the Schottky diode portion between a contact hole and a semiconductor layer is made of aluminum and a contact metal layer in the portion except the Schottky diode portion between a contact hole and a semiconductor layer is made of barrier metal, the method comprising: process for, with hydrogen, terminating the surface of the semiconductor layer appearing in the contact hole after the contact hole has been formed; a process for irradiating only the contact hole except the Schottky diode portion with electron beams, ion beams or ultraviolet rays to dissociate the surface of the semiconductor appearing in the contact hole and terminated with hydrogen so as to be terminated with oxygen; a selective vapor chemical enlargement process for selectively depositing aluminum in only the contact hole terminated with hydrogen; and a process for depositing the barrier metal.

It is characterized in that dimethyl aluminum hydride and hydrogen are used as the raw material gas for the selective vapor chemical enlargement process for enlarging aluminum.

The foregoing problems can be overcome by a method of manufacturing a semiconductor apparatus including a Schottky diode and active devices except the Schottky diode on the same base thereof in a mixed manner, wherein a contact metal layer in the Schottky diode portion between a contact hole and a semiconductor layer is made of aluminum and a contact metal layer in the portion except the Schottky diode portion between a contact hole and a semiconductor layer is made of barrier metal, the method comprising: a process for forming the contact hole in the Schottky diode portion; a process for depositing aluminum to form the contact metal layer between the contact hole and the semiconductor layer in the Schottky diode portion; a process for forming the contact hole except the Schottky diode portion; and a process for depositing the barrier metal to form the contact metal layer between the contact hole and the semiconductor layer except the Schottky diode portion.

In the present invention, the state of the exposed surface of a semiconductor in a specific contact hole among a plurality of contact holes are reformed by electron beams, ion beams or ultraviolet beams. Then, a selective aluminum CVD method or the like is employed to deposit aluminum on only the contact hole, the surface of which has been reformed. As a result, only one process for forming a contact hole and only one process for forming a metal circuit pattern are sufficient to make metal stack structure between different contact holes.

Another object of the present invention is to realize a semiconductor apparatus capable of overcoming the problems occurring due to joining up the short chips by arranging a structure such that a plurality of semiconductor active devices are formed on a long single chip adaptable to A4 or larger paper.

Accordingly, there is provided a semiconductor apparatus wherein one or more semiconductor devices are formed on a rectangular base, which is obtained by cutting out a cylindrical and single crystal silicon ingot into an axial direction, and the longitudinal length of which is 21 cm or longer.

There is provided a semiconductor apparatus, wherein a plurality of semiconductor photosensors are formed on the rectangular base longer than 21 cm.

There is provided a semiconductor apparatus, wherein a plurality of heater board portions serving as bubbling means of an ink jet mechanism and its drive device are formed on the rectangular base longer than 21 cm.

In the present invention, the cylindrical ingot of silicon single crystal is cut vertically (longitudinally), that is, in the axis direction of the cylindrical shape to cut out and machine a rectangular substrate, the longer side of which is 21 cm or longer, from the ingot having a diameter of 20 cm or smaller. As a result, a semiconductor photosensor array or an ink jet array adaptable to A4 or larger paper can be constituted by a single chip having no steps.

Another aspect of the present invention is to provide a method of manufacturing a semiconductor apparatus arranged such that electron beams are applied to an alignment mark portion prior to selectively forming a metal film in the contact hole to prevent enlargement of the metal film in the alignment mark portion at the time of selectively enlarging the metal film in the contact hole.

Another object of the present invention is to provide a method of manufacturing a semiconductor apparatus comprising steps of: forming an insulating film on the surface of a base of a semiconductor; removing a portion of the insulating film to expose the surface of the base of the semiconductor; performing surface treatment to supply hydrogen atoms to the exposed surface of the base of the semiconductor; irradiating a portion of the exposed surface of the base of the semiconductor with energy beams to selectively form a first metal film on a region, which is not irradiated with the energy beams; and forming a second metal film by non-selective deposition.

Another object of the present invention is to provide a method of manufacturing a semiconductor apparatus comprising steps of: forming a recess in the surface of a base of a semiconductor; performing surface treatment for supplying hydrogen atoms to at least a portion in the recess; and irradiating the surface of a base of the semiconductor with energy beams while making an angle of about 30° or smaller so that a metal film is selectively deposited on a region in the recess which is not irradiated with the energy beams.

Other and further objects, features and advantages of the invention will be appear more fully from the following description.

BRIEF DESCRIPTION OF THE DRAWINGS

FIGS. 29A to 29E are schematic cross sectional views which illustrate a base with which the process of a thin film forming method according to an embodiment of the present invention is explained;

DETAILED DESCRIPTION OF THE PREFERRED EMBODIMENTS

Figure 19A:
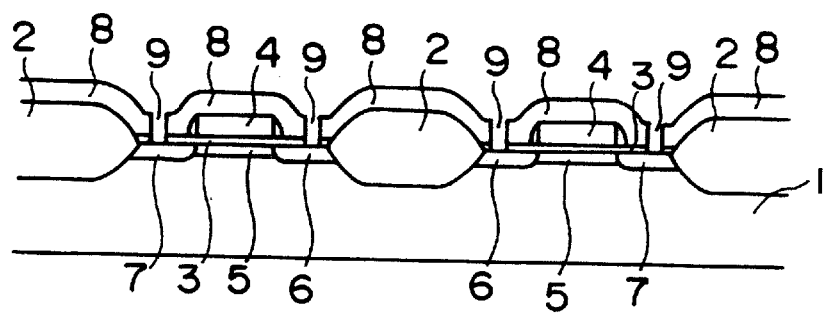
FIGS. 19A to 19D are schematic cross sectional views which illustrate a process for manufacturing a mask ROM according to the present invention.
Figure 19B:
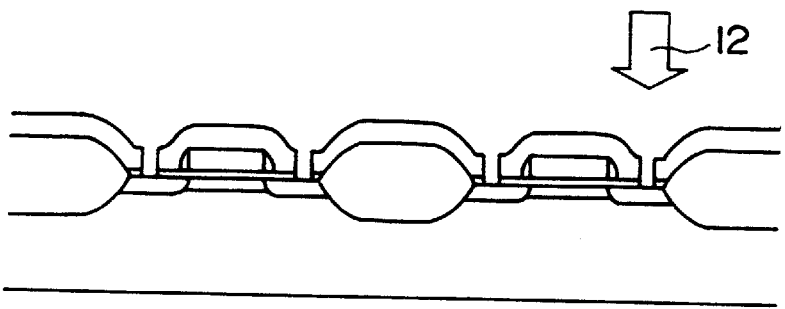

FIGS. 19A to 19D illustrate a process for manufacturing a mask ROM according to an embodiment of the present invention. FIG. 19A illustrates a state where a MOS transistor has been formed by a known method. A field oxide film 2 is formed on a P-type Si substrate 1, and the MOS transistor device is separated. Gate electrodes 4 made of polysilicon are formed on gate oxide films 3, and channel regions 5 are formed under the gate oxide films 3. Further, source regions 6 and drain regions 7 are formed, and inter-layer insulating films 8 each having an NSG/BPSG structure are formed by CVD. A contact hole 9 is anisotropically formed in the gate oxide film 3 and the inter-layer insulating film 8 on the drain region. The channel region 5 is subjected to proper channel doping by ion injection. That is, even if voltage corresponding to negative logic "0" is applied to the gate, a state where the MOS transistor is turned off is maintained. If voltage corresponding to positive logic "1" is applied to the gate, the MOS transistor is turned on.

Figure 20A:
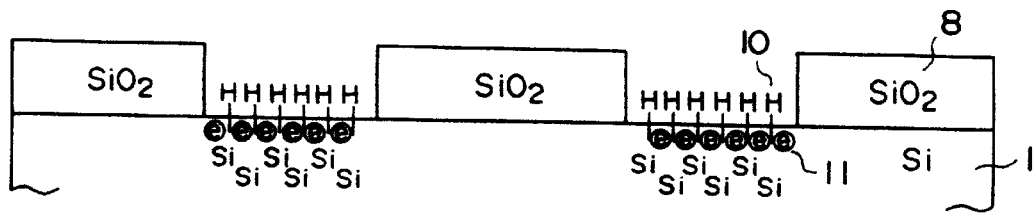
FIGS. 20A to 20E are schematic cross sectional views which illustrate a process for selectively depositing aluminum according to the present invention.
Figure 20B:
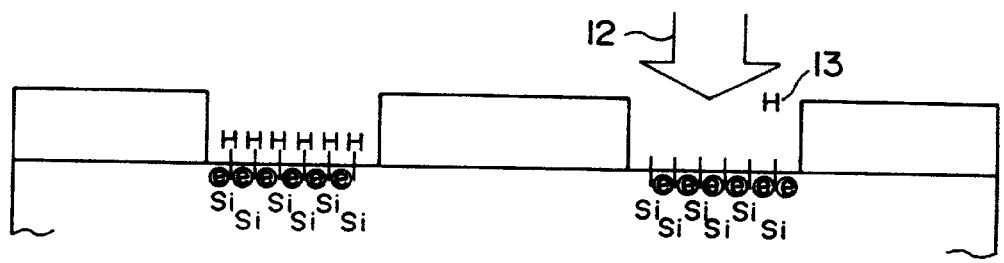
Figure 20C:
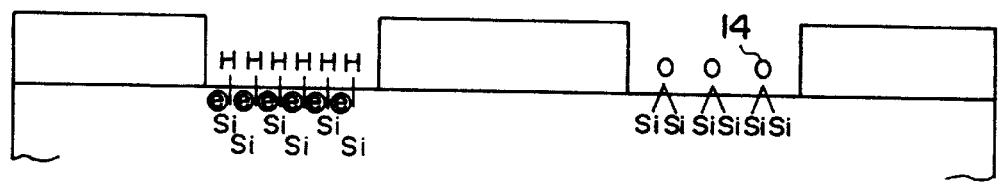

The MOS transistor formed by the process shown in FIG. 19A is cleaned with a known mixture solution $H_2SO_4+H_2O_2$ or a mixture solution $NH_4OH+H_2O_2+H_2O$. Then, it is rinsed with pure water, and immersed in a dilute HF solution and rinsed with pure water so that the surfaces of the Si layers in the source regions 6 and the drain regions 7 exposed in the bottoms of the contact holes 9 are terminated with hydrogen atoms (H) (hereinafter called "terminative hydrogen") in the single atomic layer. FIG. 20A schematically illustrates the foregoing state in the atomic level. The inter-layer insulating films 8 are not terminated with hydrogen. Although free electrons 11 are present in the vicinity of the surface of the Si layer, they are not present in the inter-layer insulating films 8. The density of the dilute HF solution before the immersion in the dilute HF solution is performed was about 1%, the time in which the immersion is performed was about 30 seconds, so that excessive etching of the inter-layer insulating film 8 was prevented. Then, electron beams 12 are selectively applied to the contact holes 9 on the drain regions 7. In the process shown in FIG. 19B, the contact hole 9 on the drain region 7 of the right MOS transistor is irradiated with electron beams 12, while the contact hole 9 on the drain region 7 of the left MOS transistor is not irradiated with electron beams 12. The electron beams 12 were applied at an acceleration voltage of 25 kV by $1\times10^{16}$ (electrons/cm$^2$). FIG. 20B illustrates an atomic-level state where the electron beams 12 are applied. In the portion irradiated with electron beams 12, hydrogen 13 is removed from the surface of the Si layer so that non-bonded hands of Si appear. The process must be performed in a vacuum state in order to apply the electron beams 12. If the Si substrate 1 is returned to the atmosphere after it has been irradiated with electron beams 12, oxygen 14 is terminated at the non-bonded hands of Si. The foregoing state is shown in FIG. 20C.

Figure 20D:
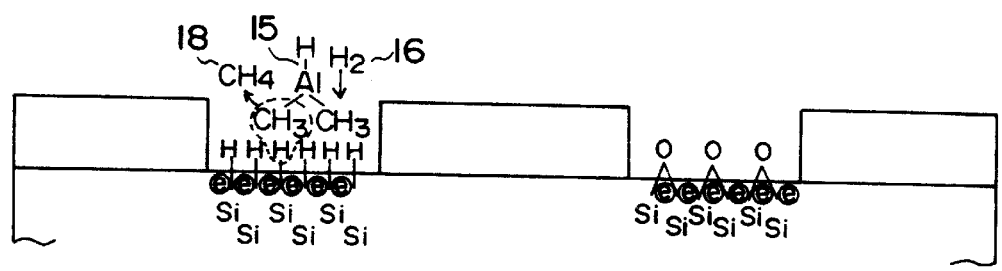
Figure 20E:
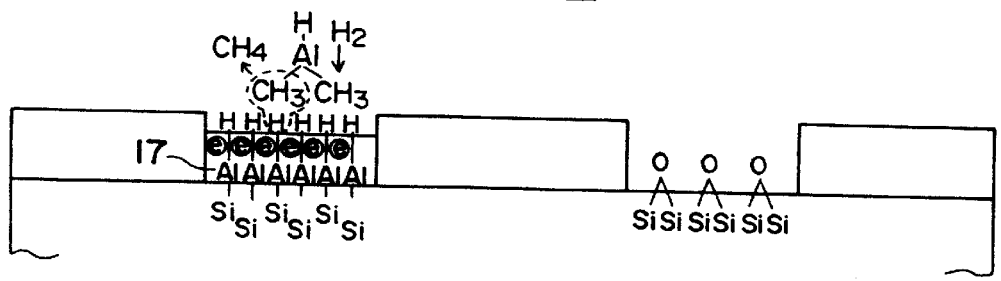

Then, CVD using dimethyl aluminum hydride $(CH_3)_2AlH$ (hereinafter called "DMAH") 15 and hydrogen $H_2$ 16 is performed so that Al 17 is deposited in only the contact hole 9 which is not irradiated with electron beams 19. In the CVD method using DMAH 15 and $H_2$ 16, the Al deposition reaction is caused to occur on the Si layer by the following three factors:

(1) Catalyst-like contribution of free electrons 11 present in the surface to the surface reaction;

(2) Terminative hydrogen 10 on the surface of the Si layer; and (3) Generation of methane $(CH_4)$ 18 due to selective reactions between the surface terminative hydrogen 10 and $CH_3$ group (methyl group) in DMAH molecule. On the surface which is terminated with hydrogen and in which the foregoing three factors are met, aluminum 17 is deposited as shown in FIGS. 20D and 20E. After aluminum has been deposited, hydrogen in DMAH 15 is also left as terminative hydrogen 10, and free electrons 11 are present in aluminum 17. Therefore, the states shown in FIGS. 20D and 20E are realized continuously. Since the region which is not terminated with hydrogen atoms, that is, the region irradiated with electron beams 12 in the process shown in FIG. 20B and the surface of the inter-layer insulating film 8 has no surface terminative hydrogen 10, no aluminum deposition reaction takes place.

Figure 17A:
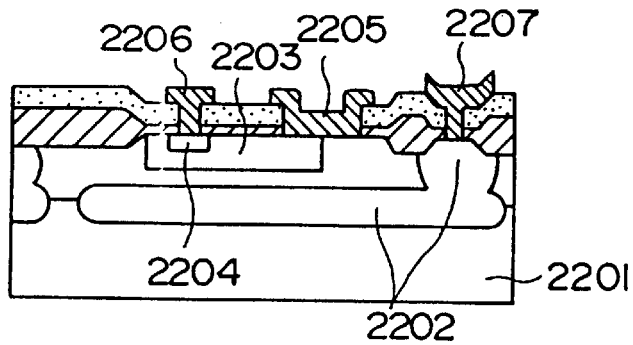
FIGS. 17A and 17B respectively are a structural cross sectional view and an equivalent circuit diagram of a conventional Schottky TTL.
Figure 17B:
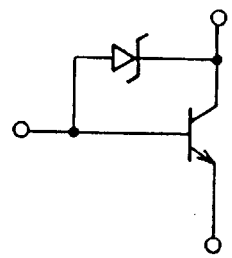
Figure 18A:
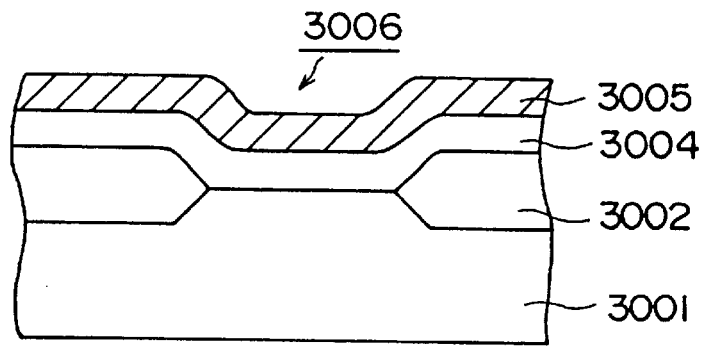
FIGS. 18A and 18B are schematic cross sectional views which illustrate examples of an alignment mark according to two conventional technologies.
Figure 18B:
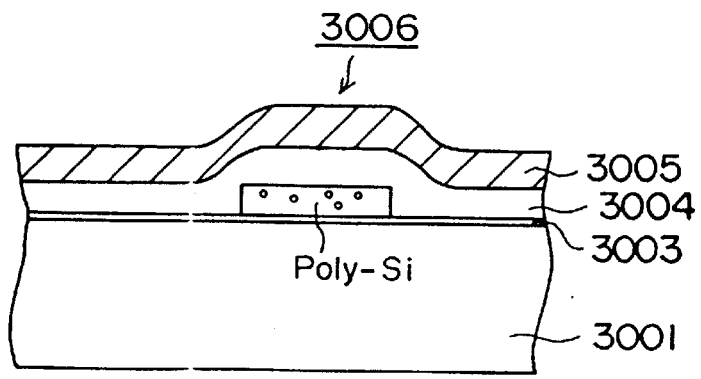

Then, the region in which aluminum is deposited will now be considered. In the aluminum deposition reaction using DMAH 15 and $H_2$ 16, the surface of the aluminum layer is always terminated with hydrogen atoms. Therefore, aluminum is not easily directed to the surface terminated with oxygen in the processes shown in FIGS. 17D and 17E. Even if the surface terminated with oxygen has a thickness corresponding to a single atom or several atoms for example, aluminum can be deposited on only the surface terminated with hydrogen. Further, the terminative hydrogen atoms on the surface of the Si layer are disposed regularly. As a result, the aluminum film on the terminative hydrogen is formed into single crystal. The aluminum film formed by the processes shown in FIGS. 20A to 20E was formed into single crystal.

As for conditions for depositing aluminum in the processes shown in FIGS. 20D and 20E, it is preferable that the total pressure is $10^{-3}$ Torr to 760 Torr, the fractional pressure of DMAH is $1.5\times10^{-5}$ to $1\times10^{-2}$ times the total pressure, and the deposition temperature is 200° C. to 450° C. Further preferably, the total pressure is 0.1 Torr to 5 Torr, the fractional pressure of DMAH is $1\times10^{-3}$ to $1.5\times10^{-3}$ times the total pressure, and the deposition temperature is 200° C. to 350° C.

As raw material gas, MMAH [$(CH_3)AlH_2$] and $H_2$ may be used in place of DMAH and $H_2$. As an alternative to this, mixture of DMAH and MMAH may be used. Since the vapor pressure of MMAH is low, it is more preferable that DMAH is used. If $SiH_4$, $Si_2H_6$, $SiHCl_3$, $SiH_2Cl_2$, $SiH_3Cl$ or $SiCl_4$ was simultaneously supplied, Al-Si containing Si by $10^{-3}\%$ to 2% could be formed only on the surface terminated with hydrogen.

Figure 19C:
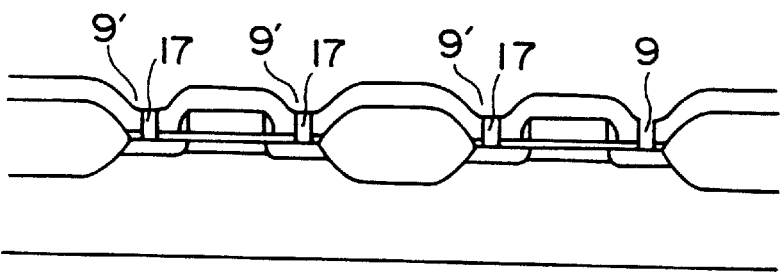

As shown in FIG. 19C, the deposition of aluminum was stopped after the contact hole 9 was filled with aluminum 17. Hereinafter, the contact hole 9 filled with aluminum 17 will be called a contact hole 9'.

Figure 1:
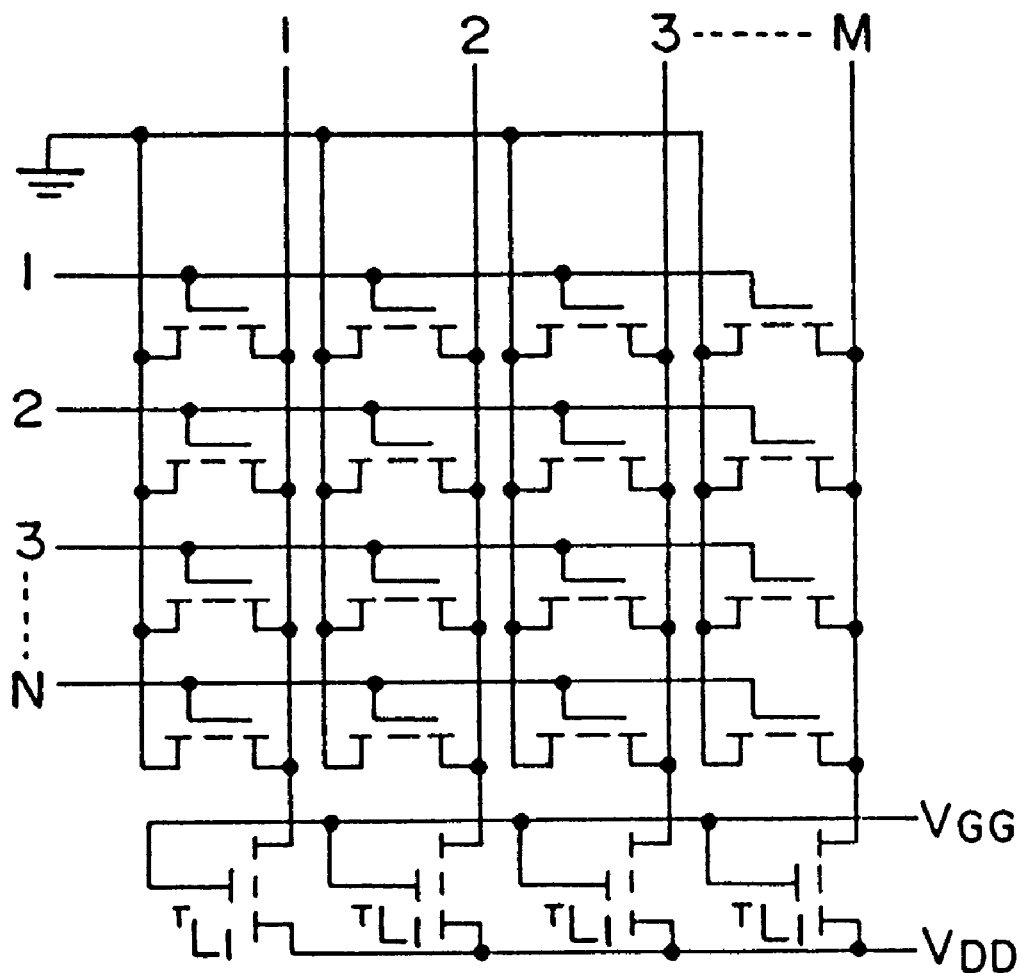
FIG. 1 is a circuit diagram of a mask ROM.
Figure 2A:
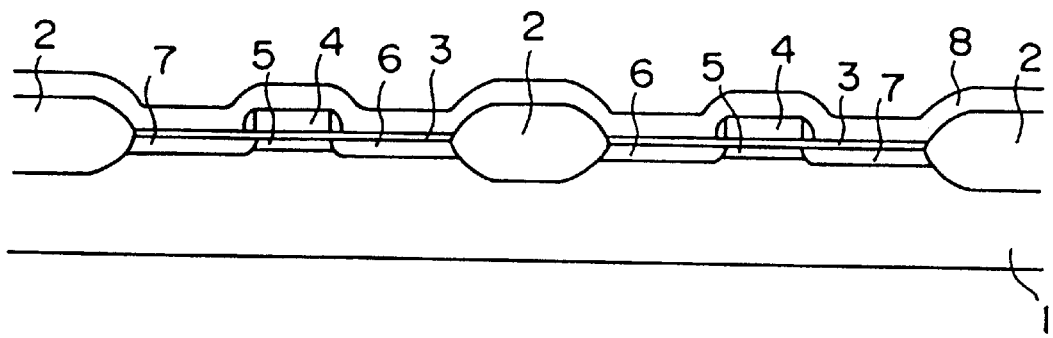
FIGS. 2A to 2C are schematic cross sectional views which illustrate a process for manufacturing a mask ROM according to conventional example 1.
Figure 2B:
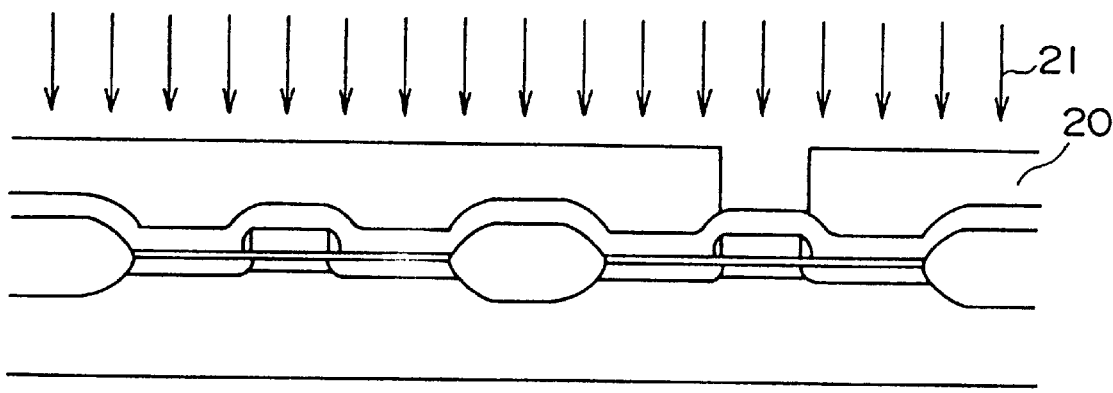
Figure 2C:
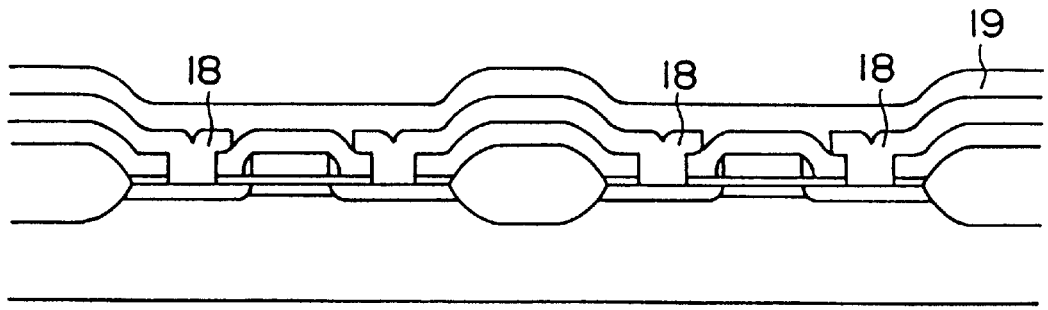
Figure 3A:
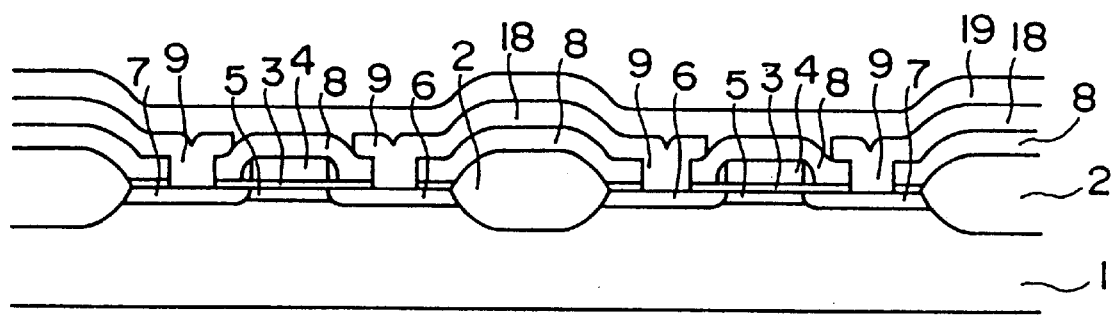
FIGS. 3A and 3B are schematic cross sectional views which illustrate a process for manufacturing a mask ROM according to conventional example 2.
Figure 3B:
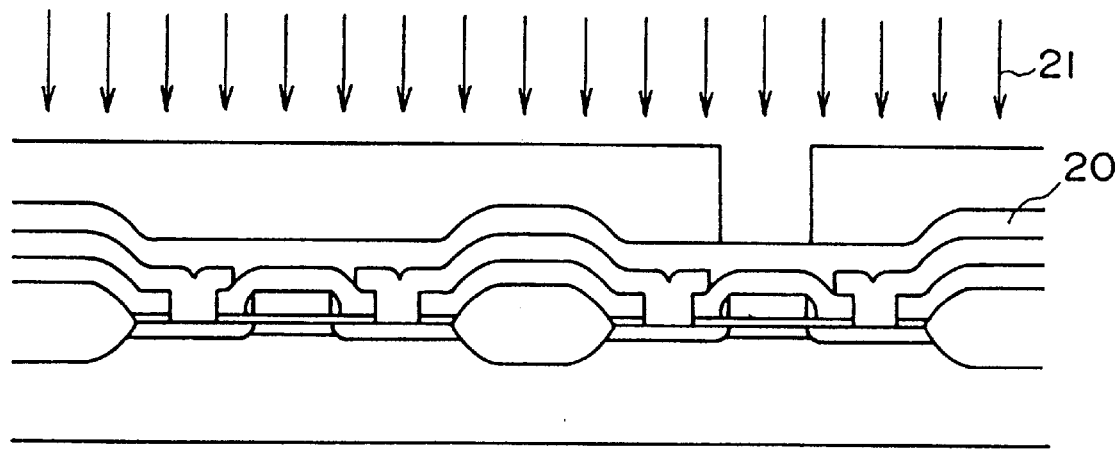
Figure 4A:
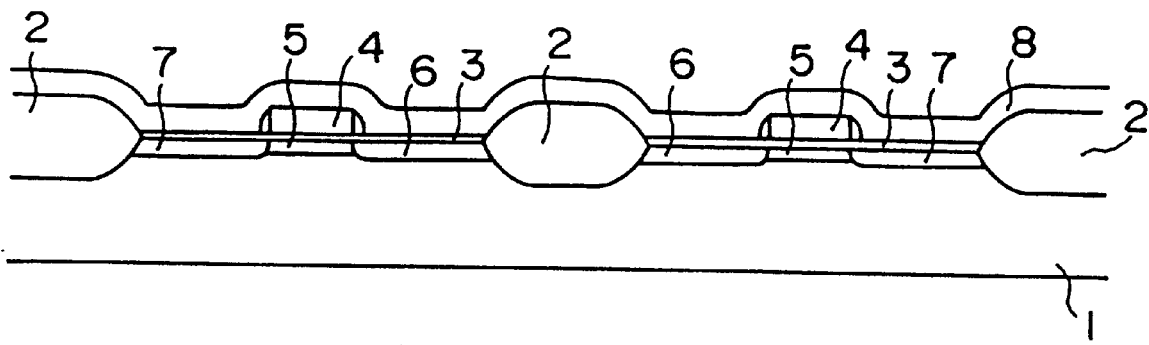
FIGS. 4A to 4D are schematic cross sectional views which illustrate a process for manufacturing a mask ROM according to conventional example 3.
Figure 4B:
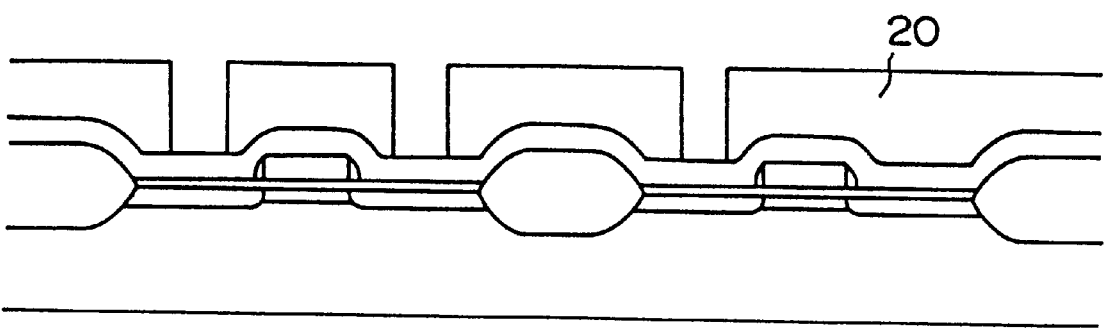
Figure 4C:
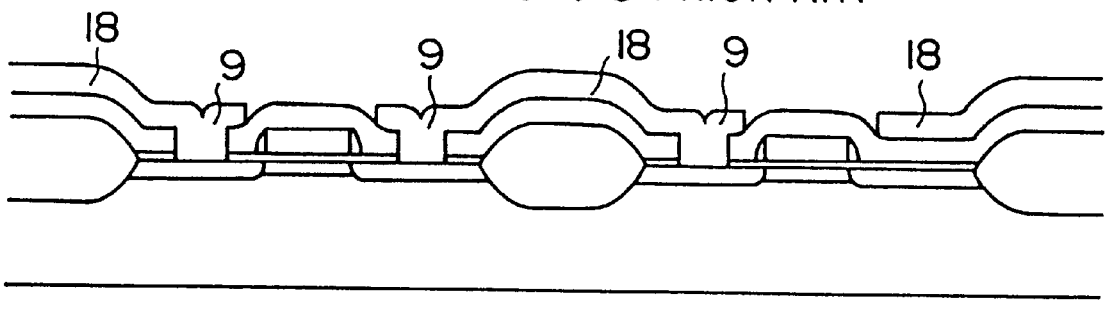
Figure 4D:
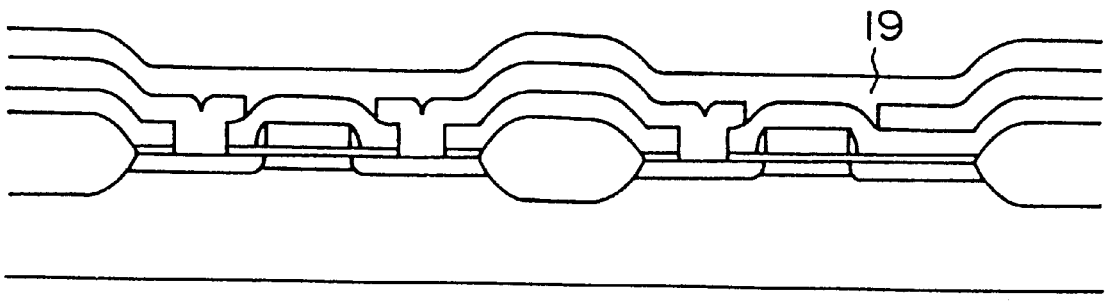
Figure 5:
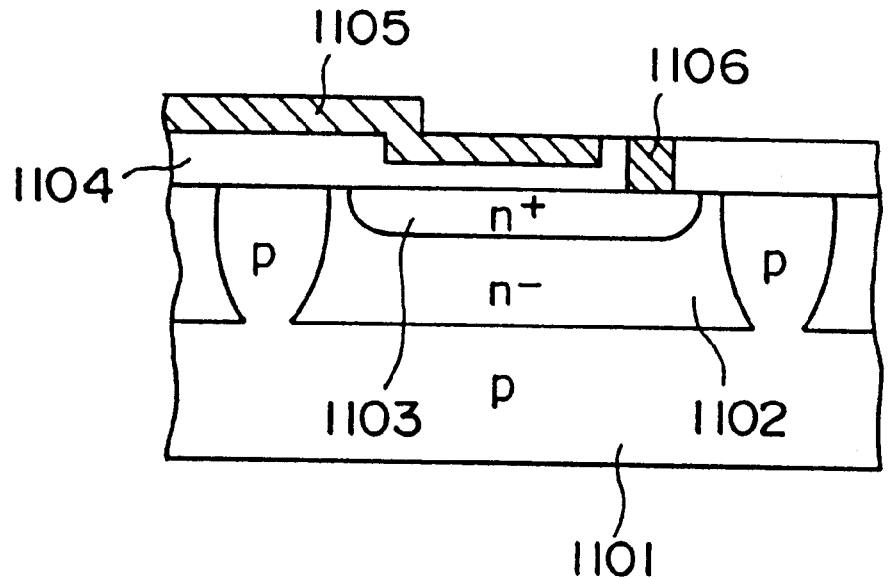
FIG. 5 is a schematic cross sectional view which illustrates a conventional MOS capacitor.
Figure 6:
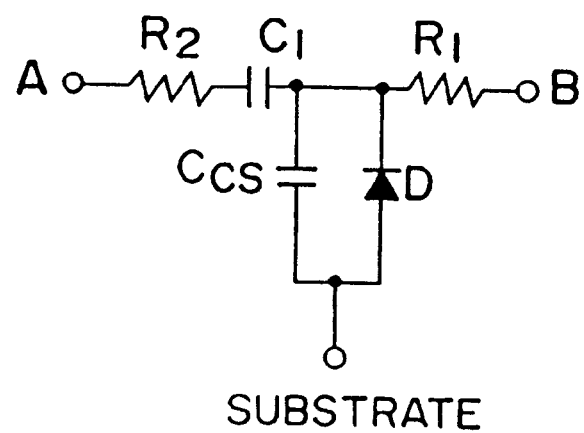
FIG. 6 is an equivalent circuit diagram of the capacitor shown in FIG. 5.
Figure 7:
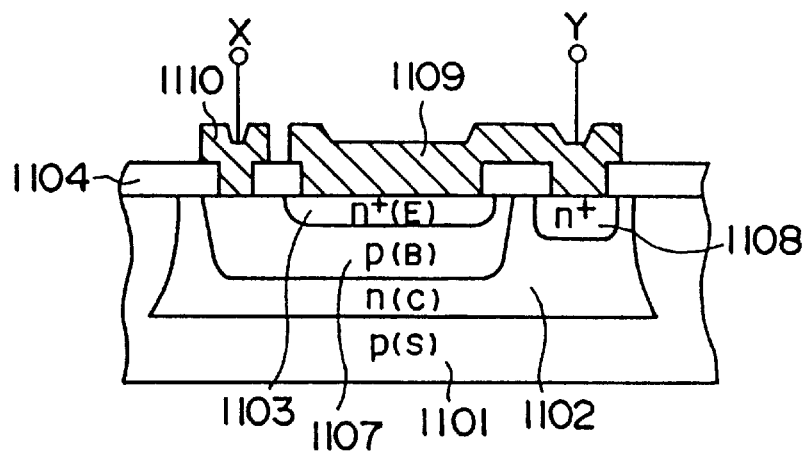
FIG. 7 is a schematic cross sectional view which illustrates a conventional pn junction capacitor.
Figure 8:
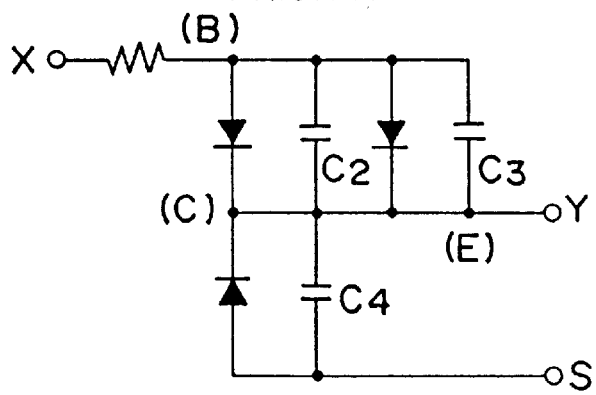
FIG. 8 is an equivalent circuit diagram of the capacitor shown in FIG. 7.
Figure 9:
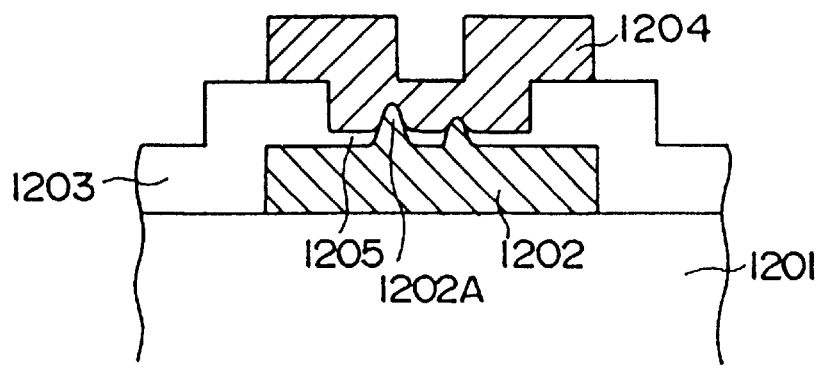
FIG. 9 is a schematic cross sectional view which illustrates another conventional capacitor.
Figure 10:
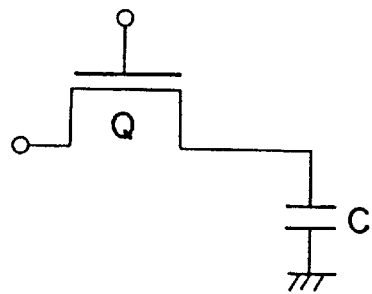
FIG. 10 is a circuit diagram of a conventional memory cell.
Figure 11:
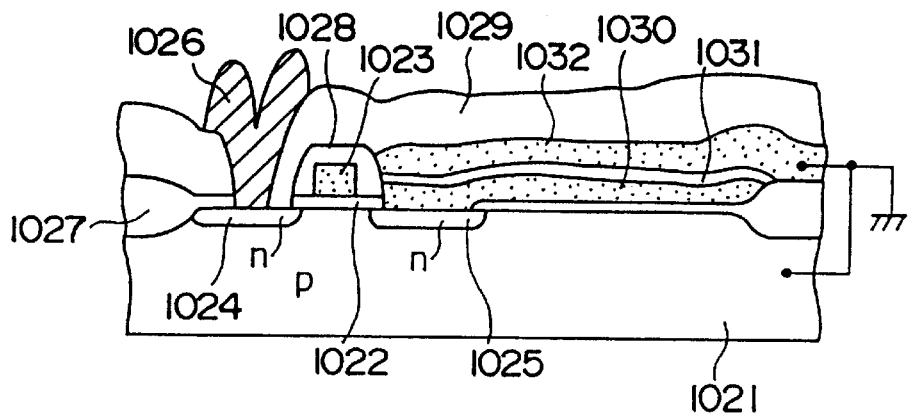
FIG. 11 is a schematic cross sectional view which illustrates a cell of a conventional semiconductor memory.
Figure 12:
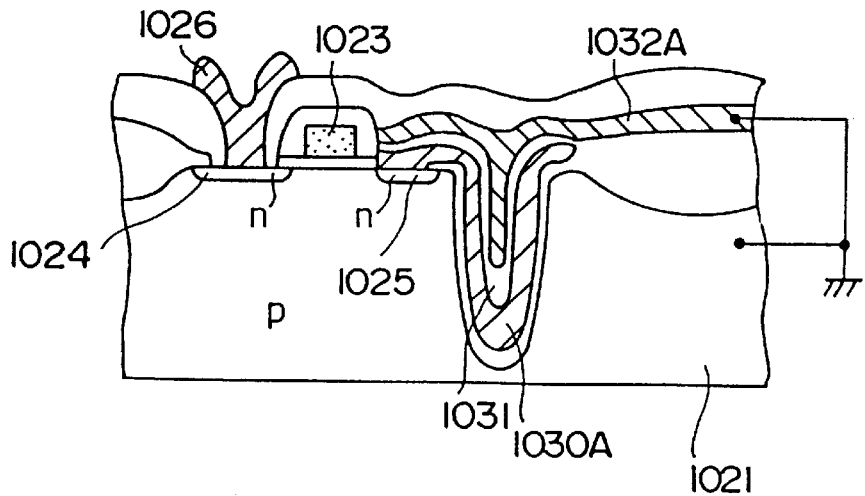
FIG. 12 is a schematic cross sectional view which illustrates a cell of a conventional semiconductor memory.
Figure 13:
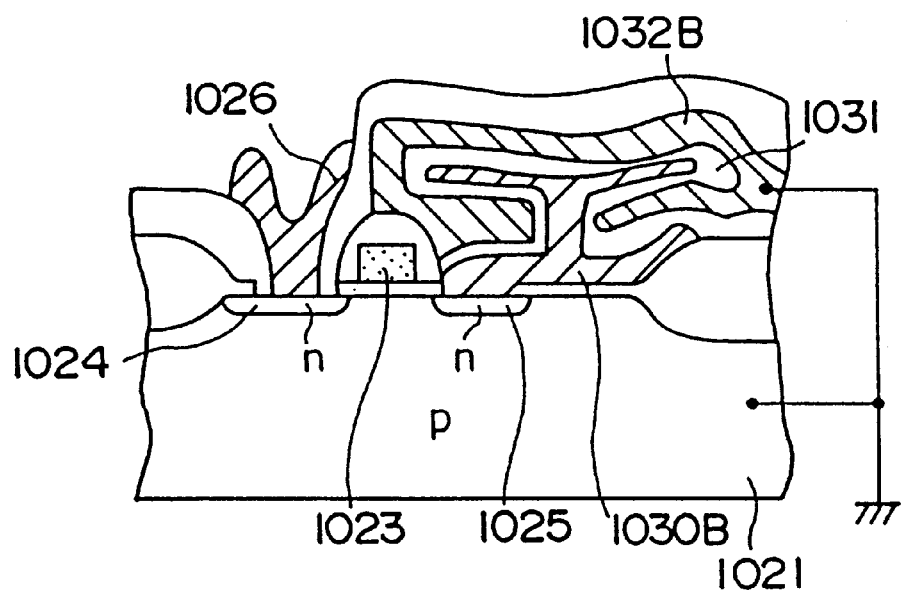
FIG. 13 is a schematic cross sectional view which illustrates a cell of a conventional semiconductor memory.
Figure 14:
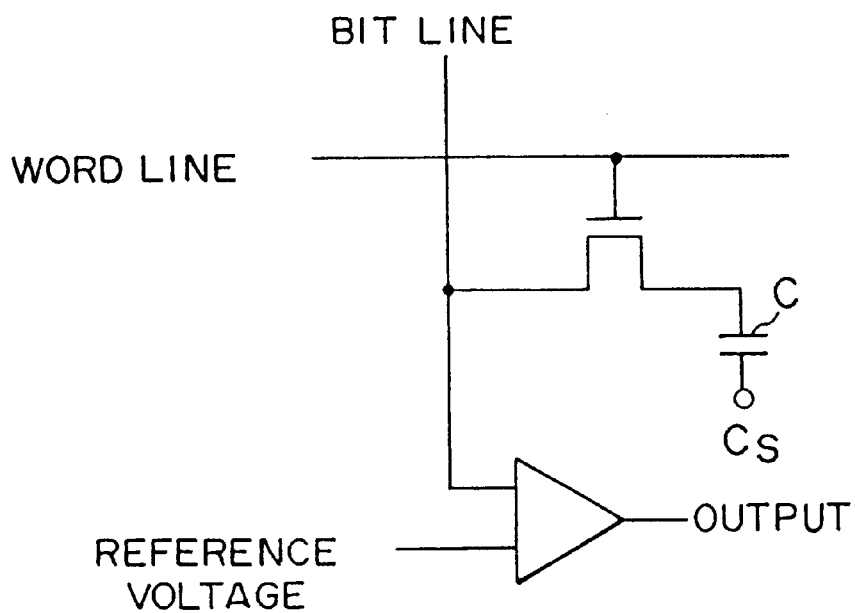
FIG. 14 is an equivalent circuit diagram of a conventional memory cell.
Figure 15:
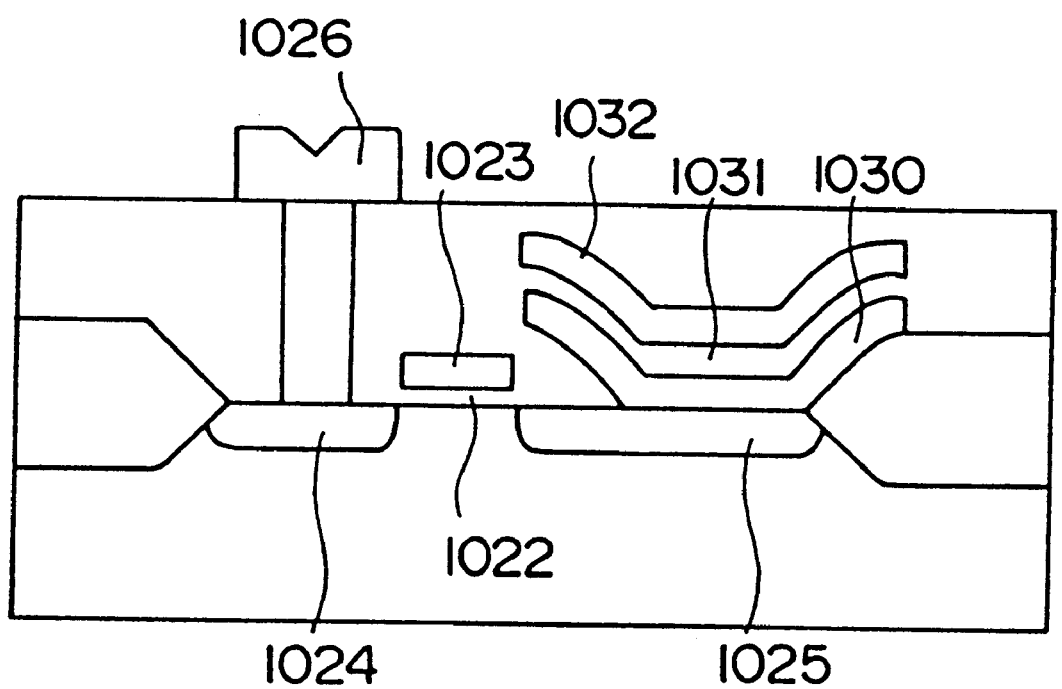
FIG. 15 is a schematic cross sectional view which illustrates another semiconductor memory.
Figure 16A:
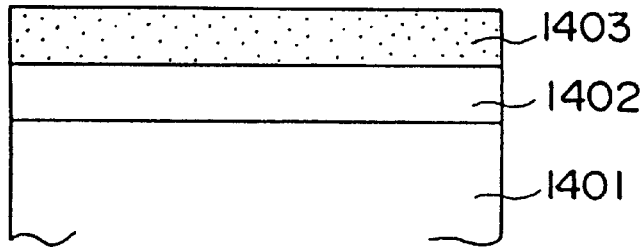
FIGS. 16A to 16D are schematic cross sectional views which illustrate a lithography process using a conventional organic resist.
Figure 16B:
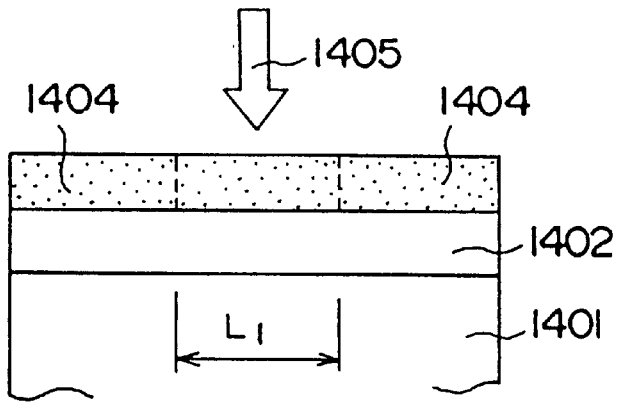
Figure 16C:
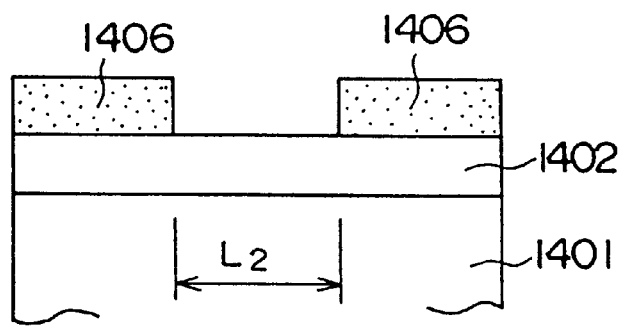
Figure 16D:
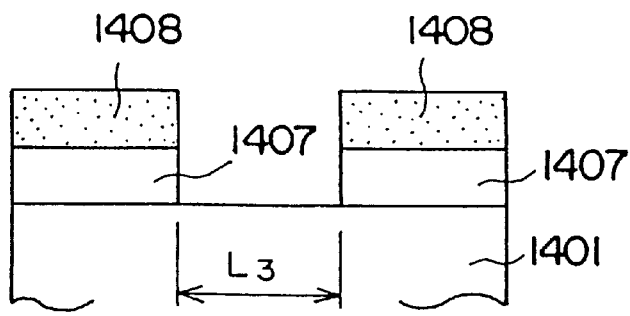

Then, an aluminum film was formed on the entire surface. Although the sputtering method is employed in the present invention, aluminum film may be formed by any method. The thickness $T_1$ of the aluminum film and the thickness $T_2$ of the inter-layer insulating film 8 was made to be $T_1<T_2$. Then, the aluminum line 18 was patterned as shown in FIG. 5D. In the contact hole 9' filled with aluminum 17, the aluminum line 18, the drain region 7 and the source region 6 could be reliably connected if the diameter of the contact hole is larger than 0.25 µm. In the contact hole 9, the aluminum line 18 and the drain region 7 could not be connected. In particular, the reliable connection could not be performed in the case where the diameter of the contact hole is 1.2 µm or less.

Figure 19D:
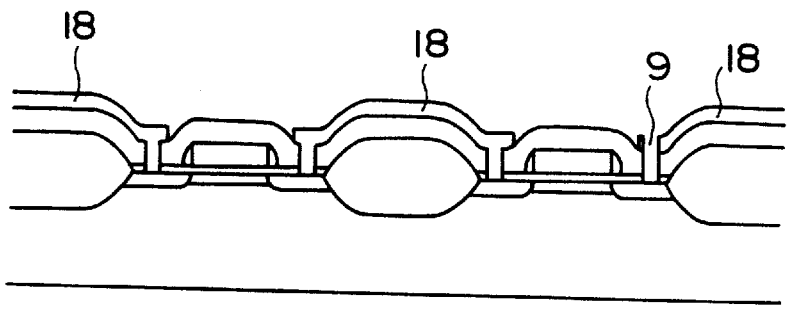

As described above, data was written on the mask ROM according to the present invention. The drain region 7 and the aluminum line 8 of the right MOS transistor shown in FIG. 19D are not connected to each other assuredly, no power supply voltage $V_{DD}$ is connected. As a result, even if voltage corresponding to positive logic "1" is applied to the gate, the MOS transistor is not turned on but the state where it is turned off is maintained. Then, a passivation film 19 was formed.

As described above, the method of manufacturing the mask ROM according to this embodiment having the steps of selectively applying energy beams to the contact hole in the Si substrate subjected to surface treatment for supplying hydrogen atoms to the surface of the exposed Si layer, forming a contact hole irradiated with energy beams and another contact hole which is not irradiated, aluminum is enclosed in the contact hole, which is not irradiate, and then the aluminum line is formed. Therefore the following effect can be obtained:

(1) The technical problem can be overcome which has been experienced with the mask ROM of a type on which data is written depending upon whether or not contact is present that the contact region must be provided for each memory cell. Since the diameter of the contact hole can be reduced to 0.25 µm, an effect can be obtained in that high degree of integration can be realized even if the contact region is formed for each memory cell.

(2) Since data can be written in a mask-less manner after the contact hole has been formed, another effect can be obtained in that the TAT can be shortened significantly. Even if data is written by injecting high energy ions in the MeV level exhibiting the shortest TAT, it takes a long time to manufacture the mask. Therefore, there is no significant difference in the TAT. If the mask ROM must be manufactured again due to occurrence of error in written data, the mask ROM according to the present invention exhibits the shortest TAT.

(3) No special manufacturing apparatus, such as a large-energy injecting apparatus, which cannot be used generally, is required in the manufacturing process. Further, the cost for manufacturing the mask can be omitted because the mask is not used in this embodiment. Therefore, an effect can be obtained in that the manufacturing cost can be reduced.

(4) A problem of unsatisfactory reliability experienced with a structure in which data is written by injecting large energy ion of MeV level can be overcome.

(5) The energy beams must be applied to only the contact hole region which is not required to be connected to the contact and the contact hole region which is required to be connected to the contact is irradiated with the energy beams so that irradiation can be performed continuously. Therefore, if a direct drawing apparatus using energy beams suffering from a poor manufacturing performance is used, an effect can be obtained in that the manufacturing performance does not deteriorate excessively.

(6) Since data is written in the mask-less manner, one mask ROM of a single type can be manufactured if necessary. An effect can be obtained in that various kinds of mask ROMs can be manufactured by a small quantity.

Embodiment A1

Figure 22:
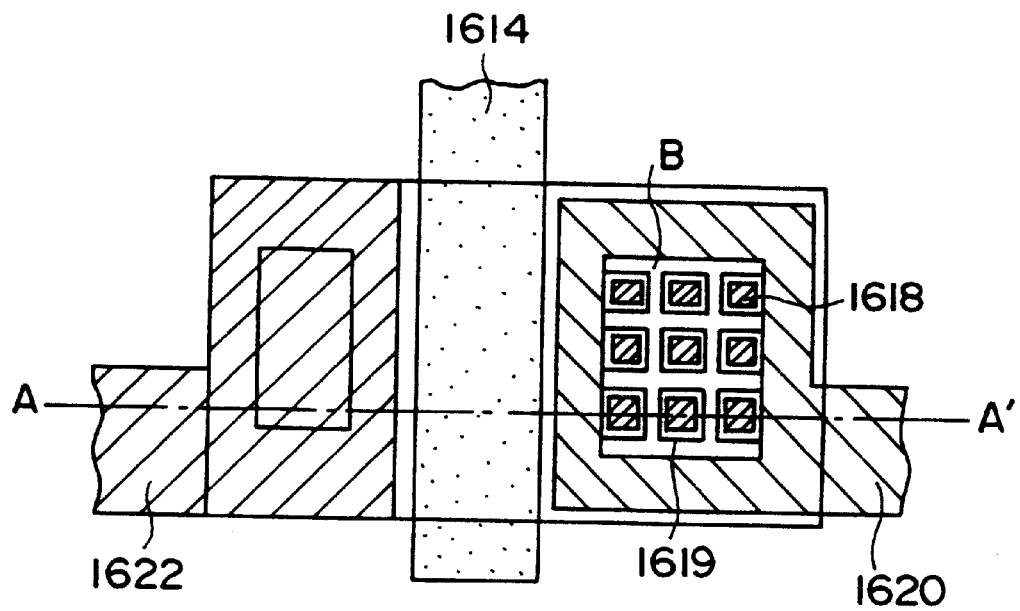
FIG. 22 is a schematic plan view which illustrates Embodiment A1 of the present invention.
Figure 23:
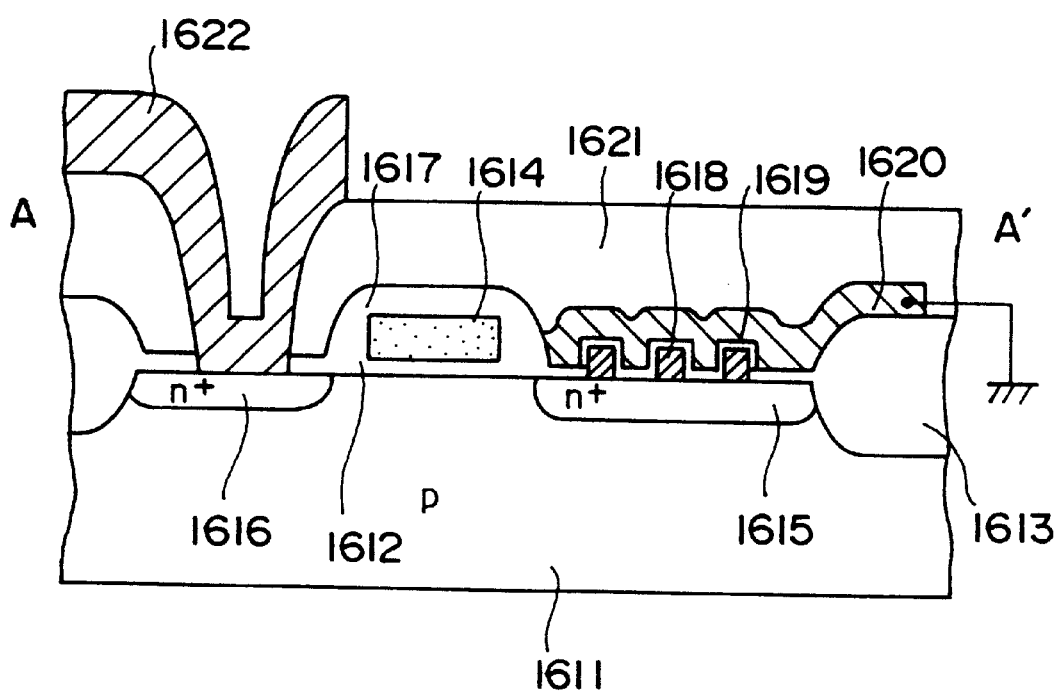
FIG. 23 is a schematic cross sectional view taken along line A—A' of FIG. 22.

FIG. 22 is a schematic plan view which illustrates a memory cell according to Embodiment A1. FIG. 23 is a cross sectional view taken along line A—A' of FIG. 22. The structure of the circuit shown in FIG. 23 corresponds to the circuit shown in FIGS. 20A to 20E.

Referring to FIGS. 22 and 23, a gate oxide film 1612 and a field oxide film 1613 are formed on the surface of a p-type substrate 1611. Further, a polysilicon gate 1614, an n-type drain region 1615 and a source region 1616 are formed. The polysilicon gate 1614 is covered with an oxide film 1617. The oxide film on the top surface of the drain region 1615 has a contact hole into which single crystal Al 1618 is deposited by the foregoing selective deposition method. In this state, the single crystal Al layer is selectively deposited due to the foregoing application of electron beams and due to exposure to atmosphere.

Further, an oxide film $Al_2O_3$ 1619 and aluminum 1620 of an upper electrode constitute a capacitor.

The upper portion of an inter-layer insulating film 1621 in the source region is opened to form an Al electrode 1622.

Another dielectric film (omitted from illustration) may be deposited between the $Al_2O_3$ film 1619 and the upper electrode 1620.

Then, a manufacturing method according to this embodiment will now be described with reference to FIGS. 21A to 21G.

Figure 21A:
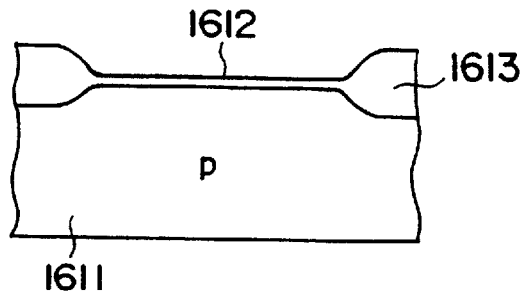
FIGS. 21A to 21G are schematic cross sectional views which illustrate a manufacturing method according to Embodiment A1.

First, the gate oxide film 1612 and the field oxide film 1613 are formed on the p-type substrate 1611 as shown in FIG. 21A.

Figure 21B:
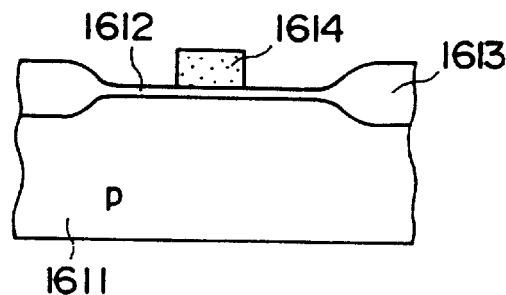
Figure 21C:
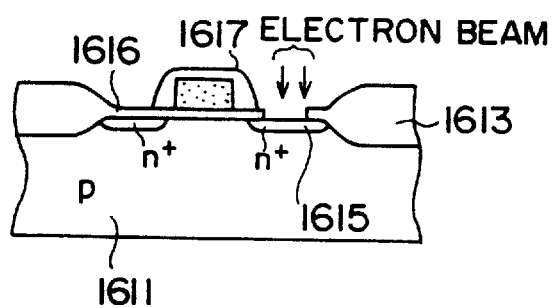

Then, polysilicon is deposited by a CVD method and it is patterned so that a polysilicon gate 1614 is formed (see FIG. 21B).

By employing the ion injection method or the like, the n-type drain 1615 and the source 1616 are formed, and the oxide film 1617 is formed on the surface of the polysilicon gate 1615 so that a NMOS structure is manufactured. The foregoing steps are the same as those of the conventional method. Then, the oxide film 1612 on the drain 1615 is removed so that the contact hole is formed (see FIG. 21C).

Figure 21D:
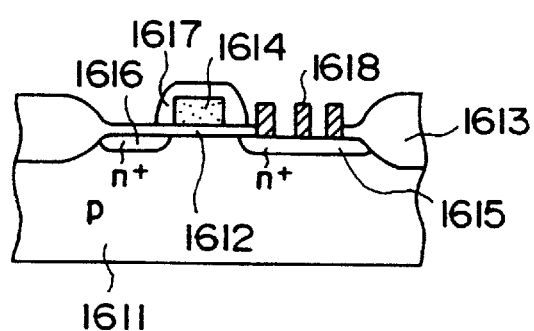

Then, electron beams are, as shown in FIG. 21D, applied to portion designated by symbol B shown in FIG. 22B and the foregoing portion is exposed to atmosphere. Then, aluminum is deposited by the selective Al-CVD method. The foregoing process will now be described in detail because it is an essential portion of the present invention.

Process for Terminating Surface of Semiconductor with Hydrogen

First, the overall body of the substrate is immersed in an eluted hydrofluoric acid (HF/H$_2$O=1/100) solution so that the entire exposed surface of the portion of the semiconductor in the contact opening portion can be terminated with hydrogen. Even if the substrate is rinsed with pure water for 10 minutes, the surface terminated with hydrogen can be maintained.

Process for Forming Surface Terminated with Hydrogen on the Surface of Semiconductor and the Surface Terminated with Oxygen If electron beams or ion beams having energy larger than energy (3.08 eV) for bonding Si-H is applied, the Si-H bond is dissociated so that hydrogen atoms are desorbed from the surface, causing non-bonded hand of Si atoms to appear.

If the substrate in the foregoing state is exposed to atmosphere, the portion, in which the non-bonded hand of Si atoms are present, is oxidized so that the portion is terminated with oxygen atoms. The process for terminating the surface with oxygen can be performed by exposing the substrate to oxygen or ozone in place of exposing to atmosphere.

The surface reforming for dissociating hydrogen termination can be performed by a method irradiating energy beams which can be performed as follows:

The surface reformation using electron beams was performed under the following conditions: the acceleration voltage was 25 kV, the beam current was 500 pA and the beam quantity was $1.5 \times 10^{16}$ (electrons/cm$^2$).

The surface reformation using ion beams was performed under the following conditions: $O_2^+$ was used as ion source, the acceleration voltage was 3 kV, and the beam quantity was $2 \times 10^{13}$ (ions/cm$^2$).

Since the surface reformation using ultraviolet rays can be performed if the wavelength is 4000 Å or shorter, a marketed i-beam stepper was used. In this case the range in the region can be specified by using an ordinary Cr mask. The foregoing method exhibits excellent processing performance.

Method of Selectively Depositing Al

The surface of the semiconductor terminated with hydrogen and the surface of the semiconductor terminate with oxygen are formed. Then, aluminum is selectively deposited in only the portion terminated with hydrogen.

The foregoing method is a method using alkyl aluminum hydride gas and hydrogen gas to form the deposition film on the electron-donating base by surface reactions.

If alkyl aluminum hydride containing a methyl group, such as monomethyl aluminum hydride (MMAH) or dimethyl aluminum hydride (DMAH), is used as the raw material gas, H$_2$ gas is used as the reaction gas, and the surface of the base is heated in the foregoing mixture gas, an excellent aluminum film can be formed.

Temperature Condition at the time of Film Formation

It is preferable that the aluminum is selectively deposited such that the temperature of the surface of the base is maintained at a level lower than 450° C. which is higher than the temperature at which the alkyl aluminum hydride is decomposed by direct or indirect heating, more preferably the temperature is 260° C. or higher to 440° C. or lower, and most preferably 260° C. or lower to 350° C. or lower.

The base can be heated to the foregoing temperature range by a direct heating method or an indirect heating method. If the base is heated to the foregoing temperature by the direct heating method, an excellent aluminum film can be formed at a high deposition speed. If the surface of the base is heated to the foregoing most preferred temperature range from 260° C. to 440° C. at the time of forming the aluminum film, an excellent film can be obtained at a high deposition speed of 3000 Å to 5000 Å/minute as compared with the method in which resistance heating is performed.

As the direct heating method (energy from a heating means is directly transmitted to the base to heat the base), heating with a lamp, for example, a halogen lamp or a xenon lamp, may be employed.

As the indirect heating method, a resistance heating method may be employed in which a heater or the like is used which is provided for a base supporting member disposed in a space for forming the deposited film for the purpose of supporting the base on which the deposition film will be formed.

The foregoing method has been disclosed in the following reference documents:

REFERENCE DOCUMENTS

Japanese Patent Application No. 1-233926 (1)
Japanese Patent Application No. 1-233924 (2)
Japanese Patent Application No. 1-233927 (3)
Japanese Patent Application No. 1-233925 (4)
Japanese Patent Application No. 2-405190 (5)

If dimethyl aluminum hydride (CH$_3$)$_2$ AlH (hereinafter called "DMAH"), which is one of organic metal materials, and hydrogen (H$_2$) are used as the raw material gas, use of the film forming conditions according to the foregoing disclosures (1), (2), (3), (4) and (5), in particular, use of the film forming conditions according to the disclosure (5) and arranged such that the base temperature is about 200° C. to 350° C. and the total pressure is about 0.1 to 5 Torr enables single crystal aluminum to be deposited on only the surface that is terminated with hydrogen.

Deposition Conditions According to This Embodiment

The aluminum was deposited according to this embodiment under conditions that the substrate temperature was 270° C., the deposition pressure was 1.2 Torr and the flow of hydrogen was 50 SCCM.

Principle of Selectiveness

The reason why aluminum is deposited on only the surface of the semiconductor terminated with hydrogen and aluminum is not deposited on the semiconductor terminated with oxygen or on the insulating film is considered as follows.

As disclosed by Tsubouchi in disclosure (5), the aluminum deposition reaction on the Si substrate in the CVD method using DMAH and $H_2$ is realized by the following factors: (1) Catalyst-like contribution of free electrons present in the surface to the surface reaction; (2) Terminative hydrogen on the surface of the Si layer; and (3) Generation of methane ($CH_4$) due to selective reactions between the surface terminative hydrogen and $CH_3$ group (methyl group) in DMAH molecule. On the surface which is terminated with hydrogen and in which the foregoing three factors are met, aluminum is deposited. After aluminum has been deposited, hydrogen in DMAH is also left as terminative hydrogen, and free electrons are present in aluminum. Therefore, the deposition takes place naturally.

Since no hydrogen terminating the surface is present in the region which is not terminated with hydrogen, no aluminum deposition reaction takes place.

Characteristics of Film Formation by Al-CVD Method

The foregoing method is a method suitable to enclose metal material into a fine and deep hole (the contact hole and a through hole) having an aspect ratio larger than 1. Further, the foregoing method exhibits excellent selectivity.

The metal film formed by the foregoing method exhibits excellent crystallinity as can be understood from the fact that single-crystal aluminum is formed, the metal film containing substantially no carbon.

The foregoing metal has a low resistivity of 0.7 to 3.4 $\mu\Omega$cm, a high reflectance of 85% to 95%, and excellent surface characteristics such that the hilock density larger than 1 $\mu$m is about 1 to 100 $cm^2$.

The probability of generation of alloy spikes occurring in the interface with the silicon is substantially zero considering the breakage probability of a semiconductor junction of 0.15 $\mu$m.

Selective Deposition Method

If the base, in which both the electron-donative surface portion and no electron-donative surface portion are present, is subjected to the Al-CVD process, aluminum single crystal can be formed on only the electron-donative surface of the base while exhibiting excellent selectivity.

The "electron-donative material" is material in which free electrons are present in the base or free electrons are generated intentionally and with which the chemical reactions are enhanced due to the supply and receipt of electrons to and from raw material gas molecule stacked to the surface of the base. For example, metal and semiconductor are the foregoing materials. A material in which a thin oxide film is present in the surface of metal or a semiconductor is included in the category of the electron-donative material according to the present invention because the chemical reactions occur due to the supply and receipt of electrons between the base and the stacked raw material molecule.

The electron-donative material is exemplified by: a binary, trinary or polyphyletic group III-V compound semiconductor which is a combination of Ga, In or Al or the like of group III and P, As or N or the like of group V; semiconductor material such as single crystal silicon or amorphous silicon; any one of the following metal, alloy or silicide: tungsten, molybdenum, tantalum, copper, titanium, aluminum, titanium-aluminum, titanium-nitride, aluminum-silicon copper, aluminum-paradium, tungsten silicide, titanium silicide, aluminum silicide, molybdenum silicide and tantalum silicide.

Aluminum or Al-Si is not selectively deposited on the surface of the non electron-dominative material.

The non electron-dominative material is exemplified by: glass of an oxide film or a heat nitride film of silicon oxide, BSG, PSG or BPSG or the like formed by heat oxidation or CVD; silicon nitride film or the like formed by a plasma CVD method, a vapor CVD method or an ECR-CVD method or the like.

Deposition of Metal Film mainly composed of Al

The Al-CVD method enables any one of the following metal films mainly composed of Al to be selectively deposited while exhibiting excellent film quality.

For example, gas containing Si atoms such as $SiH_4$, $Si_2H_6$, $Si_3H_8$, $Si(CH_3)_4$, $SiCl_4$, $SiH_2Cl_2$ or $SiHCl_3$ or gas containing Ti atoms such as $TiCl_4$, $TiBr_4$ or $Ti(CH_3)_4$ or a gas containing Cu atoms such as bisdipivaloylmethanite copper $Cu(C_{11}H_{19}O_2)_2$ or bishexafluoroacetyl acetonite copper $Cu(C_5HF_6O_2)_2$ are combined adequately and introduced in addition to the gas of alkyl aluminum hydride and hydrogen to form a mixture gas atmosphere to selective deposited conductive material, such as Al-Si, Al-Ti, Al-Cu, Al-Si-Ti or Al-Si-Cu or the like to form an electrode.

Method of Forming a Metal Film on Al Film Deposited Selectively

The Al-CVD method is a method exhibiting excellent selectivity and capable of forming a deposited film that exhibits excellent surface characteristics. Therefore, use of a non-selective film forming method in the ensuing deposition process to form an Al film or a metal film mainly composed of Al on the Al film deposited selectively and the $SiO_2$ insulating film enables a preferred metal film, which can be widely used, to be obtained to serve as a line for a semiconductor apparatus.

The metal film is exemplified by a combination of selectively deposited Al, Al-Si, Al-Ti, Al-Cu, Al-Si-Ti or Al-Si-Cu and non-selectively deposited Al, Al-Si, Al-Ti, Al-Cu, Al-Si-Ti or Al-Si-Cu.

The non-selective deposition may be performed by a CVD method or a sputtering method in place of the Al-CVD method.

The circuit lines may be formed by a method comprising the steps of: forming a conductive film by a CVD method or a sputtering method; patterning to form an under layer having a desired circuit configuration; using the Al-CVD method to selectively deposit an aluminum film or a metal film mainly composed of Al on the under layer.

The width of the deposited aluminum layer is 0.1 $\mu$m and the thickness of the aluminum layer is 0.5 $\mu$m. The height of the aluminum layer is 0.2 $\mu$m, the height being enabled to be determined to be adaptable to a desired capacitance. That is, if a longitudinal shape is employed by enlarging the height, a large surface area can be obtained and also a large capacitance can be realized.

Figure 21E:
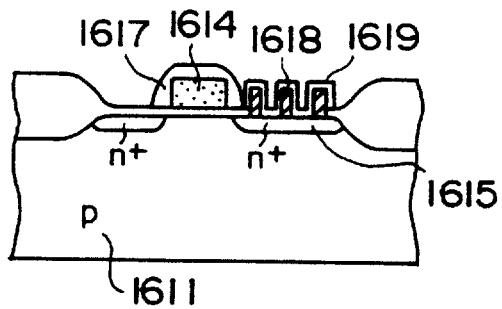

Then, the surface of the Al single crystal 1618 is oxidized by heat oxidation or an anode oxidation so that an $Al_2O_3$ film 1619 is formed (see FIG. 21E).

Since the oxide film 1619 is formed by oxidizing single crystal Al, it is formed into a thin and precise structure. The anode oxide film has a precise structure particularly.

Figure 21F:
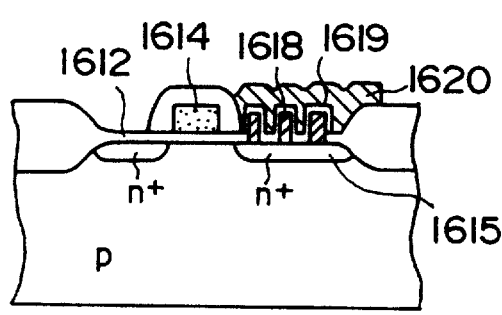

Then, a sputtering method is employed to form the aluminum layer 1620 to serve as an electrode opposing the capacitor (see FIG. 21F).

Figure 21G:
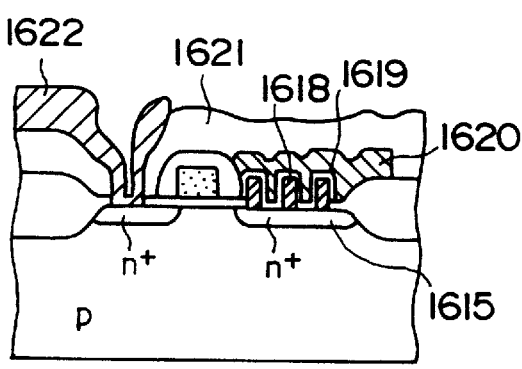

Then, the inter-layer insulating film 1621 is formed, a contact hole is formed on the source, and aluminum to serve as the source electrode 1622 is deposited by a sputtering method (see FIG. 21G).

The capacitor of the memory cell thus-manufactured has a small area equivalent to or smaller than the contact region of the drain on the surface of the device. Therefore, the memory cell is suitable to raise the degree of integration and comprises an oxide film which includes the side surface of the aluminum single crystal and which has a sufficiently large overall area. Further, the thickness of the oxide film is thin and precise, and the dielectric constant of $Al_2O_3$ is about 2.5 times that of $SiO_2$. Therefore, a capacitor having a large capacity can be constituted. The present invention may, of course, be adapted to a PMOSFET and the capacitor may, of course, be formed in the source portion in place of the drain portion.

Embodiment A2

Embodiment A2 of the present invention will now be described.

Figure 25:
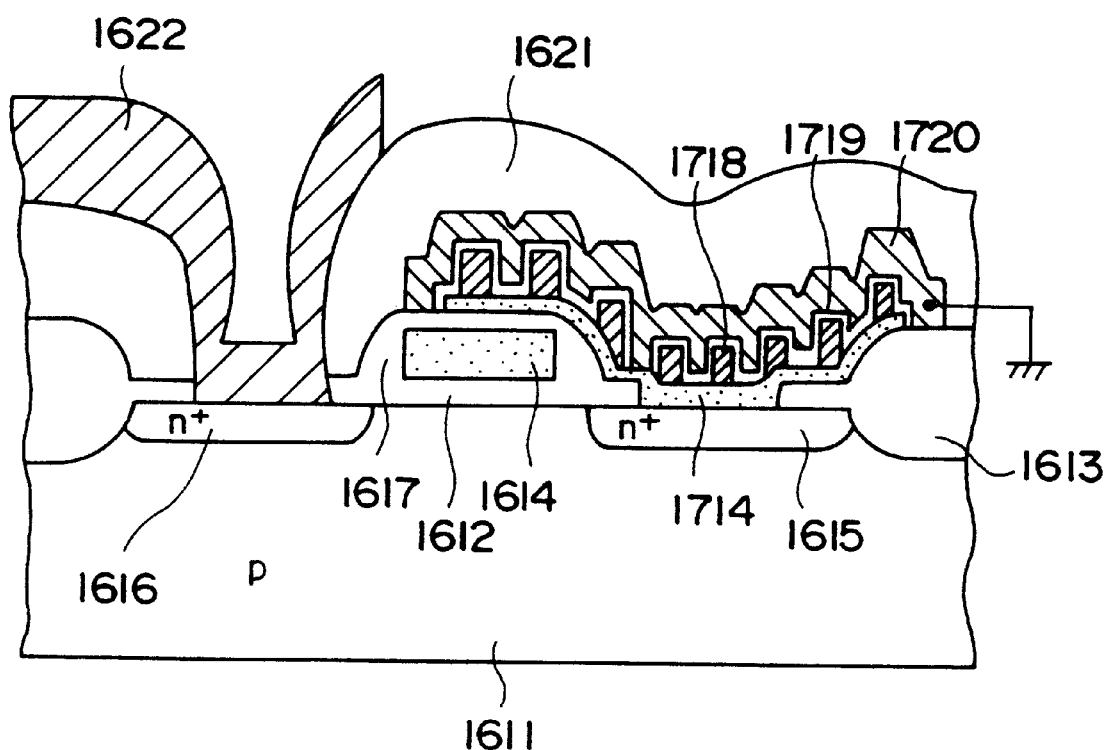
FIG. 25 is a schematic cross sectional view which illustrates Embodiment A2 of the present invention.

FIG. 25 is a schematic cross sectional view of this embodiment. In this embodiment, a memory cell is formed similarly to Embodiment A1.

Referring to FIG. 25, a gate oxide film 1612 and a field oxide film 1613 are formed on the surface of a p-type substrate 1611. Further, a polysilicon gate 1614, an n-type drain region 1615 and a source region 1616 are formed in such a manner that the polysilicon gate 1614 is covered with an oxide film 1617. The oxide film on the drain region 1615 has a contact hole therein, and a polysilicon 1714 is deposited on the drain. Single crystal aluminum 1718 is selectively deposited on the polysilicon 1714 by the foregoing method. Further, an oxide film $Al_2O_3$ 1719 and an upper aluminum electrode 1720 form a capacitor. The upper portion of an inter-layer insulating film 1621 in the source region is opened and an aluminum electrode 1622 is formed.

Then, a manufacturing method according to this embodiment will now be described with reference to FIGS. 24A to 24G.

Figure 24A:
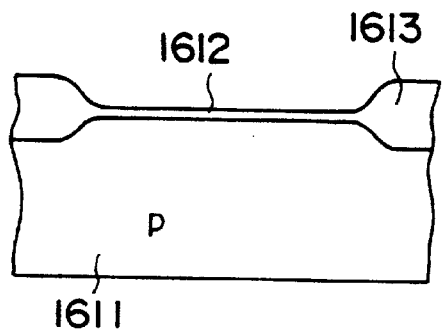
FIGS. 24A to 24G are schematic cross sectional views which illustrate a manufacturing method according to Embodiment A2.

As shown in FIG. 24A, the gate oxide film 1612 and the field oxide film 1613 are formed on the p-type substrate 1611. Then, polysilicon is deposited by a CVD method, and it is patterned so that the polysilicon gate 1614 is formed (see FIG. 24B). By an ion injection method or the like, the n-type drain 1615 and the source 1616 are formed so that an nMOS structure is formed. The foregoing process is the same as that of the conventional method. Then, the oxide film 1612 on the drain 1615 is removed so that a contact hole is formed. By employing a CVD method, polysilicon is deposited and patterned so that the polysilicon portion 1714 serving as the lower electrode of the capacitor is formed. Then, electron beams are applied to a portion in which aluminum is not intended to be deposited before it is exposed to atmosphere (see FIG. 24C).

Figure 24E:
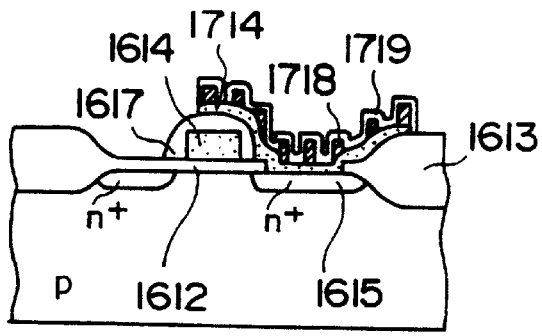
Figure 24B:
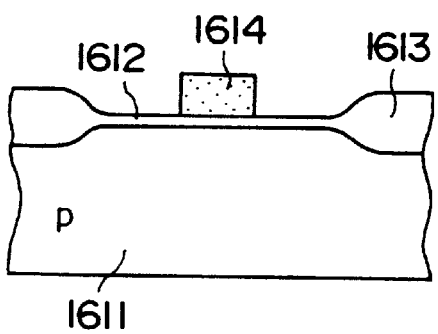
Figure 24F:
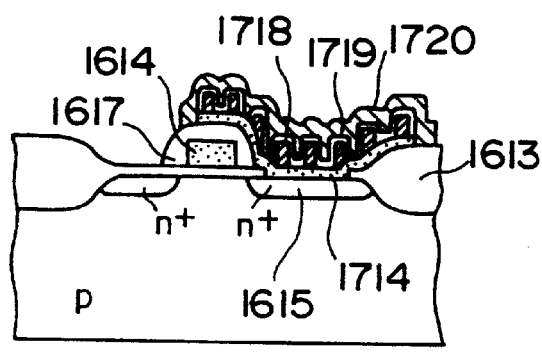
Figure 24C:
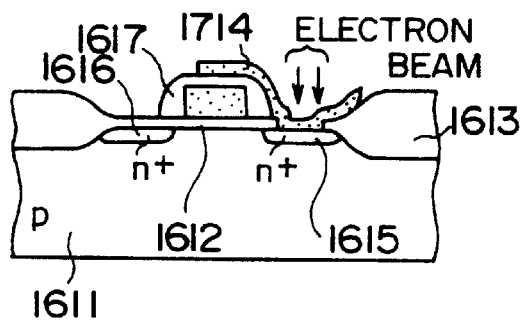
Figure 24G:
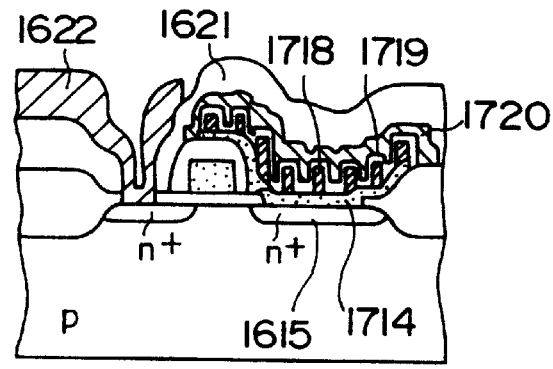
Figure 24D:
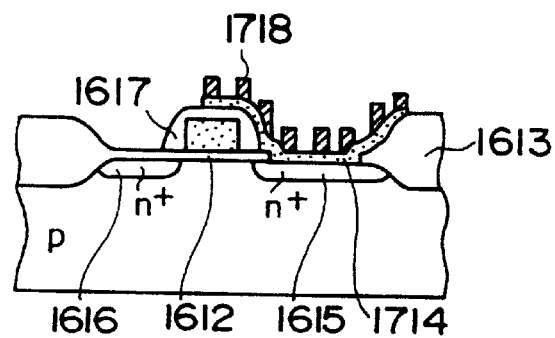

Then, aluminum is deposited by a selective Al-CVD method (see FIG. 24D). Since the foregoing process is the same as that according to the aforesaid embodiments, its description is omitted here.

The width of deposited aluminum is 0.1 µm and the thickness of the same is 0.5 µm.

Then, the surface of single crystal aluminum 1718 is oxidized with heat or anode oxidation so that an $Al_2O_3$ film 1719 is formed (see FIG. 24E).

Since the oxide film 1619 is formed by oxidizing single crystal Al, it is formed into a thin and precise structure. The anode oxide film has a precise structure particularly.

Then, a sputtering method is employed to form the aluminum layer 1720 to serve as an electrode opposing the capacitor (see FIG. 24F).

Then, the inter-layer insulating film 1621 is formed, a contact hole is formed on the source, and aluminum to serve as the source electrode 1622 is deposited by a sputtering method (see FIG. 24G).

The capacitor of the memory cell thus-manufactured has a small area equivalent to or smaller than the contact region of the drain on the surface of the device. Therefore, the memory cell is suitable to raise the degree of integration and comprises an oxide film which includes the side surface of the aluminum single crystal and which has a sufficiently large overall area. Further, the thickness of the oxide film is thin and precise, and the dielectric constant of $Al_2O_3$ is about 2.5 times that of $SiO_2$. Therefore, a capacitor having a large capacity can be constituted. The present invention may, of course, be adapted to a PMOSFET and the capacitor may, of course, be formed in the source portion in place of the drain portion.

Embodiment B1

Figure 26A:
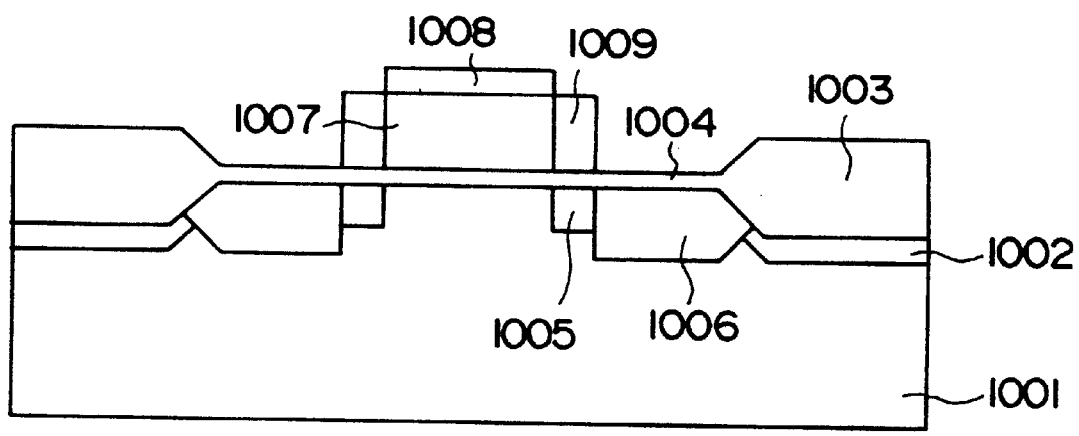
FIGS. 26A and 26B are cross sectional views which illustrate an NMOS according to the present invention in a state before and after the aluminum side wall is removed.
Figure 26B:
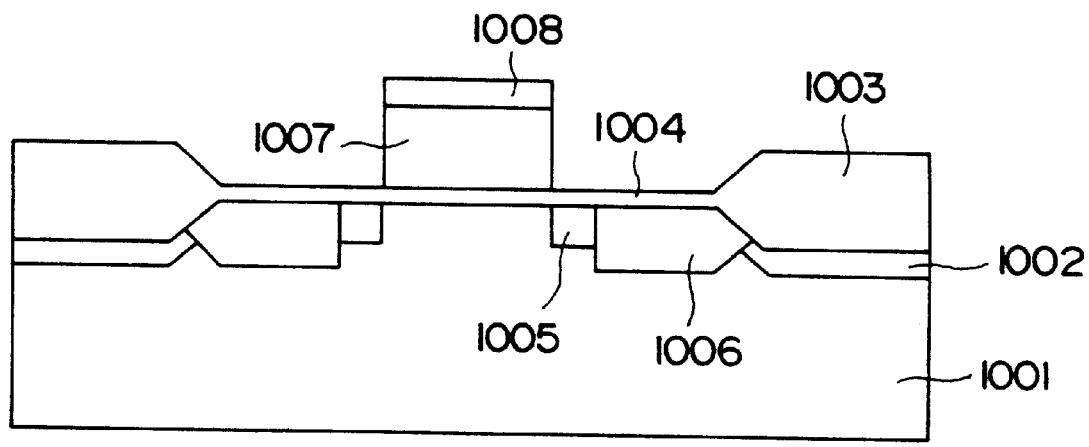

FIGS. 26A and 26B illustrate an embodiment of the present invention, in which the cross section of an NMOS transistor is shown. If a PMOS is manufactured, the conduction types n and p of the semiconductor are inverted and the structure is basically the same as that shown in FIG. 26. That is, the present invention may be adapted to both NMOS and PMOS and also adaptable to a complementary-type MOS (CMOS).

Referring to FIGS. 26A and 26B, reference numeral 1001 represents a p-type region formed by a substrate or an well.

Reference numeral 1002 represents a $p^+$ region which forms a n-channel stop region, 1003 represents a field oxide film 1004 represents a gate oxide film, 1005 represents an $n^-$ region (an LDD region) for relaxing the drain electric field, 1006 represents an $n^+$ region which forms the source and the drain, 1007 represents polycrystal silicon for forming the gate electrode and containing phosphorus, 1008 represents a heat oxide film formed on the gate electrode, and 1009 represents an aluminum side wall formed by a selective CVD method, the aluminum side wall being removed by cleaning with acid after ions have been injected to form the $n^+$ region for forming the source and the drain 1006. The foregoing state is shown in FIG. 26B.

Then, a process to realize a state shown in FIGS. 26A and 26B and a process after the foregoing process shown in FIGS. 26A and 26B are shown in FIGS. 27A to 27H.

The process will now be described sequentially with reference to FIGS. 27A to 27H.

A process to be performed until the polycrystal silicon 1007 containing phosphorus is formed is the same as that of the conventional method.

Figure 27A:
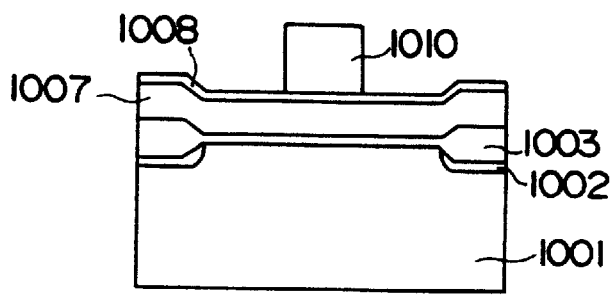
FIGS. 27A to 27H illustrate a process to be performed to form the structure shown in FIG. 26.
Figure 27B:
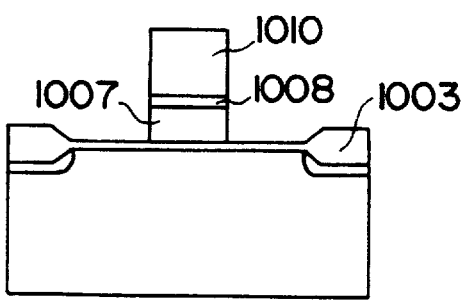

Then, the heat oxide film 1008 is formed on the surface of the polycrystal silicon 1007 to have a thickness about 200 Å. Then, a photo-resist 1010 is applied, and exposure and development are performed. The foregoing state is shown in FIG. 27A.

Figure 27C:
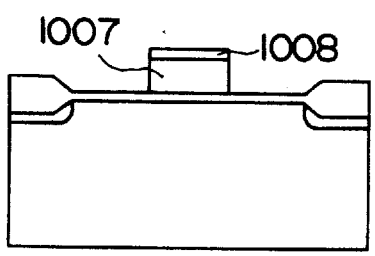
Figure 27D:
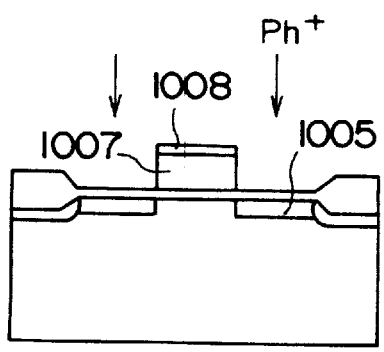
Figure 27E:
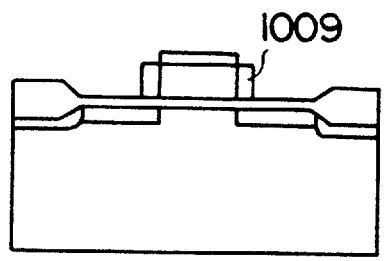
Figure 27F:
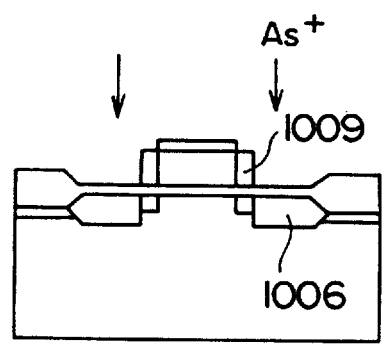

Then, reactive ion etching (RIE) is performed so that polycrystal silicon 1007 is etched so that the photo-resist 2010 is removed (see FIG. 27C).

Then, an ordinary LDD process is performed so that the $n^-$ region 1005 is formed by ion injection (if the PMOS is formed, the $p^-$ region is formed by injecting boron ions or ions of a boron compound (see FIG. 27D)). At this time, no heat oxide film is present on the side surface of the gate electrode made of the polycrystal silicon 1007 but only a natural oxide film is present. That is, the surface of the wafer except the side surface of the gate electrode 1007 is protected by the heat oxide film 1008.

The natural oxide film formed on the side surface of the gate electrode 1007 can easily be removed by an elute hydrofluoric acid (HF:H$_2$O=1:100) process. In this state, only the side surface of the gate electrode 1007 is subjected to a selective CVD method so that the aluminum side wall 1009 is formed (see FIG. 27E). A method of forming the film at this time will now be described in detail.

Al CVD

Film Forming Method

A film forming method (the Al-CVD method) for forming a metal film (pure aluminum included) preferable for the present invention and mainly composed of Al will now be described.

The foregoing method is a method suitable to enclose metal material into a fine and deep hole (the contact hole and a through hole) having an aspect ratio larger than 1. Further, the foregoing method exhibits excellent selectivity.

The metal film formed by the foregoing method exhibits excellent crystallinity as can be understood from the fact that single-crystal aluminum is formed, the metal film containing substantially no carbon.

The foregoing metal has a low resistivity of 0.7 to 3.4 $\mu\Omega$cm, a high reflectance of 85% to 95%, and excellent surface characteristics such that the hilock density larger than 1 $\mu$m is about 1 to 100 cm$^{-2}$.

The probability of generation of alloy spikes occurring in the interface with the silicon is substantially zero on the view point of the breakage probability of a semiconductor junction of 0.15 $\mu$m.

The foregoing method is a method using alkyl aluminum hydride gas and hydrogen gas to form the deposition film on the electron-donating base by surface reactions. If alkyl aluminum hydride containing a methyl group, such as monomethyl aluminum hydride (MMAH) or dimethyl aluminum hydride (DMAH), is used as the raw material gas, H$_2$ gas is used as the reaction gas, and the surface of the base is heated in the foregoing mixture gas, an excellent aluminum film can be formed.

It is preferable that the aluminum is selectively deposited such that the temperature of the surface of the base is maintained at a level lower than 450° C. which is higher than the temperature at which the alkyl aluminum hydride is decomposed by direct or indirect heating, more preferably the temperature is 260° C. or higher to 440° C. or lower, and most preferably 260° C. or lower to 350° C. or lower.

The base can be heated to the foregoing temperature range by a direct heating method or an indirect heating method. If the base is heated to the foregoing temperature by the direct heating method, an excellent aluminum film can be formed at a high deposition speed. If the surface of the base is heated to the foregoing most preferred temperature range from 260° C. to 440° C. at the time of forming the aluminum film, an excellent film can be obtained at a high deposition speed of 3000 Å to 5000 Å/minute as compared with the method in which resistance heating is performed. As the direct heating method (energy from a heating means is directly transmitted to the base to heat the base), heating with a lamp, for example, a halogen lamp or a xenon lamp, may be employed. As the indirect heating method, a resistance heating method may be employed in which a heater or the like is used which is provided for a base supporting member disposed in a space for forming the deposited film for the purpose of supporting the base on which the deposition film will be formed.

If the base, in which both the electron-donative surface portion and no electron-donative surface portion are present, is subjected to the Al-CVD process, aluminum single crystal can be formed on only the electron-donative surface of the base while exhibiting excellent selectivity.

The "electron-donative material" is material in which free electrons are present in the base or free electrons are generated intentionally and with which the chemical reactions are enhanced due to the supply and receipt of electrons to and from raw material gas molecule stacked to the surface of the base. For example, metal and semiconductor are the foregoing materials. A material in which a thin oxide film is present in the surface of metal or a semiconductor is included in the category of the electron-donative material according to the present invention because the chemical reactions occur due to the supply and receipt of electrons between the base and the stacked raw material molecule.

The electron-donative material is exemplified by: a binary, trinary or polyphyletic group III-V compound semiconductor which is a combination of Ga, In or Al or the like of group III and P, As or N or the like of group V; semiconductor material such as single crystal silicon or amorphous silicon; any one of the following metal, alloy or silicide: tungsten, molybdenum, tantalum, copper, titanium, aluminum, titanium-aluminum, titanium-nitride, aluminum-silicon copper, aluminum-paradium, tungsten silicide, titanium silicide, aluminum silicide, molybdenum silicide and tantalum silicide.

The material with which aluminum or Al-Si is not selectively deposited on the surface of the non electron-dominative material, that is the non electron-dominative material is exemplified by: glass of an oxide film or a heat nitride film of silicon oxide, BSG, PSG or BPSG or the like formed by heat oxidation or CVD; silicon nitride film or the like formed by a plasma CVD method, a vapor CVD method or an ECR-CVD method or the like.

The Al-CVD method enables any one of the following metal films mainly composed of Al to be selectively deposited while exhibiting excellent film quality.

For example, gas containing Si atoms such as SiH$_4$, Si$_2$H$_6$, Si$_3$H$_8$, Si(CH$_3$)$_4$, SiC$_4$, SiH$_2$Cl$_2$ or SiHCl$_3$ or gas containing Ti atoms such as TiCl$_4$, TiBr$_4$ or Ti(CH$_3$)$_4$ or a gas containing Cu atoms such as bisdipivaloylmethanite copper Cu(C$_{11}$H$_{19}$O$_2$)$_2$ or bishexafluoroacetyl acetonite copper Cu(C$_5$HF$_6$O$_2$)$_2$ are combined adequately and introduced in addition to the gas of alkyl aluminum hydride and hydrogen to form a mixture gas atmosphere to selectively deposit conductive material, such as Al-Si, Al-Ti, Al-Cu, Al-Si-Ti or Al-Si-Cu or the like to form an electrode.

The Al-CVD method is a method exhibiting excellent selectivity and capable of forming a deposited film that exhibits excellent surface characteristics. Therefore, use of a non-selective film forming method in the ensuing deposition process to form an Al film or a metal film mainly composed of Al on the Al film deposited selectively and the SiO$_2$ insulating film enables a preferred metal film, which can be widely used, to be obtained to serve as a line for a semiconductor apparatus.

The metal film is exemplified by a combination of selectively deposited Al, Al-Si, Al-Ti, Al-Cu, Al-Si-Ti or Al-Si-Cu and non-selectively deposited Al, Al-Si, Al-Ti, Al-Cu, Al-Si-Ti or Al-Si-Cu.

The non-selective deposition may be performed by a CVD method or a sputtering method in place of the Al-CVD method.

The circuit lines may be formed by a method comprising the steps of: forming a conductive film by a CVD method or a sputtering method; patterning to form an under layer having a desired circuit configuration; using the Al-CVD method to selectively deposit an aluminum film or a metal film mainly composed of Al on the under layer.

Further, the Al-CVD method may be used so that the lines are formed on the insulating film. In order to achieve this, a substantially electron-donative surface portion must be formed by subjecting the insulating film to the surface reforming process. The surface reforming can be performed by plasma-damaging the insulating film or applying energy beams such as electrons or ions. By drawing a desired line configuration with beams, the deposition is, by the selective deposition, made only in the electron-donating portion corresponding to the line configuration thus drawn. As a result, the line can be formed in a self-alignment manner while eliminating a necessity of performing the patterning process.

Film Forming Apparatus

Then, a film forming apparatus preferred to form the electrode by the Al-CVD method will now be described with reference to FIG. 28.

Figure 28:
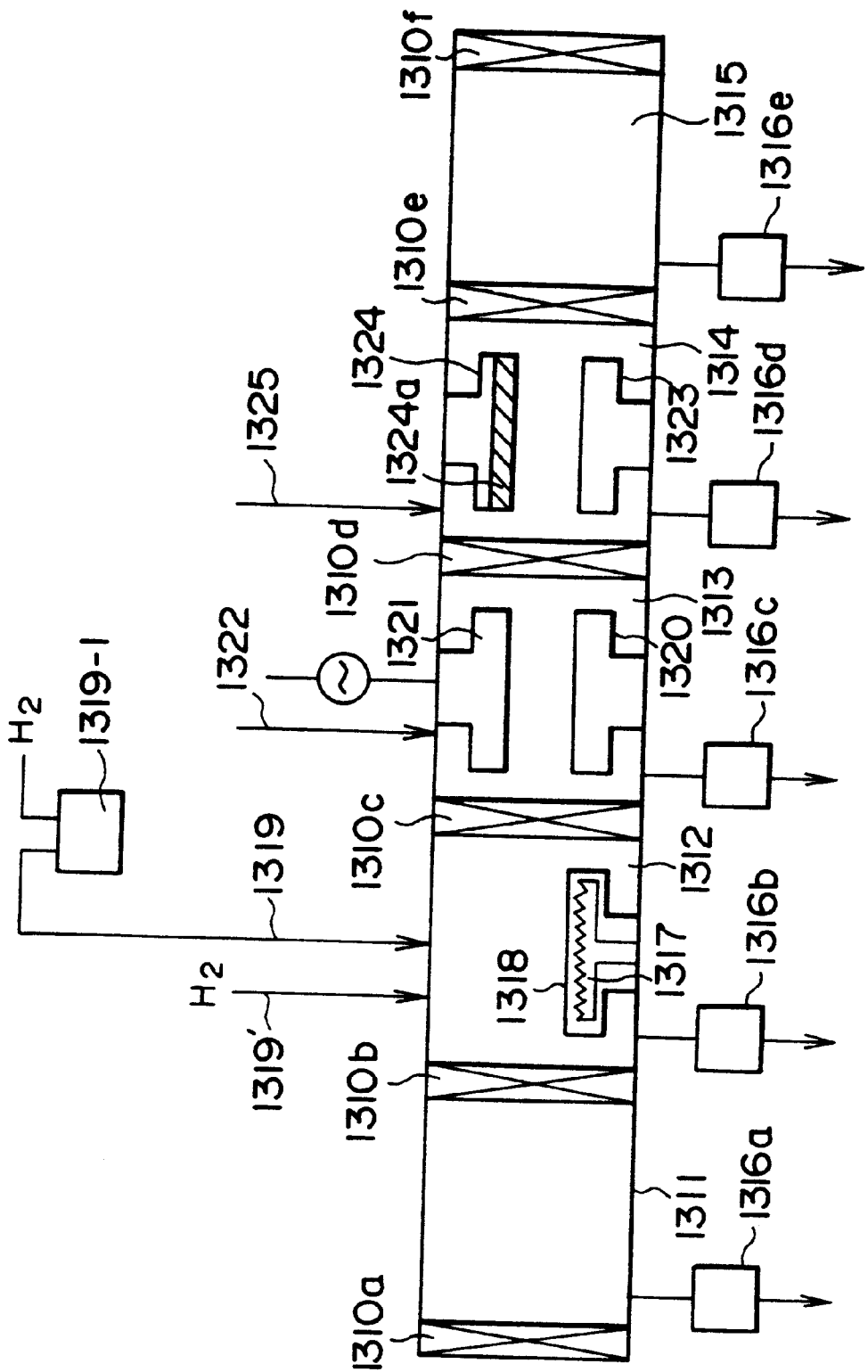
FIG. 28 illustrates an example of an apparatus for forming an aluminum film.

FIG. 28 is a schematic view which illustrates an apparatus for continuously forming a metal film comprising a CVD apparatus to which the foregoing film forming method can be adapted.

As shown in FIG. 28, the apparatus for continuously forming the metal film comprises load locking chambers 1311, a CVD reaction chamber 1312 serving as a first film-forming chamber, an RF etching chamber 1313, a sputtering chamber 1314 serving as a second film-forming chamber, and a load locking chamber 1315, the foregoing chambers being so connected by gate valves 1310a to 1310f that they are communicated with one another in a state where the outer air is insulated. The chambers are so constituted that gas in each chamber can be exhausted by corresponding exhaust systems 1316a to 1316e and, accordingly, the pressure can be lowered.

The load locking chamber 1311 acts to replace the ambience of the base before the deposition process is performed for an $H_2$ ambience.

The CVD reaction chamber 1312 is a chamber in which the surface of the base is subjected to the selective deposition by the Al-CVD method at atmospheric pressure or a lowered pressure. The CVD reaction chamber 1312 includes a base holder 1318 having a heat-generating resistor 1317 capable of heating the surface of the base, on which the fill will be formed, in a temperature range from 200° C. to 450° C. Further, the CVD reactive chamber 1312 is arranged to receive raw material gas, such as alkyl aluminum hydride, introduced through a line 1319 for introducing the raw material gas for CVD and bubbled and vapored by a bubbler 2319-1 and to also receive hydrogen gas serving as reactive gas introduced through a gas line 1319'.

The next RF etching chamber 1313 is a chamber for cleaning (etching) the surface of the base subjected to the selective deposition, the cleaning process being performed in an Ar atmosphere. The RF etching chamber 1313 includes a base holder 1320 and an RF etching electrode line 2321 and an Ar gas supply line 1322 connected thereto, the base holder 1320 being capable of heating the base at least a temperature range from 100° C. to 250° C.

The sputtering chamber 1314 is a chamber for nonselectively depositing the metal film on the surface of the base by sputtering in an Ar atmosphere. The sputtering chamber 1314 includes a base holder 1323 to be heated at least a temperature range from 200° C. to 250° C. and a target electrode 1324 to which a sputtering target material 1324a. Further, an Ar gas supply line 1325 is connected to the sputtering chamber 1314. The load locking chamber 1315 is an adjustment chamber for replacing the atmosphere into $N_2$ prior to ejecting the base, on which the metal film has been deposited, to the outer air.

After the side wall 1009 has been formed, the $n^+$ region 1006 for the source and the drain are formed by ion injection (in the case of a PMOS, boron ions or ions of a boron compound are injected so that a $p^+$ region is formed (see FIG. 27F)).

Figure 27G:
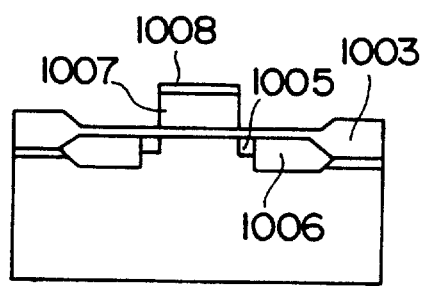

Then, acid cleaning, for example, dipping into a solution of sulfuric acid:hydrogen peroxide=4:1, the temperature of which is 120° C. for 10 minutes is performed so that only the aluminum side wall 2009 is selectively removed (see FIG. 27G).

Figure 27H:
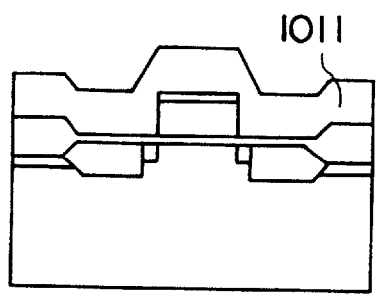

The ensuing process is the same as that of the conventional method so that annealing is performed and a CVD acid film 1011 is formed (see FIG. 27H).

The process for forming the $n^-$ region 1005 and the process for forming the $n^+$ region 1006 shown in FIGS. 27A to 27H may be changed. That is, the gate electrode 1007 and the heat oxide film 1008 are patterned, and then the aluminum side wall 1009 is formed so that the $n^+$ region 1006 is formed. After the side wall 1009 has been removed by cleaning with acid, the $n^-$ region 1005 is formed.

The acid cleaning may be performed by using a solution of hydrochloric acid and hydrogen peroxide in place of the solution of sulfuric acid and hydrogen peroxide.

Although the aluminum layer is enlarged at a lowered pressure in Embodiment B1, it may be enlarged at the atmospheric pressure.

Although the gate electrode according to Embodiment B1 is made of polycrystal silicon containing phosphorus, polycrystal silicon containing arsenic or boron may be used (the concentrations of phosphorus, arsenic and boron may be changed).

The gate electrode may be made of silicide (such as $P+Si_2$, $WSi_2$, $MoSi_2$ or the like).

The gate electrode may be made metal having a high melting point such as W, Mo, Ti or Ta or the like.

In embodiment B1, aluminum may be formed on the entire surface of the gate electrode after the heat oxide film on the gate electrode has been removed.

Embodiment C1

FIGS. 29A to 29E are schematic cross sectional views which illustrate a manufacturing process according to an embodiment of the present invention, wherein impurities are introduced selectively so that an aluminum thin film is formed in only a region of the surface of an Si base, the aluminum thin film having a width of 0.2 $\mu$m.

First, an organic resist film 1520 is applied to the surface of an Si base 1502 as shown in FIG. 29A, and a mask having a size of 0.2 $\mu$m is used to pattern the organic resist film so that 1521 shown in FIG. 29B is obtained. The foregoing result of the width of about 0.2 $\mu$m can be realized by an exposure technology employed in the conventional lithography process.

Then, the patterned organic resist film is used as a mask to introduce fluorine (F) as shown in FIG. 29B. The introduction can be performed easiest if the ion injection method is employed. In this case, the amount of injection is about $1 \times 10^{10}$ to $10^{20}$ atom/cm$^2$, preferably $1 \times 10^{14}$ to $1 \times 10^{16}$ atom/cm$^2$. At this time, energy of about 1 to 100 keV is used and the thickness of the organic resist film is about 0.1 μm to 2.0 μm. The foregoing thickness is a sufficient thickness to serve as a mask acting at the time of injecting fluorine. If fluorine is introduced by the ion injection method, a buffer film for buffering impact may be disposed thereby preventing occurrence of a problem.

After the process shown in FIG. 29B has been performed, the organic resist film is removed, the surface of the Si base 1501 is subjected to chemical treatment or the like as shown in FIG. 29C so that the surface of the Si layer is terminated with hydrogen in the form of a single atom layer. The chemical treatment is arranged such that immersion into an elute fluorine (HF/H$_2$O=1/100) solution is performed and rinsing with super pure water for 10 minutes is carried out for example. As a result of the chemical treatment, the region, into which fluorine ions have been injected, is not terminated with hydrogen but terminated with fluorine. Therefore, the subject region is divided into a region terminated with hydrogen and a region terminated with fluorine.

A portion of the region terminated with fluorine depends upon the injected energy. There are a region depending upon the mass number injected, a region depending upon the chemical treatment conditions, and a region depending upon the thickness of the buffer film.

Figure 31:
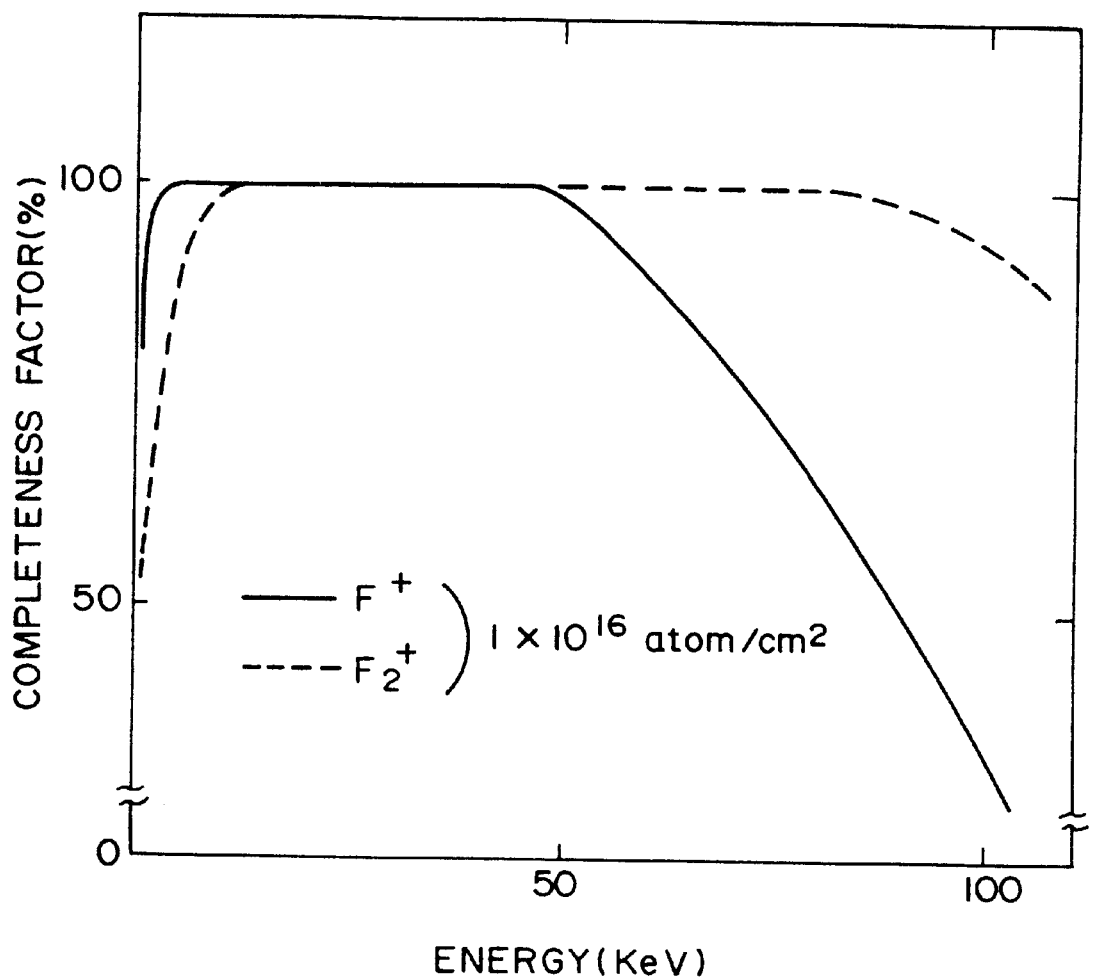
FIG. 31 is a graph which illustrates the completeness of termination of an injected region with fluorine as dependency upon injected energy in a case where fluorine is introduced into a Si base by an ion injection method.
Figure 32:
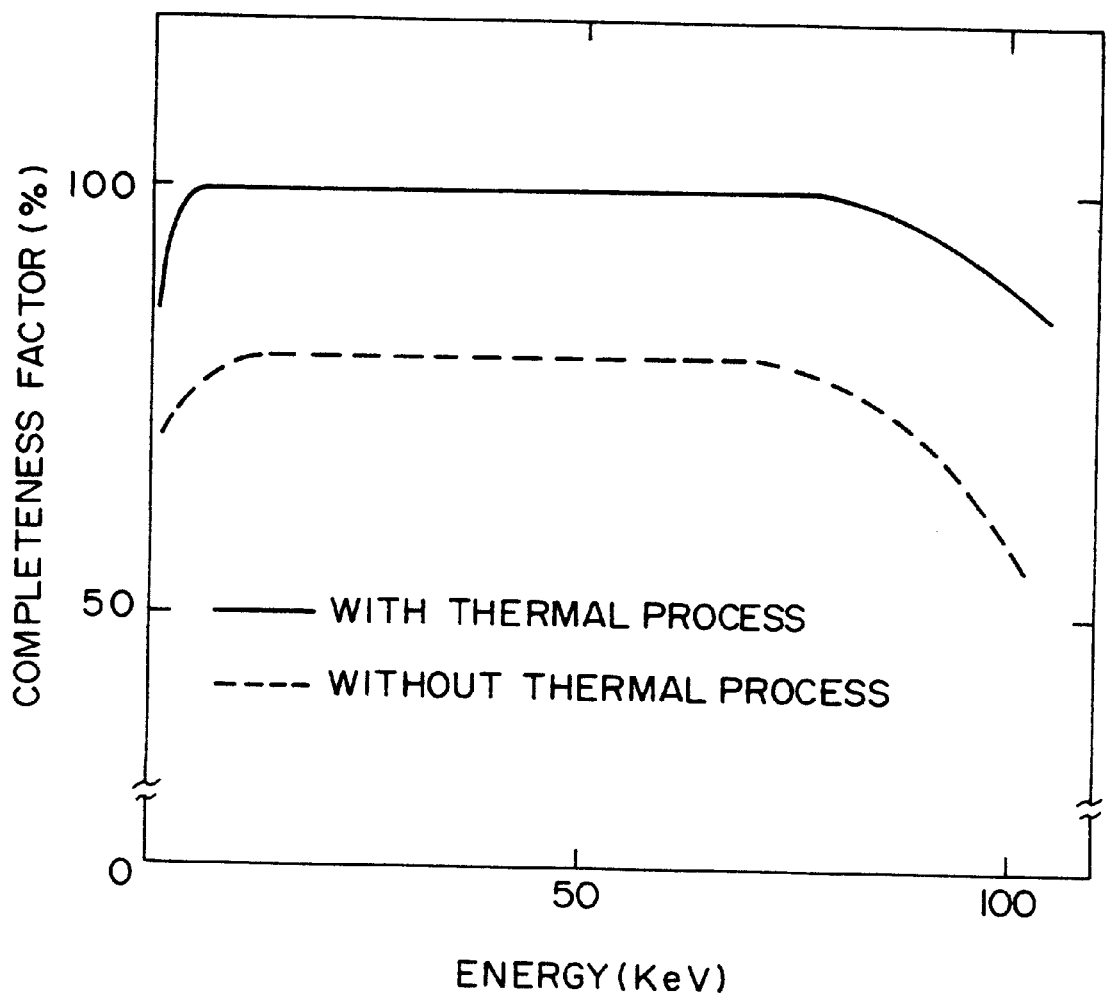
FIG. 32 is a graph which illustrates the difference in the completeness of termination of an injected region with oxygen occurring due to a fact whether or not heat treatment is performed after the injection in a case where oxygen is introduced into the Si base by the ion injection method.

FIG. 31 is a graph showing the completeness factor of a region terminated with fluorine due to the injected energy in a case where the chemical treatment is arranged such that immersion into an elute fluorine (HF/H$_2$O=1/100) solution is performed and rinsing with super pure water for 10 minutes is carried out while omitting the buffer film.

Then, in the processes shown in FIGS. 29D and 29E, the thin Al film is deposited in only a region of the surface of the Si base terminated with hydrogen.

A preferred means for depositing aluminum is a chemical vapor enlargement method exemplified by the following disclosures (1), (2), (3), (4) and (5).
Japanese Patent Application Laid-Open No. 1-233926 (1)
Japanese Patent Application Laid-Open No. 1-233924 (2)
Japanese Patent Application Laid-Open No. 1-233927 (3)
Japanese Patent Application Laid-Open No. 1-233925 (4)
Japanese Patent Application Laid-Open No. 2-405190 (5)

As the raw material gas, dimethyl aluminum hydride (CH$_3$)$_2$ AlH (hereinafter called "DMAH"), which is one of organic metal materials, and hydrogen (H$_2$) are used, use of the film forming conditions according to the foregoing disclosure (1), (2), (3), (4) and (5), in particular, use of the film forming conditions according to the disclosure (5) and arranged such that the base temperature is about 200° C. to 350° C. and the total pressure is about 0.1 to 5 Torr enables single crystal aluminum to be deposited on only the surface that is terminated with hydrogen.

Principle of Selectiveness

The reason why aluminum is deposited on only the surface of the semiconductor terminated with hydrogen and aluminum is not deposited on the semiconductor terminated with oxygen or on the insulating film is considered as follows.

As disclosed by Tsubouchi in disclosure (5), the aluminum deposition reaction on the Si substrate in the CVD method using DMAH and H$_2$ is realized by the following factors: (1) Catalyst-like contribution of free electrons present in the surface to the surface reaction; (2) Terminative hydrogen on the surface of the Si layer; and (3) Generation of methane (CH$_4$) due to selective reactions between the surface terminative hydrogen and CH$_3$ group (methyl group) in DMAH molecule. On the surface which is terminated with hydrogen and in which the foregoing three factors are met, aluminum is deposited. After aluminum has been deposited, hydrogen in DMAH is also left as terminative hydrogen, and free electrons are present in aluminum. Therefore, the deposition takes place naturally.

Since no hydrogen terminating the surface is present in the region which is not terminated with hydrogen, no aluminum deposition reaction takes place.

FIGS. 29D and 29E illustrate the foregoing reactions.

Embodiment C2

Another embodiment of the present invention will now be described with reference to FIGS. 29A to 29E and 30A to 33C.

In this embodiment, oxygen (O$_2$) is introduced into the surface of an Si base so that aluminum is selectively deposited on the surface of the Si base.

Figure 30A:
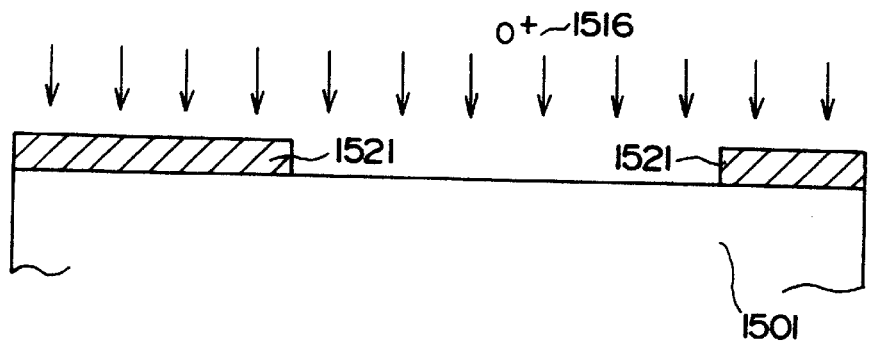
FIGS. 30A to 30C are schematic cross sectional views which illustrate a process of the thin film forming method according to another embodiment of the present invention.

First, an organic resist film 1520 is applied to the surface of an Si base similarly to Embodiment C1 shown in FIG. 29A, and it is patterned so that a resist 1521 is obtained as shown in FIG. 30A.

Then, an organic resist film 1521 shown in FIG. 30A is used as a mask to introduce O$_2$ (oxygen). Although the foregoing introduction can be performed by an ion injection method or a selective oxidation method, the ion injection method enables the most preferably control to be performed among the conventional technologies. In this case, it is preferable that ions are injected by about $1\times10^{10}$ to $1\times10^{20}$ atom/cm$^2$, preferable $1\times10^{16}$ to $1\times10^{19}$ atom/cm$^2$.

Figure 30B:
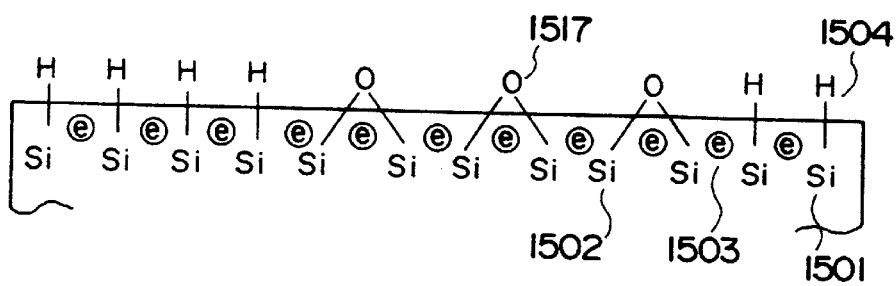

Then, the organic resist film 1521 is removed similarly to Embodiment C1, and chemical treatment is so performed that the surface of the Si base 1501 is terminated with hydrogen in the form of a single atom layer. As a result, a state shown in FIG. 30B is realized. It is preferable that heat treatment be performed prior to performing the chemical treatment for terminating the surface of the Si base with hydrogen in the form of a single atom layer. The fact whether or not the foregoing heat treatment is performed causes the completeness of the region terminated with hydrogen and the region terminated with fluorine after the chemical treatment has been performed to be different from each other.

Figure 30C:
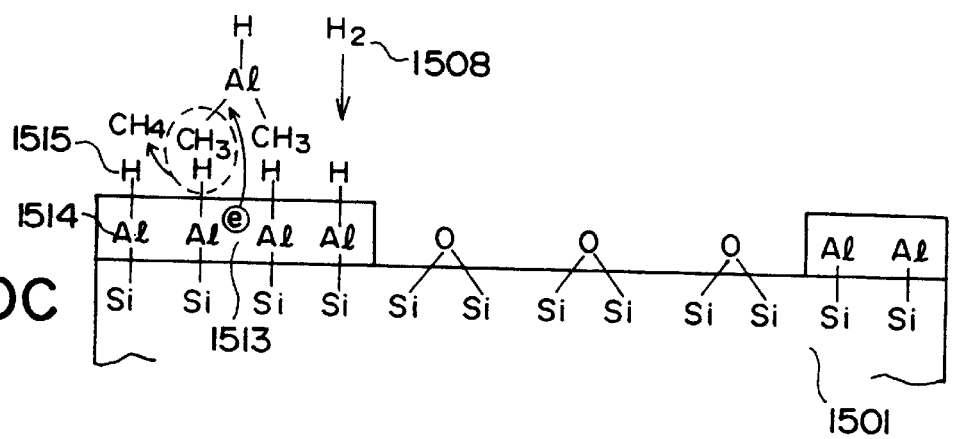

Then, an aluminum thin film 1514 is, similarly to Embodiment C1, deposited in only a portion of the surface of the Si base 1501 terminated with hydrogen (see FIG. 30C).

Embodiment C3

A process flow expressed by cross sectional views and according to another embodiment of the present invention is shown in FIGS. 33A to 33H. Referring to FIGS. 33A to 33H, reference numeral 1801 represents a semiconductor base, 1802 represents an insulating film, 1803 represents a groove which is opened in the insulating film 1802 and in which a metal circuit line is embedded, 1804 represents a metal circuit line embedded in the opening portion 1803, 1805 represents a mask made of resist or the like, 1806 represents a Si region on the insulating film into which ions have been injected, 2807 represents a terminated region of the interface with the Si region 1806 with hydrogen, 1808 represents a region formed by further supplying electrons to the region 2807 terminated with hydrogen and 1909 represents a circuit line selectively enlarged on the metal circuit line 2804 and the region 1808.

Then, a process flow shown in FIG. 33 will now be described.

Figure 33A:
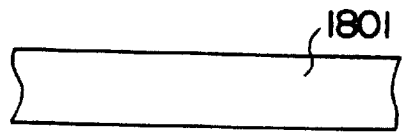
FIGS. 33A to 33H are schematic cross sectional views which illustrate a process for manufacturing a base according to another embodiment of the present invention.
Figure 33B:
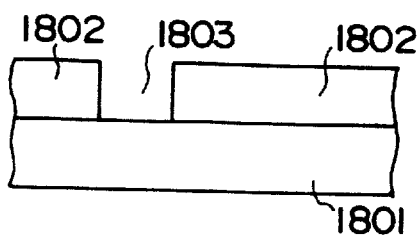
Figure 33C:
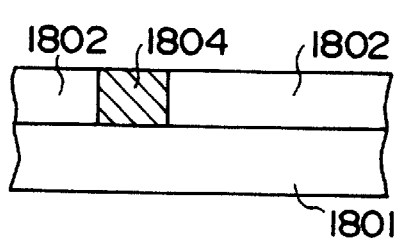
Figure 33D:
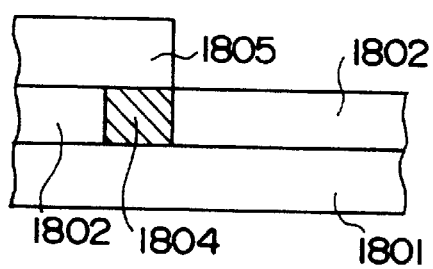

First, the insulating film 1802 is deposited on the semiconductor base 1802, and then a photolithography process is performed so that the groove 1803, in which the metal circuit line is embedded, is formed (see FIGS. 33A and 33B). The insulating film 1802 for use at this time is an NSG, PSG or BPSG film or their mixture formed by a CVD method and having a thickness of 2000 Å to 10000 Å. After the deposition has been completed, heat treatment is performed at high temperature 900° C. to 1100° C. in a $N_2$ atmosphere. Then a dry etching method or the like is employed in the photolithography process so that the groove 1803, in which the metal circuit line is embedded, is formed, the groove 1803 having an aspect ratio of 0.5 to 2.

Then, the metal circuit line 1804 is embedded in the groove 1803 for the metal circuit line opened as shown in FIG. 33B. The metal circuit line 1804 can be embedded by a selective Al CVD method. As metal to be selectively enlarged, Al, Al-Si, Al-Si-Cu or Al-Cu is used. The employed metal may be enlarged together with metal such as Ti, TiW, W, Mo or Ta (see FIG. 33C).

After the metal circuit line 1804 has been embedded in the foregoing opening portion 1803, a photolithography process is performed so as to pattern a region in which the circuit will be formed. In this embodiment, the portions except the foregoing region, in which the circuit is formed, is covered with the resist 1805 (see FIG. 33D).

By using the resist 1805 as a mask, Si atoms are introduced into the surface of the insulating film 1802 in which the circuit will be formed so that the surface layer of the insulating layer 1802 is reformed into the Si layer 1806. The Si atoms are introduced by an ion injection method under conditions that the acceleration energy is 1 keV to 80 keV, the amount of injection is $1 \times 10^{11}$ to $1 \times 10^{15}$ ions/cm$^2$, the conditions being determined depending upon the width of the metal line and the like (see FIG. 33E).

Then, a photolithography process is again performed so that the resist 1805 is removed.

Figure 33E:
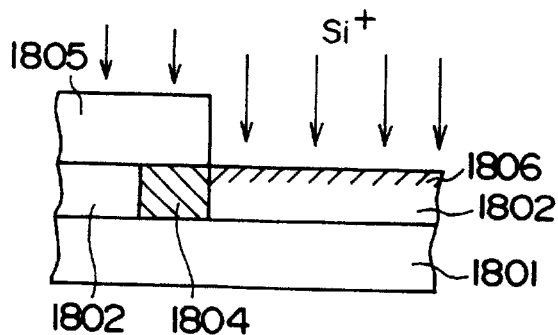
Figure 33F:
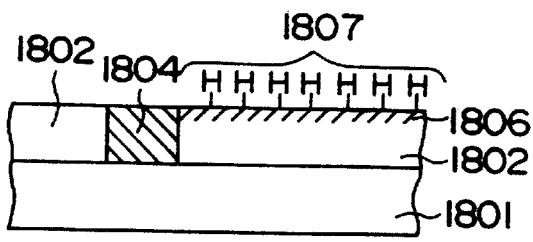

Then, the layer 1807 terminated with hydrogen is formed on the Si layer on the interface of the layer 2806 into which Si atoms have been introduced. The hydrogen termination is performed by performing heat treatment at 350° C. to 450° C. in a hydrogen atmosphere for 10 to 60 minutes or by a method in which the resist 1805 shown in FIG. 33E is removed, and cleaning with elute hydrofluoric acid is performed to hydrogen-terminate the interface of the layer 2806 into which Si atoms have been introduced (see FIG. 33F).

Then, the entire surface of the insulating film 1802 including the region 1807 terminated with hydrogen is irradiated with electron beams so that an electron-donative region 808 is formed on the region 1807 terminated with hydrogen.

Figure 33G:
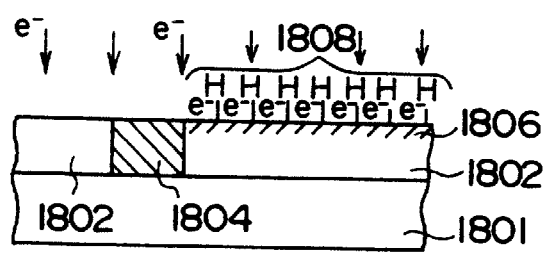

The electron beam irradiation must be performed with weak energy to prevent dissociation of hydrogen on the region 1807 terminated with hydrogen (see FIG. 33G).

Figure 33H:
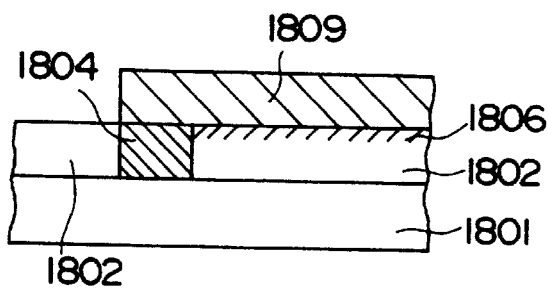

After the regions have been formed, the metal line 1809 is selectively enlarged (see FIG. 33H). The metal line 2809 can be selectively enlarged by a selective Al-CVD method.

If alkyl aluminum hydride containing a methyl group, such as monomethyl aluminum hydride (MMAH) or dimethyl aluminum hydride (DMAH), is used as the raw material gas of the foregoing selective Al-CVD method and $H_2$ gas is used as the reaction gas and the surface of the base is heated in the foregoing mixture gas, an excellent aluminum film can be formed.

It is preferable that the aluminum is selectively enlarged such that the temperature of the surface of the base is maintained at a level lower than 450° C. which is higher than the temperature at which the alkyl aluminum hydride is decomposed by direct or indirect heating, more preferably the temperature is 260° C. or lower to 350° C. or lower.

By employing the selective Al-CVD method, metal circuit line such as Al, Al-Si, Al-Si-Cu, Al-Cu, Al-Ti or Al-Si-Ti is selectively enlarged.

Effect A

The capacitor of the memory cell thus-manufactured has a small area equivalent to or smaller than the contact region of the drain on the surface of the device. Therefore, the memory cell is suitable to raise the degree of integration and comprises an oxide film which includes the side surface of the aluminum single crystal and which has a sufficiently large overall area. Further, the thickness of the oxide film is thin and precise, and the dielectric constant of $Al_2O_3$ is about 2.5 times that of $SiO_2$. Therefore, a capacitor having a large capacity can be constituted.

Effect B

According to this embodiment, use of the aluminum selective enlargement will enable the side wall (a spacer) of the LDD transistor to be formed by only one process. Therefore, the etching back process required in the conventional method can be omitted.

Further, employment of the aluminum selective CVD method enables the shape of the side wall (the spacer) to controlled easily.

By removing the aluminum spacer after the ions have been injected into the high density region of the source and the drain, a high-temperature process (950° C. to 1000° C.) can be performed in the ensuing process. That is, knock-on phenomenon (1 to $10 \times 10^{12}$ atom/cm$^2$) of the aluminum occurring due to the ion injection takes place not to affect the characteristics of the MOS transistor.

Effect C

As described above, the thin-film forming method according to this embodiment is arranged such that impurities are selectively introduced into the surface of the base, the surface of the base is subject to surface treatment to supply hydrogen atoms, a region supplied with hydrogen and terminated with hydrogen and a region, which is not terminated with hydrogen, are formed on the surface of the base, and the thin film is selectively formed on the region terminated with hydrogen. As a result, a metal thin film or a semiconductor thin film having a small width, for example, about 0.2 μm can be deposited.

The surface treatment can easily be performed if hydrofluoric acid is used.

If fluorine is used as the impurity, the region terminated with hydrogen and the region terminated with fluorine can easily be divided at the time of performing the surface treatment.

As described above, since the groove for the line is formed and the metal is embedded, the circuit metal can efficiently be embedded into a circuit groove having a large aspect ratio. Further, since Si atoms are precisely injected into a portion on the insulating film to be formed into the region, in which the metal circuit line will be formed, and the foregoing region is terminated with hydrogen to be supplied with electrons. Therefore, the selective and precise formation of the metal circuit line can be performed. Further, the width of the metal circuit line and the interval between the metal circuit lines can be precisely controlled.

Embodiment D1

Figure 34:
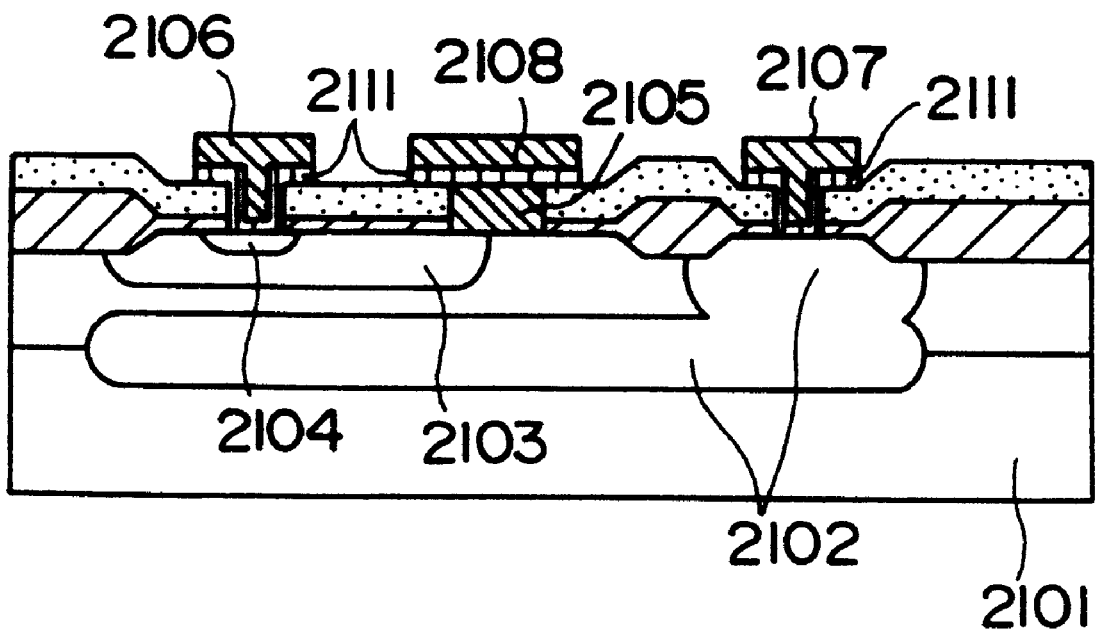
FIG. 34 is a cross sectional view which illustrates a preferred embodiment of the present invention.

FIG. 34 is a schematic cross sectional view which illustrates a preferred embodiment of the present invention.

Referring to FIG. 34, reference numeral 2101 represents a semiconductor base made of silicon or the like, 2102 represents a diffusion layer and an embedded layer serving as a collector region and having a conductive type opposing that of the base, 2103 represents a diffusion layer serving as a base region and having the same conductive type as that of the base, 2104 represents a diffusion layer serving as an emitter region and having the same conductive type as that of the base, 2105 represents a metal selective local deposition layer having a shot key characteristic with the semiconductor substrate, 2106 represents an emitter electrode made of aluminum or the like, 2107 represents a collector electrode also made of aluminum or the same, 2111 represents a barrier metal, and 2108 represents a base electrode.

As described above, the semiconductor apparatus according to this embodiment comprises the metal layer in the contact hole in the shot key diode portion is formed into layers, the number of which is larger by one than that of the metal layers in the contact hole in the collector. That is, the emitter electrode is formed by two metal layers composed of the Al layer 2106 and the barrier metal 2111. On the other hand, the Schottky diode portion is formed into three layers consisting of the Al layer 2108, the barrier metal 2111 and the Al layer 2105.

As a result, in the contact hole in the Schottky diode portion, the contact metal layer which is in contact with the semiconductor layer is formed into the Al layer 2105 having the Schottky characteristics. On the other hand, in the contact hole portion except for the Schottky diode, that is, in the contact holes in the emitter and the collector, the contact metal layer which is in contact with the semiconductor layer is formed into the barrier metal 2111. As described above, this embodiment is able to maintain excellent bipolar transistor characteristics thanks to the barrier metal 2111 and as well as to maintain excellent Schottky characteristics due to the deposition of the Al layer 2105.

Then, an example of the manufacturing method according to this embodiment will now be described with reference to FIGS. 35A to 35D which schematically illustrate the manufacturing process.

Figure 35A:
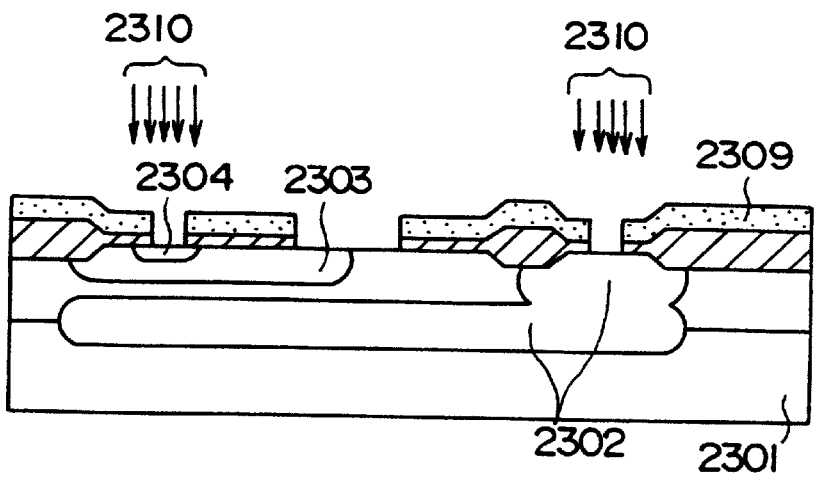
FIGS. 35A to 35D are cross sectional views which illustrate a manufacturing process according to an embodiment of the present invention.

First, the known semiconductor technology is employed to form a collector diffusion region 2302, a base diffusion region 2303 and an emitter diffusion region 2304 in the semiconductor base 2301 as shown in FIG. 35A.

Then, an atmospheric-pressure CVD method is employed to deposit an insulating film 2309 made of silicon dioxide, and all of contact holes, in which the electrodes will be formed, are formed.

Then, the overall body of the substrate is immersed in an eluted hydrofluoric acid (HF/H$_2$O=1/100) solution so that the entire exposed surface of the portion of the semiconductor in the contact opening portion can be terminated with hydrogen in the form of a single atom layer. Even if the substrate is rinsed with pure water for 10 minutes, the surface terminated with hydrogen can be maintained.

Then, only the contact holes in the emitter 2304 and the collector 2302 are irradiated with energy beams 2310 such as electron beams, ion beams or ultraviolet rays (see FIG. 35A).

If electron beams or ion beams having energy larger than energy (3.08 eV) for bonding Si-H is applied, the Si-H bond is dissociated so that hydrogen atoms are desorbed from the exposed surfaces of the emitter 2304 and the collector 2302, causing non-bonded hand of Si atoms to appear on the surface of the contact holes. If the substrate 2301 in the foregoing state is exposed to atmosphere, the portions of the contact holes in the emitter 2304 and the collector 2302 in which the semiconductor appears, are oxidized so that the portions are terminated with oxygen atoms. The process for terminating the surface with oxygen can be performed by exposing the substrate to oxygen or ozone in place of exposing to atmosphere.

The surface reforming for dissociating hydrogen termination can be performed under the following conditions:

The surface reformation using electron beams was performed under the following conditions: the acceleration voltage was 25 kV, the beam current was 500 pA and the beam quantity was 1.5×10$^{16}$ (electrons/cm$^2$).

The surface reformation using ion beams was performed under the following conditions: O$_2^+$ was used as ion source, the acceleration voltage was 3 kV, and the beam quantity was 2×10$^{13}$ (ions/cm$^2$).

Since the surface reformation using ultraviolet rays can be performed if the wavelength is 4000 Å or shorter, a marketed i-beam stepper was used. In this case the range in the region can be specified by using an ordinary Cr mask. The foregoing method exhibits excellent processing performance.

Figure 35B:
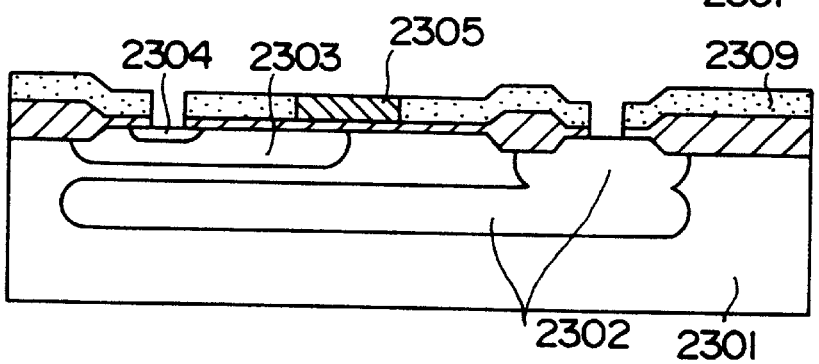
Figure 35C:
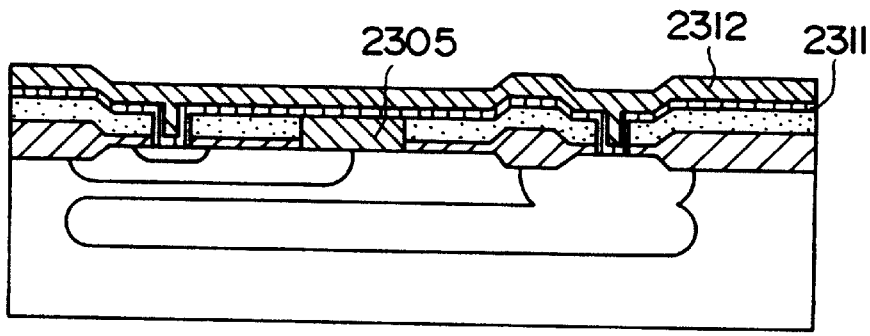
Figure 35D:
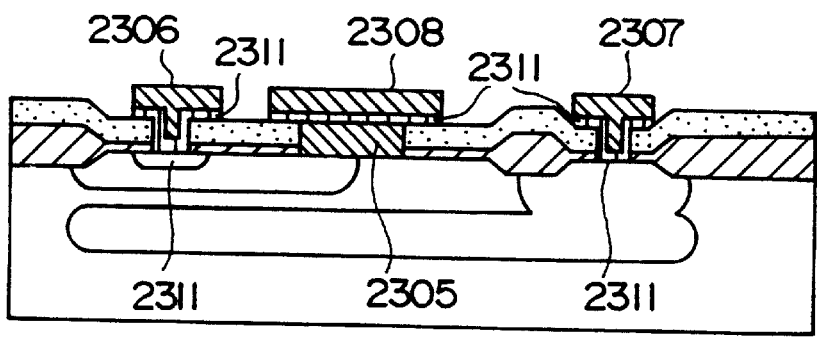

Contact holes terminated with hydrogen and contact holes terminated with oxygen are formed in the exposed surface of the semiconductor, and then aluminum 2305 is deposited in only the portion terminated with hydrogen, that is, the base and the Schottky diode portion (see FIG. 35B).

As the deposition method, an aluminum CVD method is employed in this embodiment. The foregoing method has been disclosed in the following reference documents:

REFERENCE DOCUMENTS

Japanese Patent Application No. 1-233926 (1)
Japanese Patent Application No. 1-233924 (2)
Japanese Patent Application No. 1-233927 (3)
Japanese Patent Application No. 1-233925 (4)
Japanese Patent Application No. 2-405190 (5)

If dimethyl aluminum hydride (CH$_3$)$_2$ AlH (hereinafter called "DMAH"), which is one of organic metal materials, and hydrogen (H$_2$) are used as the raw material gas, use of the film forming conditions according to the foregoing disclosure (1), (2), (3), (4) and (5), in particular, use of the film forming conditions according to the disclosure (5) and arranged such that the base temperature is about 200° C. to 350° C. and the total pressure is about 0.1 to 5 Torr enables single crystal aluminum to be-deposited on only the surface that is terminated with hydrogen.

The aluminum was deposited according to this embodiment under conditions that the substrate temperature was 270° C., the deposition pressure was 1.2 Torr and the flow of hydrogen was 50 SCCM.

The reason why aluminum is deposited on only the surface of the semiconductor terminated with hydrogen and aluminum is not deposited on the semiconductor terminated with oxygen or on the insulating film is considered as follows.

As disclosed by Tsubouchi in disclosure (5), the aluminum deposition reaction on the Si substrate in the CVD method using DMAH and H$_2$ is realized by the following factors: (1) Catalyst-like contribution of free electrons present in the surface to the surface reaction; (2) Terminative hydrogen on the surface of the Si layer; and (3) Generation of methane ($CH_4$) due to selective reactions between the surface terminative hydrogen and $CH_3$ group (methyl group) in DMAH molecule. On the surface which is terminated with hydrogen and in which the foregoing three factors are met, aluminum is deposited. After aluminum has been deposited, hydrogen in DMAH is also left as terminative hydrogen, and free electrons are present in aluminum. Therefore, the deposition takes place naturally.

Since no hydrogen terminating the surface is present in the region which is not terminated with hydrogen, no aluminum deposition reaction takes place.

After aluminum has been deposited in the Schottky diode portion 2305, a reactive sputtering method, which is a known technology, is employed so that titanium nitride 2311 is deposited as the barrier metal. Then, aluminum 2312 is continuously deposited by a sputtering method. The foregoing two layers are not selectively deposited but the deposition is performed to their entire surfaces (see FIG. 35C).

The titanium nitride is deposited under conditions that the temperature of the substrate is 200° C., the flow of $N_2$ is 80 SCCM and the flow of Ar is 20 SCCM. The aluminum is sputtered under conditions that the temperature of the substrate is 200° C. and the flow of Ar is 50 SCCM.

Finally, a photolithography process is performed so that the emitter electrode 2306, the collector electrode 2307, the base and the Schottky diode electrode 2308 were formed. Thus, a shot key TTL is formed (see FIG. 35D).

Embodiment D2

Figure 36A:
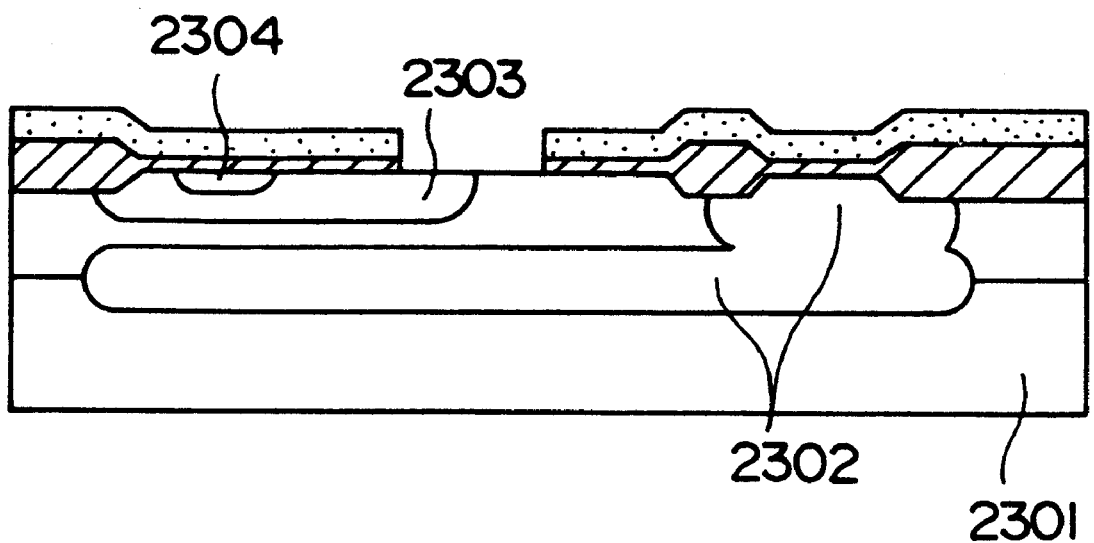
FIGS. 36A and 36B are cross sectional views which illustrate a manufacturing process according to another embodiment of the present invention.

Although the foregoing embodiment has the arrangement that the contact holes are collectively formed in the emitter 2304, the base 2303 and the collector 2302, another method shown in FIG. 36 may be employed.

Figure 36B:
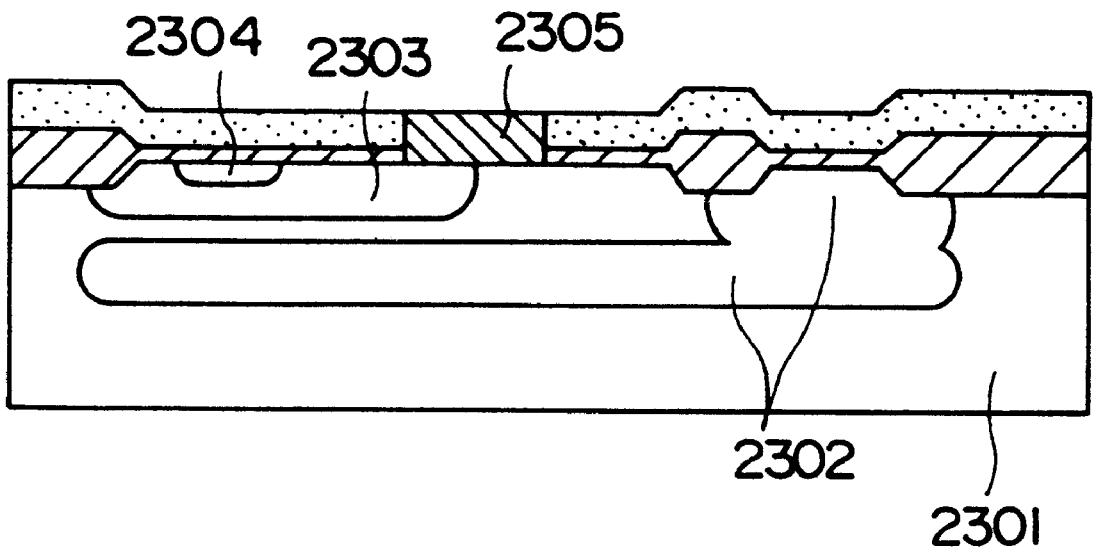

First, only the contact holes are formed in the base and the shot key diode portions (see FIG. 36A), and then aluminum 2305 is deposited in only the opening portion by an aluminum CVD method (see FIG. 36B). Since only the surface of the semiconductor in the Schottky diode portion is exposed, a special energy beam irradiation can be omitted but the aluminum may be simply deposited.

Then, the contact holes are formed in the emitter 2304 and the collector 2302 so that a state shown in FIG. 35B is realized. Then, similar processes are performed so that the Schottky TTL can be manufactured.

Although one more masking process must be performed in this embodiment, superior reliability can be obtained. Further, a semiconductor apparatus similarly exhibiting stable shot key characteristics and the bipolar transistor characteristics can be obtained.

Embodiment E1

Figure 37A:
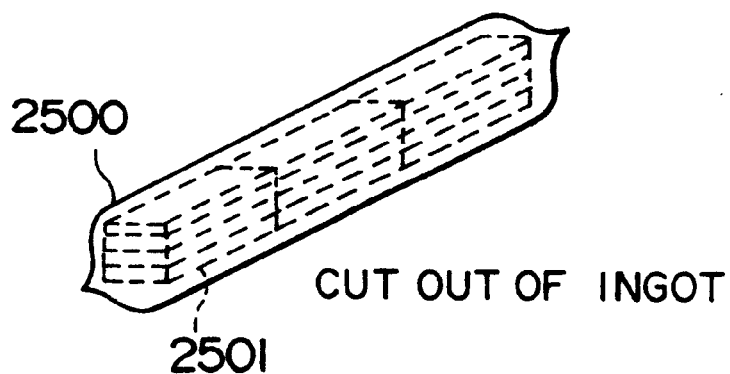
FIGS. 37A and 37B are perspective views which illustrate a state where substrates are cut out from a silicon ingot according to a preferred embodiment of the present invention.
Figure 37B:
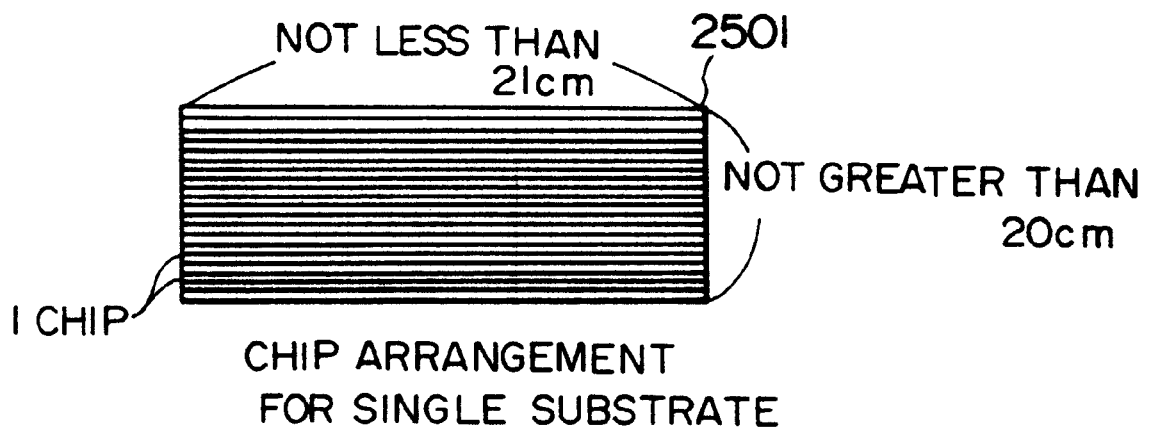
Figure 38:
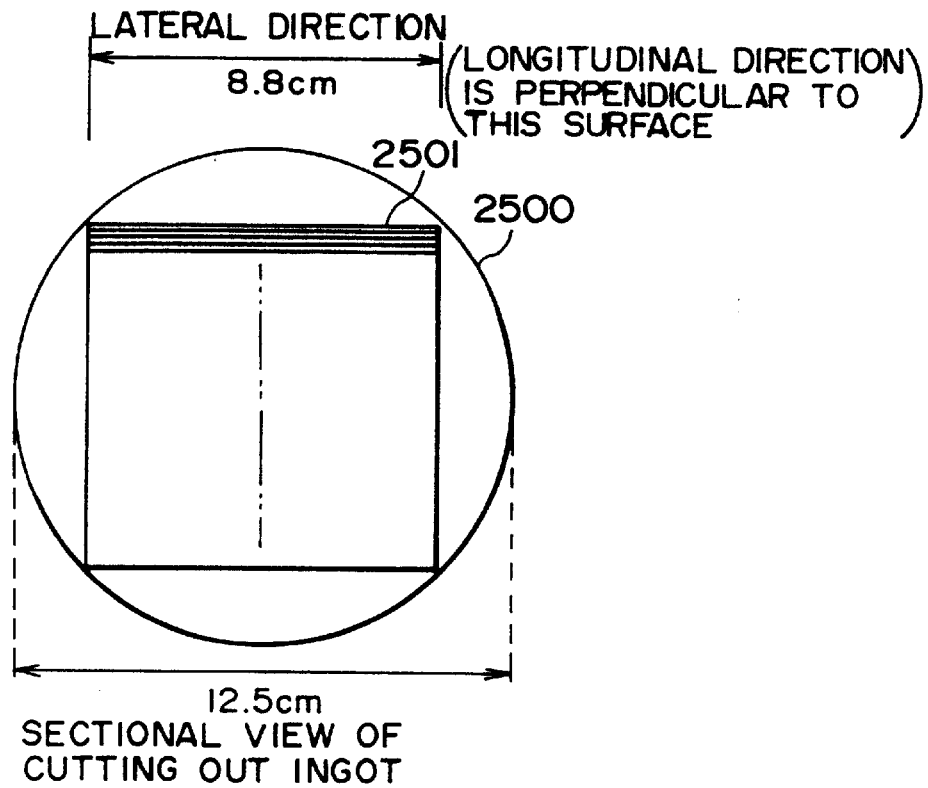
FIG. 38 illustrates a state where substrates are cut out from the cross section of the ingot.

FIGS. 37A and 37B are schematic views which illustrate a preferred embodiment of the present invention. FIG. 37A is a schematic view which illustrates a state where substrates 2501 are cut out from a cylindrical silicon ingot 2500. FIG. 37B illustrates the configuration of chips with respect to the cut out substrate 2501. The operation for cutting out the substrates 2501 from the ingot 2500 is similar to the operation for cutting out plates from a log.

Then, an embodiment in which the substrates 2501 in the size 22 cm×8.8 cm are cut out from a 5-inch wafer ingot 2500 will now be described with reference to the drawings.

First, the substrates 2501 are cut out from the single-crystal ingot 2500 in such a manner that the longitudinal length is made to be 22 cm to be adaptable to an A4 paper sheet. Although the short-size length may be determined if it is 12.5 cm or shorter, the shorter side of the substrate 2501 is made to be 8.8 cm in terms of preventing waste.

Although the thickness of the substrate 2501 is set to about 1 mm, the thickness may be thinner than 1 mm if desired mechanical strength can be obtained in the thermal process.

Grinding is performed by using a circular wafer having a diameter of 20 cm while modifying it by a minor degree and grinding its surface to have a mirror surface.

By using the foregoing substrate, a bipolar photosensor, the principle of which has been disclosed in Japanese Patent Appln. Laid-Open No. 60-12763 and a thermal jet ink array the principle of which has been disclosed in Japanese Patent Appln. Laid-Open No. 57-72867 were formed, each of which being provided with a MOS drive circuit. The photosensor array can be completely manufactured by only the known silicon semiconductor technology.

Figure 39:
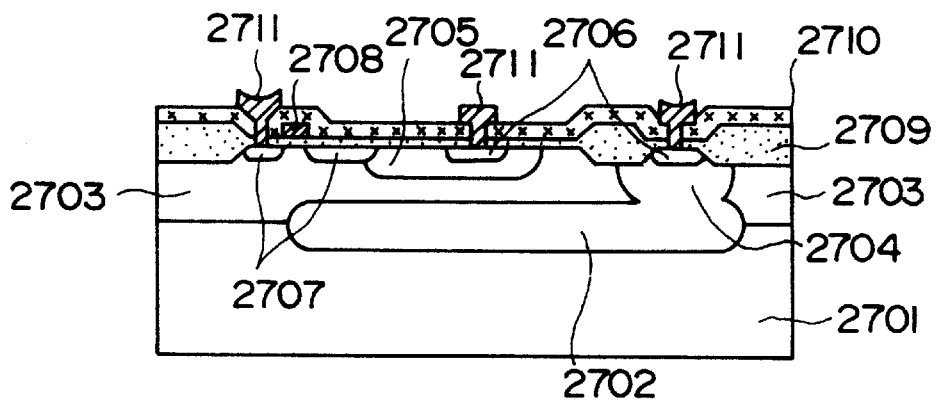
FIG. 39 is a shorter-side-directional cross sectional structural view which illustrates a photosensor unit according to an embodiment of the present invention.

The structural cross section of the unit photosensor cell formed in this embodiment when viewed from its shorter side is shown in FIG. 39. Referring to FIG. 39, reference numeral 2701 represents a P-type silicon substrate, 2702 represents an n-type embedded layer, 2703 represents an n-type epitaxial layer, 2704 represents an n-type deep diffusion layer, 2705 represents a P-type diffusion layer which is a base region, 2706 represents a shallow n-type diffusion layer which forms the emitter region and the collector contact region, 2707 represents a P-type shallow diffusion layer which forms the drain-source region of the P-type MOS transistor, 2708 represents polycrystal silicon which forms the gate electrode of the MOS transistor, 2709 represents a field oxide film, 2710 represents an inter-layer insulating film, and 2711 represents an aluminum line.

If the substrate is formed into a rectangular shape, it can be manufactured by a known technology. However, the manufacturing process encounters a considerable limit when the circular shape is changed. Therefore, the present invention employs the following means in order to prevent the enlargement of the manufacturing cost.

A marketed apparatus for a glass substrate such as a liquid crystal TV, amorphous contact sensor was diverted for the manufacturing process to be performed in the temperature range which is 350° C. or lower. All apparatuses for use in the photolithography process and the sputter for plasma CVD metal lines are used.

The application of the resist was performed by making use of a roller-type apparatus, while a projection exposing machine is used as the exposing machine. If the peripheral circuit is fined, a method may be employed in which a contracted projection machine is used to join up the patterns by step conveyance. The stage must be somewhat changed.

Since an important factor is to decrease special apparatuses for use in the heating process, the embodiment employs the following heat oxidation means and heat diffusion means.

Figure 40:
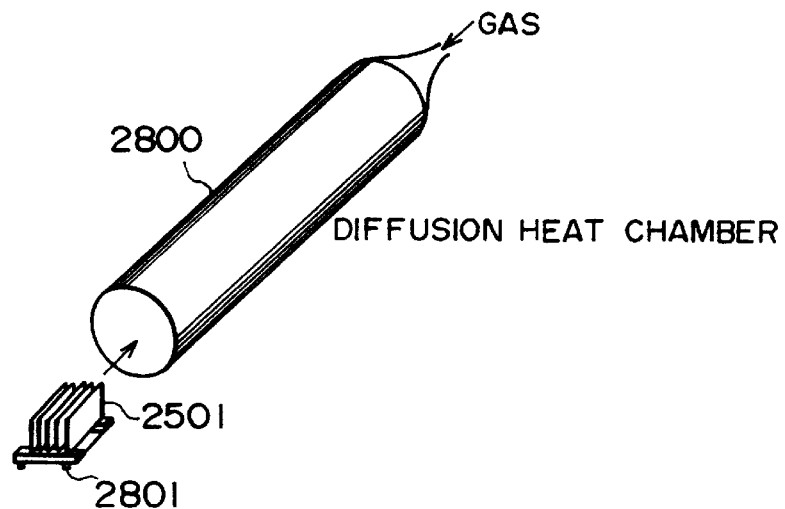
FIG. 40 is a schematic view which illustrates a state of loading into a heat furnace.

A method as shown in FIG. 40 was employed in which a marketed reaction tube 2800 for processing circular wafer was used, the longitudinal direction of the substrate 501 is made to face the axial direction of the reaction tube 2800, and quarts boards 2801 to be disposed by 25 boards at a pitch of 2 mm were manufactured, and the quartz boards were inserted in a direction designated by an arrow. Since the length of the shorter side of the substrate 2501 is 8 cm, a reaction tube for a 5-inch circular substrate can be used.

Also a vapor CVD uses the apparatus for 5-inch circular substrate diverted by the foregoing method so that depositions of multi-crystal silicon and silicon nitride were performed by the vapor CVD method.

An apparatus for depositing the epitaxial layer was diverted from that for 5-inch circular substrate while changing its susceptor. If the apparatus is adapted to 5 to 8-inch substrate, diversion can be made by changing the shape of the susceptor.

The ion implantation apparatus is an apparatus which must be contrived considerably among the modifications of the manufacturing apparatuses. The following two methods may be employed to modify the ion implantation apparatus.

Since the longitudinal directional length of the substrate is 22 cm, the state of an apparatus for 8-inch circular substrate is modified slightly to form the beam scanning region into a rectangular shape.

Another method is a method using the apparatus for 5-inch circular substrate, feeding the stages at a pitch of 11 cm, and implanting ions for each ½ region. It is preferable that the accuracy to feed the substrate is smaller than the diameter of the beam.

As described above, the present invention does not need a special apparatus but a marketed apparatus may be used necessitating a small change.

Embodiment E2

An applicable example of the present invention relating to a thermal ink jet apparatus will now be described.

Figure 41:
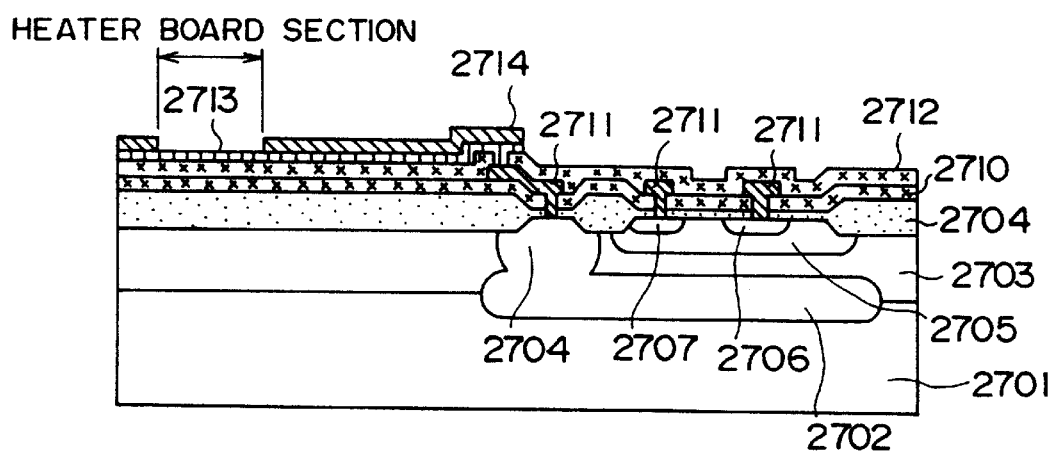
FIG. 41 is a shorter-side-directional cross sectional structural view which illustrates a bubble-type ink jet substrate.

FIG. 41 is a cross sectional structural view which illustrates a thermal ink jet apparatus when viewed from a position adjacent to the short side.

FIG. 41 illustrates an example in which a bipolar transistor is employed as an output device. Further, an ink injection nozzle is integrated on a heater board illustrated so that heat generated by a heater layer 2713 bubbles the ink in the nozzle, and the pressure of the thermal jet the ink through the nozzle in the ink jet manner.

As shown in FIG. 41, the process until a first aluminum circuit layer 2711 is formed may be the same as that for manufacturing the foregoing photosensor array. The second inter-layer insulating film 2712 was deposited by a plasma CVD method. The plasma CVD apparatus may be a marketed apparatus adapted to a glass substrate.

The heater layer 2713 was made of tantalum nitride. The deposition was performed by a reactive sputtering method and nitrogen lines are added to a marketed DC sputtering apparatus to make the deposition apparatus without using a special device. The sputtering conditions are determined such that the fractional pressure of nitrogen is 26%, the fractional pressure of argon is 74%, the total pressure is 1 pa, the temperature of the substrate is 150° C. and the DC power is 1.5 kw. The second aluminum layer was deposited by an ordinary sputtering method similarly to the first aluminum layer.

As a result, the ink jet head can be formed by a 21 cm chip so that images can be printed on an A4 paper sheet at a speed five times as that of the conventional technology.

Effect D

As described above, according to the present invention, the Schottky TTL is structured such that the metal layer made of aluminum or the like is formed to be in contact with the semiconductor layer in the shot key diode portion, and the barrier metal is disposed to be in contact with the semiconductor layers in the emitter portion and the collector portion. As a result, the short circuit between the emitter and the base due to finding of the structure and the increase in the contact resistance are prevented by the barrier metal. As a result, a semiconductor apparatus maintaining the excellent bipolar transistor characteristics and having satisfactory Schottky characteristics can be realized.

According to the present invention, aluminum is selectively deposited on only the surface of the semiconductor terminated with hydrogen. Therefore, the metal circuit layer can be formed only by one photolithographic patterning process. As a result, a Schottky TTL having excellent characteristics can be manufactured while restricting the increase in the number of processes for forming the metal circuit layer.

Effect E

As described above, the cylindrical single crystal silicon ingot is cut in the axial direction of the cylindrical ingot, substrates, each of which is formed into a rectangular shape, the longer side of which is 21 cm or longer, are cut out so that a plurality of active device are formed. Therefore, a long photosensor array made of a sole chip and capable of collectively reading an A4 or larger paper without a contracting optical system can be obtained by a known silicon semiconductor manufacturing technology and the manufacturing apparatus modified slightly.

Similarly, a long and thermal ink jet head made of a sole chip capable of collectively printing an image on an A4 or larger paper by using a fixed head thereof can be constituted.

Example F

An example of the manufacturing process of the present invention will now be described with reference to FIGS. 42A to 42F.

First, an inter-layer insulating film 3011 is formed on a single-crystal Si substrate 3010 by a CVD method to have a thickness of about 6000 Å (FIG. 42A) A contact hole 3012 for forming an electrode and an alignment mark 3013 larger than the contact hole 3012 are formed. Then, the surface of the Si substrate appearing in the opening is terminated with hydrogen by the following method.

Cleaning with a solution $H_2SO_4:H_2O_2=1:4$ is performed, and rinsing with pure water is performed. Then, dipping into a solution $HF:H_2O=1:100$ for one minute is performed, and rinsing is performed for 10 minutes.

Figure 42A:
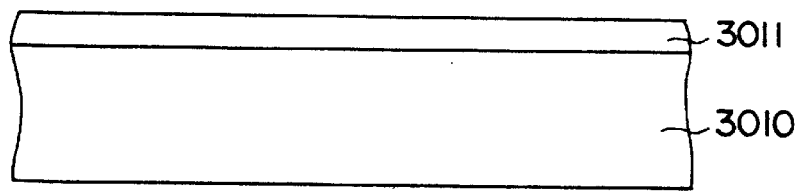
FIGS. 42A to 42F are schematic cross sectional views which illustrate formation of an alignment mark in a method of manufacturing a semiconductor apparatus according to Embodiment 1 of the present invention.
Figure 42B:
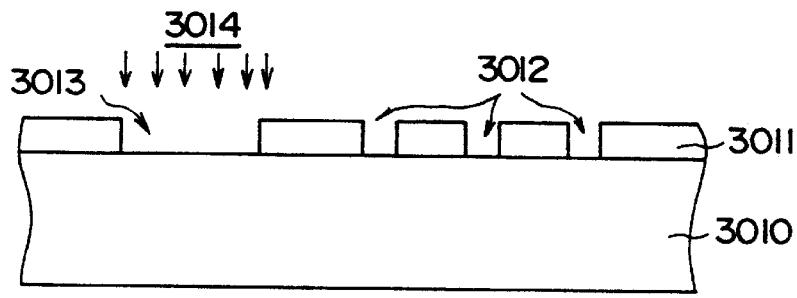

Then, the substrate is conveyed in the atmosphere, and only the alignment mark portion 4 is irradiated with electron beams 3014 in the atmosphere (FIG. 42B).

It is preferable that the acceleration voltage for the electron beams is about 25 kev and the amount of irradiation is about $5 \times 10^{17}$ electrons/cm$^3$. As a result, the portion of the surface of the Si substrate in the contact hole 12 is terminated with hydrogen atoms. On the other hand, non-bonded hands of Si are present on the surface of the Si substrate in the alignment mark 3013 because hydrogen has been removed by the electron beams. By exposing the substrate to the atmosphere, the non-bonded hands of Si are bonded with oxygen.

Then, a selective CVD method is employed to charge Al into the contact hole. The conditions for depositing Al by the selective CVD are as follows:

Gas: Hydrogen DMAH [$(CH_3)_2AlH$]

Total Pressure: 1.2 Torr

Fractional pressure of DMAH: $1 \times 10^{-3}$ times the total pressure

Temperature at the time of deposition: 270° C.

The Al deposition reaction is caused to occur on the Si layer by the following three factors:

(1) Catalyst-like contribution of free electrons present in the surface to the surface reaction;

(2) Terminative hydrogen on the surface of the Si layer; and (3) Generation of $CH_4$ due to selective reactions between the surface terminative hydrogen and $CH_3$ group in DMAH molecule. On the surface which is terminated with hydrogen and in which the foregoing three factors are met (on the surface of the contact hole 12), aluminum is deposited. After aluminum has been deposited, hydrogen in DMAH 15 is also left as terminative hydrogen, and free electrons are present in aluminum.

Figure 42C:
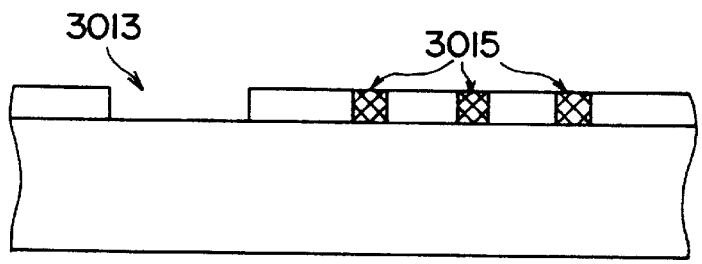
Figure 42D:
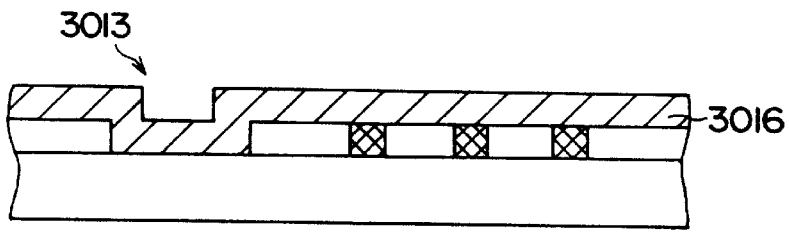
Figure 42E:
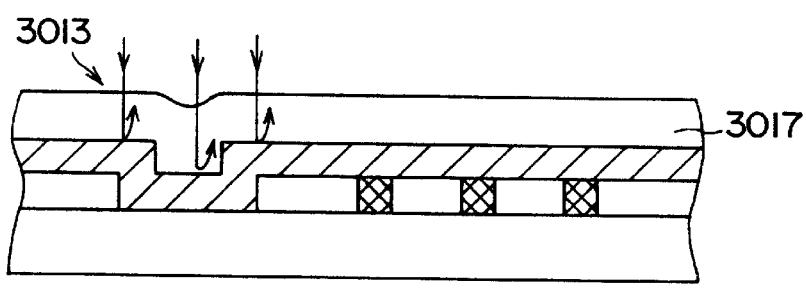
Figure 42F:
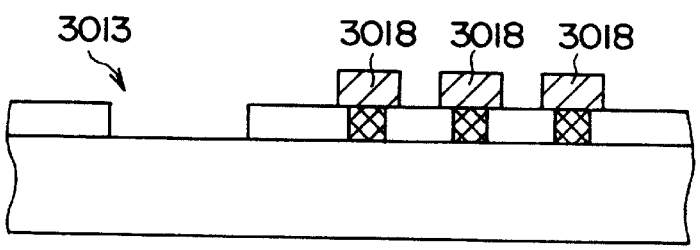

In the region which is not terminated with hydrogen atoms (alignment mark portion 3013) and on the inter-layer insulating film 3011 in which the free electrons are not present, the aluminum deposition reaction does not occur. As a result, as shown in FIG. 42C, the aluminum film 3015 is selectively deposited in only the contact hole 3012. Then, a non-selective CVD method or a sputtering method is employed so that an aluminum film 3016 is formed on the entire surface (FIG. 42D). A photo-resist 3017 is applied. Then, the aluminum line for masking is transferred to the resist 3017 by performing an alignment by using the alignment mark 3013 before the exposure is performed (FIG. 42E). Then, the mask pattern is transferred to the resist 3017, and development and etching are performed so that an aluminum circuit pattern 3018 is formed (FIG. 42F).

As described above, this embodiment is so arranged that electron beams serving as energy beams are applied to the alignment mark prior to selectively forming the metal film in the contact hole. Then, the enlargement of the metal film in the alignment mark portion at the time of selectively forming the metal film in the contact portion is prevented. As a result, the alignment mark of the metal film circuit can be formed simultaneously with the formation of the contact hole.

As a result, the alignment accuracy of the metal circuit pattern can be improved, the semiconductor apparatus can be refined and its reliability can be improved.

Embodiment G

Figure 43A:
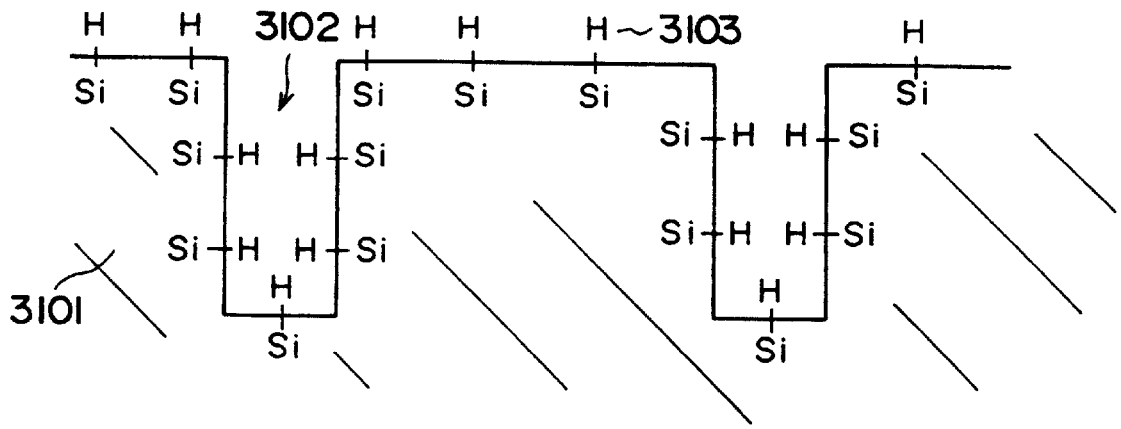
FIGS. 43A to 43C are schematic cross sectional views which illustrate a method of manufacturing a semiconductor apparatus according to Embodiment 2 of the present invention.
Figure 43B:
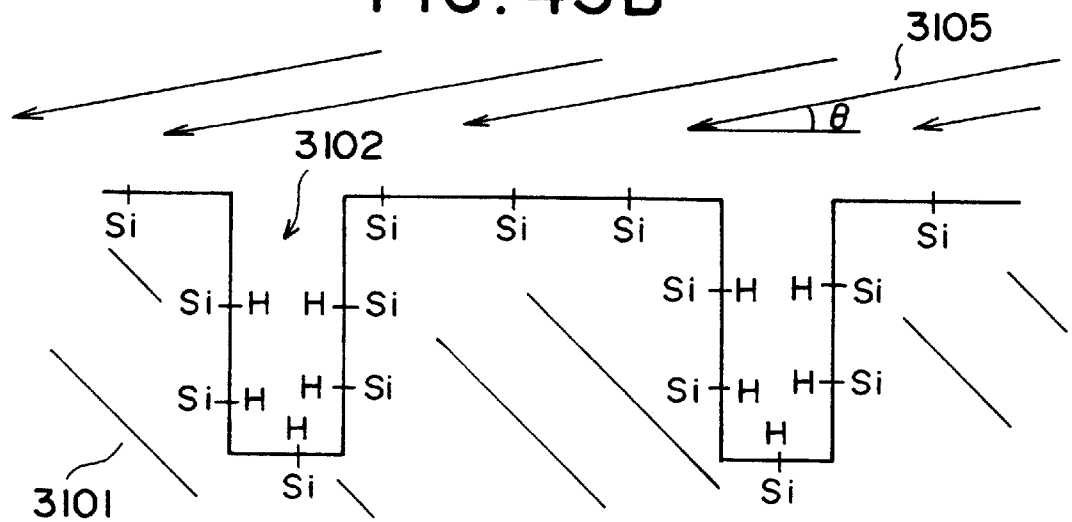
Figure 43C:
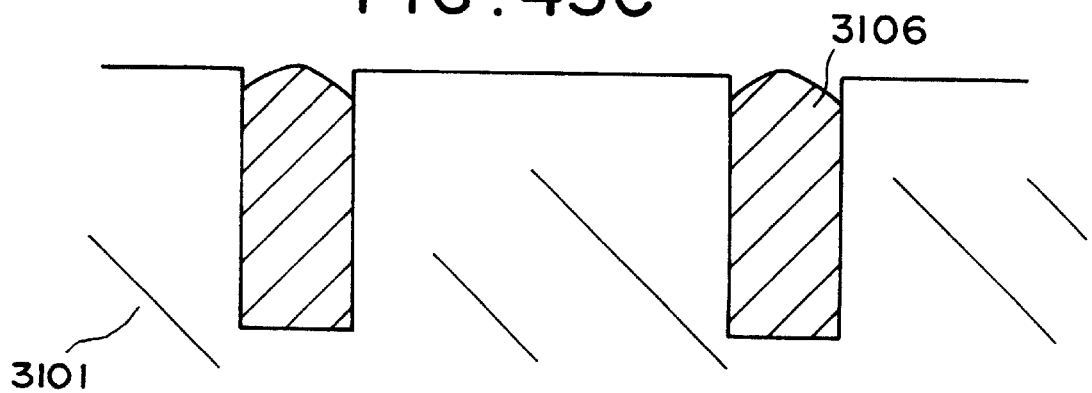

FIG. 43 is a schematic view which illustrates a second embodiment of the present invention.

A groove 3102 having a large aspect ratio (1:1 or more) is formed in an Si substrate 3101 by RIE etching or the like. Then, the Si substrate 3101 is cleaned with hydrofluoric acid arranged such that $H_2O:HF$=about 50:1 to about 100:1 so that the natural oxide film on the surface of the Si layer is removed and the surface of the Si layer is terminated with hydrogen atoms 3103 (process a).

Then, process b is performed in which energy beams, such as ion beams, of low energy (about several ev) are collectively applied. Ion beams 3105 are so applied that the angle θ made with the surface of the substrate is set to a small angle ranging from 10° to 20°. At this time, the substrate may be rotated to be irradiated with the ion beams 3105 equally.

As a result of the foregoing processes, hydrogen atoms terminating the upper surface (the flat surface) of the substrate are dissociated. However, hydrogen atoms in the groove 3102 having the high aspect ratio are not irradiated with the ion beams due to a shadowing effect so that they are not desorbed. The beam angle must generally be 30° or smaller although depending upon the aspect ratio of the opening portion.

Then, organic aluminum gas such as dimethyl aluminum hydride (DMAH) is used as the raw material gas, while hydrogen gas is used as a carrier and reactive gas. As a result, an aluminum film is deposited by a heat CVD method. The substrate is heated to 200° C. to 400° C. at this time. In the groove terminated with hydrogen, reactions between the $CH_3$ group in the DMAH molecule and terminated hydrogen atoms occur so that the aluminum film is enlarged. On the other hand, the aluminum film is not enlarged on the surface of the substrate which is not terminated with hydrogen. That is, the aluminum film can be deposited in only the groove (process c).

As a result, the aluminum film can be selectively embedded in the groove in the Si substrate having the large aspect ratio.

Although the aluminum film is deposited in this embodiment, an Al-Si film can be embedded by also using gas containing silicon such as $Si_2H_6$ as the raw material gas.

Figure 44:
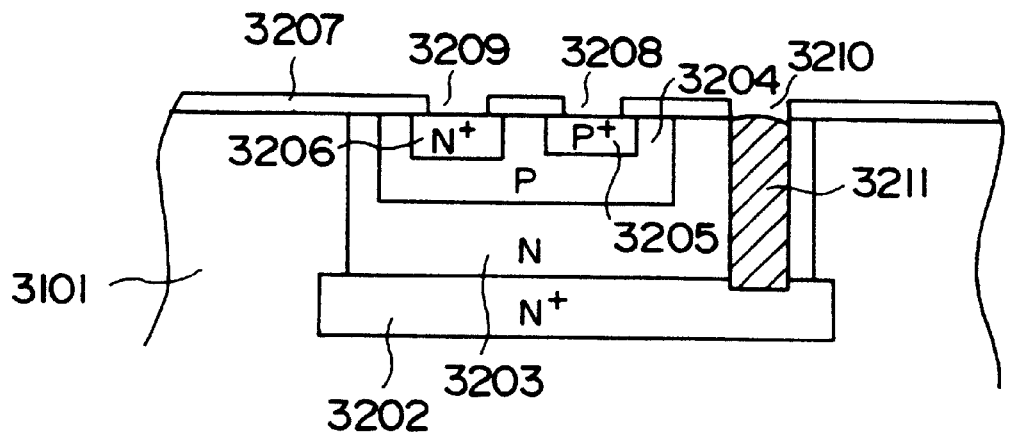
FIG. 44 is a schematic cross sectional view which illustrates a semiconductor apparatus according to Embodiment 3 of the present invention.

A semiconductor apparatus manufactured by the foregoing line embedding method is shown in FIG. 44. FIG. 44 illustrates a bipolar transistor in which a collector region including a low-resistance NBL (N-type embedded layer) 3202 and an N-type region 3203, a base p-type region 3204 including a $p^+$ region 3205 for ohmic contact, and an $N^+$ emitter region 3206 are previously formed on an Si substrate 3101.

Then, a groove 3210 having an aspect ratio of about 3 is formed in the collector region to reach the 1NBL 3202, and then cleaning with acid is performed as described above so that the natural oxide film is removed from the surface of Si and the surface is terminated with hydrogen. Then, ion beams are collectively applied at about 15°, and then aluminum is deposited by the foregoing CVD method so that aluminum 3211 is embedded in only the groove 3210.

The formations of the oxide film 3207, the base, the emitter opening portions 3205 and 3206 may be performed before or after the aluminum embedding process. That is, if the Si surface appears, the selectivity can be maintained due to the difference in the aspect ratio of the opening portions. The angle of the ion beams must be set adequately depending upon the difference in the aspect ratio of the opening portions.

After aluminum has been embedded, aluminum films are deposited in the upper portion 3210 of the embedded portion of the collector having a small aspect ratio, the base opening portion 3208 and the emitter opening portion by an ordinary sputtering method so that an electrode is formed. With the manufacturing method according to this embodiment, circuit lines can satisfactorily be embedded in a groove having an aspect ratio of 3 while maintaining the freedom of the process. By forming the bipolar transistor by the method according to this embodiment, the collector electrode is made a high-aspect embedded electrode directly connected with the low-resistance NBL. Therefore, the collector resistance can be reduced while maintaining the dense integration. As a result, the current amplification ratio can be improved and the speed can be raised.

Embodiment H

Figure 45:
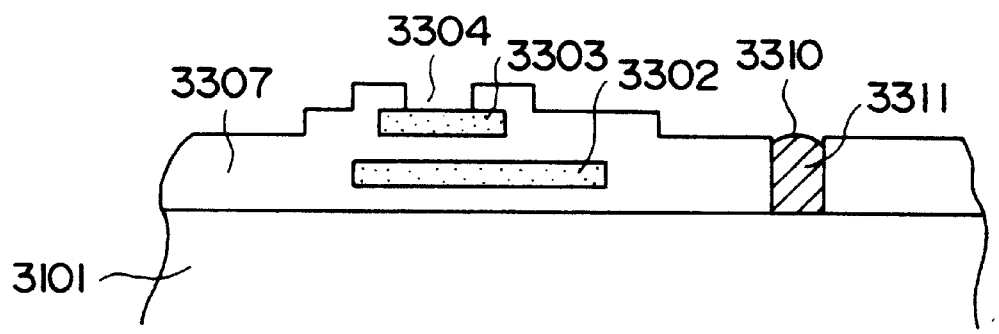
FIG. 45 is a schematic cross sectional view which illustrates a semiconductor apparatus according to Embodiment 4 of the present invention.

FIG. 45 illustrates another example of an application of the manufacturing method according to this embodiment. Polycrystal Si 3302 and 3303 formed into two layers are formed on the Si substrate 3101 while interposing the insulating film 3307. The second polycrystal Si 3303 has an opening portion 3304 for establishing the connection. In this stage, a contact hole 3310 is formed in the thick insulating film 3307, and then acid cleaning is performed as described above. Then, ion beams are applied at a low angle and the aluminum film is deposited in the CVD manner so that embedding 3311 of aluminum is selectively performed.

With the manufacturing method according to this embodiment, embedding contact of the aluminum circuit can be established after forming the circuit by using polycrystal Si. Therefore, the process freedom can be improved.

Embodiment I

Figure 46:
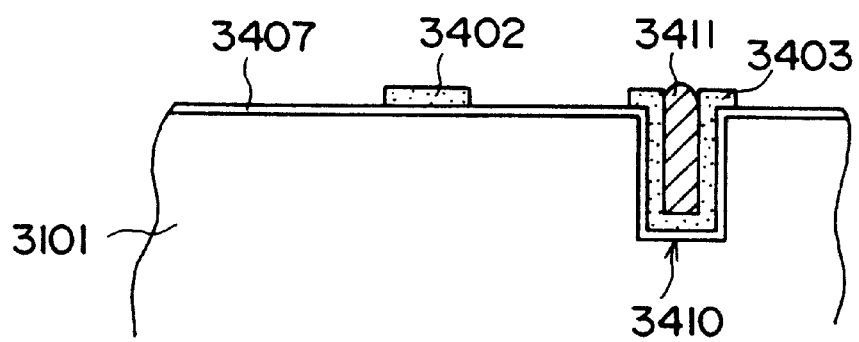
FIG. 46 is a schematic cross sectional view which illustrates a semiconductor apparatus according to Embodiment 5 of the present invention.

FIG. 46 illustrates another example of application. A groove 3410 is formed in the Si substrate 3101, and a CVD method is employed to simultaneously deposit the following elements: a line 3402 made of polycrystal Si is formed while interposing an insulating film 3407, and a polycrystal Si electrode 3403 is formed in the groove 3410. Although the structure shown in FIG. 46 is so arranged that the line 3402 and the electrode 3403 are formed by patterning, the patterning process may be performed after aluminum has been embedded. After polycrystal Si has been deposited, acid cleaning and low-angle ion beam irradiation are performed and the aluminum CVD method is employed so that an electrode 3411 in which aluminum is embedded is formed.

The manufacturing method according to this embodiment enables a fine and low-resistance trench capacitor using an aluminum film to be formed.

As described above, the circuit forming method according to this embodiment can be applied to various circuit forming processes.

According to the foregoing Embodiments 2 to 4, the following effects can be obtained.

A high-aspect and embedded circuit can be realized.

Even if a plurality of opening portions in which the surface of Si are present, the opening portion having a large aspect ratio can be selectively filled with the circuit member depending upon the difference in the aspect ratio.

The freedom for arranging the embedded circuit can be improved.

Since the energy beams are collectively applied at a low angle, the necessity of selecting a place in which the aluminum film is deposited to draw the energy beam can be eliminated. Therefore, the through-put can be improved.

The process for covering the opening portion with the acid film or the process for forming the oxide film by patterning can be decreased.

Although the invention has been described in its preferred form with a certain degree of particularly, it is understood that the present disclosure of the preferred form has been changed in the details of construction and the combination and arrangement of parts may be resorted to without departing from the spirit and the scope of the invention as hereinafter claimed.

What is claimed is:

1. A method of manufacturing a semiconductor apparatus by forming a side wall comprising:

(a) forming a gate electrode comprising polycrystalline silicon or a silicide;

(b) forming an insulating film on said gate electrode;

(c) forming a first source and drain region of p or n type;

(d) forming by chemical vapor deposition process, an aluminum side wall selectively only on a side wall of said gate electrode on which the insulating film is formed;

(e) injecting ions to form a second source and drain region having an impurity concentration higher than that of said first source and drain region;

(f) removing the metal side wall and the insulating film; and (g) forming an oxide film over said gate electrode and said first and second source and drain regions, after step (f).

2. A method of manufacturing a semiconductor apparatus according to claim 1, wherein said semiconductor apparatus is a transistor.

3. A method of manufacturing a semiconductor apparatus according to claim 1, wherein said CVD method uses alkyl aluminum hydride and hydrogen.

4. A method of manufacturing a semiconductor apparatus according to claim 3, wherein said alkyl aluminum hydride is dimethyl aluminum hydride.

5. A method of manufacturing a semiconductor apparatus according to claim 1, wherein a drain region of a transistor is formed prior to forming said side wall.

* * * * *